(12) United States Patent
Hatakeyama et al.

(10) Patent No.: US 8,993,222 B2
(45) Date of Patent: Mar. 31, 2015

(54) PATTERN FORMING PROCESS

(71) Applicant: Shin-Etsu Chemical Co., Ltd., Tokyo (JP)

(72) Inventors: Jun Hatakeyama, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/156,609

(22) Filed: Jan. 16, 2014

(65) Prior Publication Data

US 2014/0227643 A1 Aug. 14, 2014

(30) Foreign Application Priority Data

Feb. 14, 2013 (JP) .................................. 2013-026270

(51) Int. Cl.
  *G03F 7/20* (2006.01)
  *G03F 7/00* (2006.01)
  *G03F 7/039* (2006.01)

(52) U.S. Cl.
  CPC ............ *G03F 7/2024* (2013.01); *G03F 7/0035* (2013.01); *G03F 7/0397* (2013.01)
  USPC ........................................................ 430/325

(58) Field of Classification Search
  CPC ......... G03F 7/0035; G03F 7/20; G03F 7/325; G03F 7/40; G03F 7/0397
  USPC .......................................... 430/322, 325, 330
  See application file for complete search history.

(56) References Cited

U.S. PATENT DOCUMENTS

| | | | |
|---|---|---|---|
| 6,136,500 A | 10/2000 | Kobayashi |
| 6,448,420 B1 | 9/2002 | Kinsho et al. |
| 7,537,880 B2 | 5/2009 | Harada et al. |
| 7,598,016 B2 | 10/2009 | Kobayashi et al. |
| 7,741,015 B2 | 6/2010 | Hatakeyama et al. |
| 7,771,913 B2 | 8/2010 | Kaneko et al. |

(Continued)

FOREIGN PATENT DOCUMENTS

| | | |
|---|---|---|
| JP | 3991462 B2 | 10/2007 |
| JP | 2007-297590 A | 11/2007 |

(Continued)

OTHER PUBLICATIONS

Chen et al., "Resist Freezing Process for Double Exposure Lithography", Proceedings of SPIE et al., 2008, p. 69230G-1-69230G-10, SPIE vol. 6923.

(Continued)

*Primary Examiner* — Brittany Raymond
(74) *Attorney, Agent, or Firm* — Westerman, Hattori, Daniels & Adrian, LLP

(57) ABSTRACT

A pattern is formed by coating a first resist composition comprising a resin comprising recurring units having an acid labile group so that it may turn insoluble in organic solvent upon elimination of the acid labile group, a photoacid generator, and a first organic solvent, onto a processable substrate, prebaking, exposing, PEB, and developing in an organic solvent developer to form a first negative pattern; heating the negative pattern to render it resistant to a second organic solvent used in a second resist composition; coating the second resist composition, prebaking, exposing, PEB, and developing in an organic solvent developer to form a second negative pattern. The first and second negative patterns are simultaneously formed.

5 Claims, 5 Drawing Sheets

(56) References Cited

U.S. PATENT DOCUMENTS

| | | | |
|---|---|---|---|
| 8,003,295 B2 | 8/2011 | Hatakeyama | |
| 8,530,148 B2 | 9/2013 | Tsubaki et al. | |
| 2008/0090172 A1 | 4/2008 | Hatakeyama et al. | |
| 2008/0153030 A1 | 6/2008 | Kobayashi et al. | |
| 2010/0159404 A1* | 6/2010 | Hatakeyama et al. | 430/326 |
| 2012/0308930 A1* | 12/2012 | Hatakeyama et al. | 430/280.1 |

FOREIGN PATENT DOCUMENTS

| | | |
|---|---|---|
| JP | 2008-111103 A | 5/2008 |
| JP | 2008-122932 A | 5/2008 |
| JP | 2008-158339 A | 7/2008 |
| JP | 2008-239918 A | 10/2008 |
| JP | 2009-63989 A | 3/2009 |
| JP | 2009-93150 A | 4/2009 |
| JP | 2010-152299 A | 7/2010 |
| JP | 4554665 B2 | 9/2010 |

OTHER PUBLICATIONS

Owe-Yang et al., "Double exposure for the contact layer of the 65-nm node", Proceedings of SPIE et al., 2005, p. 171-180, SPIE vol. 5753.

* cited by examiner

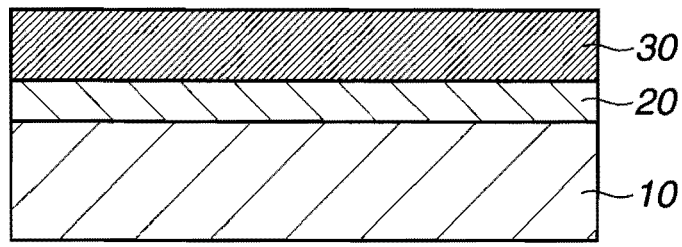
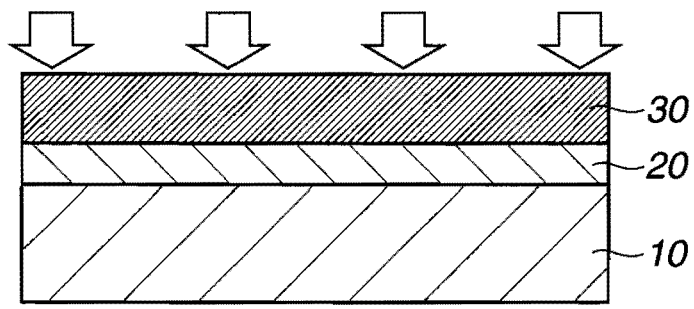
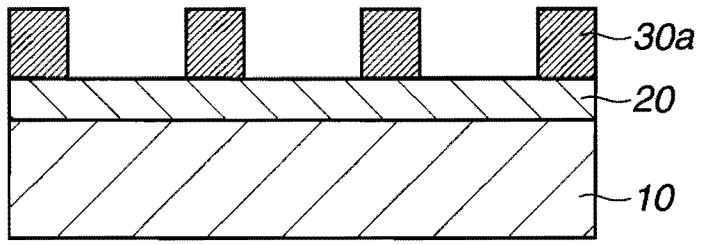
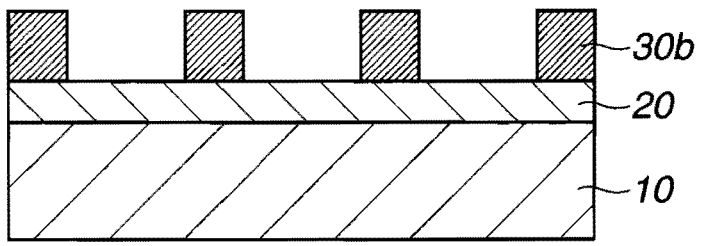

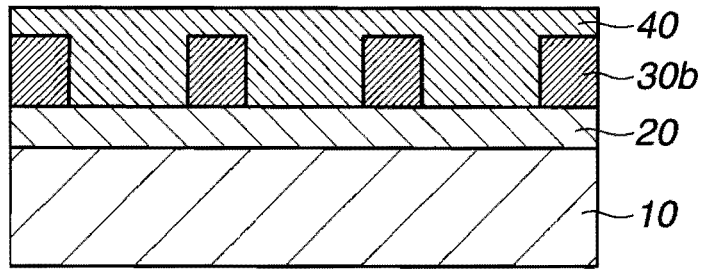
FIG.2E  COATING OF 2ND RESIST COMPOSITION
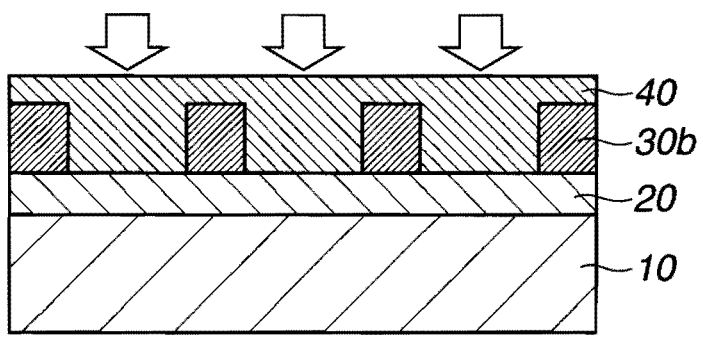
FIG.2F  EXPOSURE OF 2ND RESIST FILM
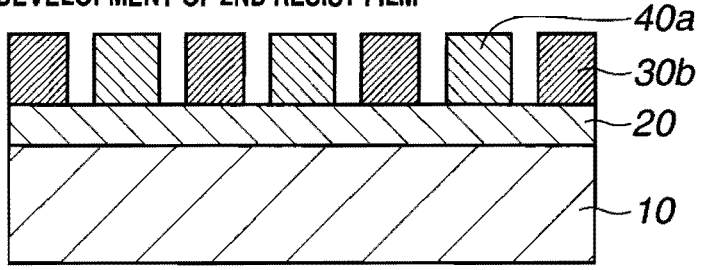
FIG.2G  PEB AND ORGANIC SOLVENT DEVELOPMENT OF 2ND RESIST FILM
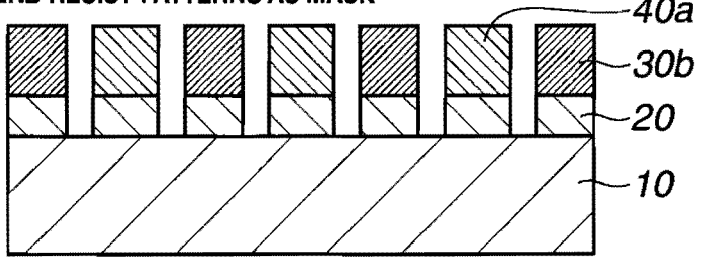
FIG.2H  DRY ETCHING THROUGH 1ST AND 2ND RESIST PATTERNS AS MASK

PATTERN FORMING PROCESS

CROSS-REFERENCE TO RELATED APPLICATION

This non-provisional application claims priority under 35 U.S.C. §119(a) on Patent Application No. 2013-026270 filed in Japan on Feb. 14, 2013, the entire contents of which are hereby incorporated by reference.

TECHNICAL FIELD

This invention relates to a patterning process involving the steps of forming a first negative pattern through exposure and organic solvent development of a first resist composition, heating the first negative pattern to render it insoluble in organic solvent, coating a second resist composition thereon, and forming a second negative pattern through exposure and organic solvent development.

BACKGROUND ART

Currently, strong interest is directed to a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

Patent Document 1 discloses a process involving forming a first pattern of a positive resist material through exposure and alkaline development, rendering the first pattern insoluble in organic solvent and alkaline developer with the aid of acid and heat, coating another positive resist material thereon, and forming a second pattern through exposure and alkaline development. Patent Document 2 discloses a process involving forming a first pattern of a positive resist material through exposure and alkaline development, rendering the first pattern insoluble in organic solvent and alkaline developer with the aid of light irradiation and heat, coating another positive resist material thereon, and forming a second pattern through exposure and alkaline development. These processes belong to a double patterning process involving the steps of insolubilizing a first positive resist pattern and combining it with a second positive pattern.

As compared with the line pattern, the trench or hole pattern is difficult to reduce its size. If an attempt is made to form fine holes according to the prior art method by combining a positive resist film with a hole pattern mask and effecting under-exposure, the exposure margin is extremely narrowed. It is then proposed to form holes of larger size and shrink the developed holes by thermal flow, RELACS® or other techniques. However, there is a substantial difference between the pattern size as developed and the pattern size as shrunk, giving rise to the problem that a greater shrinkage leads to a lower control accuracy. With the hole shrinking method, the hole size can be shrunk, but the pitch cannot be narrowed.

Holes can be shrunk using the direct self assembly (DSA) technology. A typical DSA material is a styrene-methacrylate block copolymer. The DSA technology can shrink a hole pattern if holes are of true circle. When the DSA technology is applied to elongated holes or trench patterns, juxtaposed holes are formed. It is a drawback that shrinkage occurs while the original shape is deformed.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. Such pattern forming process is described in Patent Document 3.

An attempt to form elongated holes via negative development results in elliptic shape. This is due to the influence of optical interference. The elliptic hole pattern is undesired when it is intended to form a rectangular hole pattern.

Non-Patent Document 1 proposes a process for reducing the pitch to one half by heating a first positive resist pattern for insolubilizing it in organic solvent and alkaline developer, coating a second resist material, and forming a second positive pattern between the first positive pattern features. If the second pattern is orthogonal to the first pattern, a hole pattern can be formed. If the pitch is changed between the first and second lines, rectangular holes can be formed. However, since both the first and second steps use positive resist materials, formation of a narrow trench pattern is disadvantageous from the standpoint of optical contrast. Additionally, the corner between orthogonally intersecting sides is rounded.

Patent Document 4 proposes an image reversal technology involving forming a positive resist pattern of positive resist material via alkaline development, heating the positive resist pattern for insolubilizing it in organic solvent while maintaining alkaline development capability, coating a film of low alkaline solubility, and effecting development to dissolve only the surface layer of the low alkaline solubility film while leaving the majority of film, and to dissolve the positive resist pattern in alkaline developer. The means of insolubilizing the film in organic solvent relies on a base polymer derived from a methacrylate monomer having 7-oxanorbornane.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the proximity bias is exaggerated. In particular, an increase of proximity bias in a hole pattern poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Non-Patent Document 2: Proc. SPIE Vol. 5753, p 171 (2005), which involves strong super-resolution illumination of a first positive resist to resolve only a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem. While this method uses a positive resist material in the first exposure step, the use of a positive resist material to form hole patterns suffers from low resolution and poor dimensional control as discussed above.

CITATION LIST

Patent Document 1: JP-A 2009-063989
Patent Document 2: JP-A 2009-093150 (U.S. Pat. No. 8,003,295)
Patent Document 3: JP 4554665 (U.S. Pat. No. 8,530,148)
Patent Document 4: JP-A 2010-152299
Non-Patent Document 1: Proc. SPIE Vol. 6923, p. 69230G-1 (2008)
Non-Patent Document 2: Proc. SPIE Vol. 5753, p 171 (2005)

DISCLOSURE OF INVENTION

When it is desired to form a rectangular space pattern, a single negative development in organic solvent is undesired because an elliptic space pattern is formed. When an orthogonal pattern is formed by insolubilizing a first positive resist pattern in alkaline developer and organic solvent with the aid of heat, coating a second positive resist material thereon, and forming a second positive resist pattern extending perpendicular to the first resist pattern, the second resist film has an increased thickness where it crosses lines of the first positive resist pattern. This gives rise to problems like footing of second positive resist lines and rounding of corners of rectangular spaces due to residues left in spaces.

An object of the invention is to provide a pattern forming process capable of forming a rectangular space pattern with square corners.

The inventors have discovered a pattern forming process capable of simultaneously forming first and second negative patterns by forming a first negative resist pattern of a chemically amplified resist composition via organic solvent development, subjecting the resin in the first negative pattern to partial crosslinking treatment for thereby insolubilizing the first negative pattern with respect to the organic solvent in a resist material used in forming a second pattern while minimizing the deformation of the first negative pattern by heat treatment, coating the resist material for the second pattern, exposure, PEB, and development in organic solvent to form the second pattern.

The litho-etch litho-etch (LELE) process involving transferring a first negative resist pattern to the underlying hard mask by dry etching, and transferring a second negative resist pattern thereon to the underlying hard mask by dry etching can form a rectangular trench pattern like the process of the invention. However, the LELE process needs two layers of hard mask corresponding to the first and second negative patterns, and two steps of dry etching. The process of the invention needs only one layer of hard mask and only one step of dry etching. Both the first and second resist materials are developed in organic solvent to form negative patterns. Although the first resist material should have such characteristics that it may be turned insoluble in the organic solvent in the second resist material by heating after the development to form the first pattern, the first resist material need not have such characteristics that it may be turned insoluble in alkaline developer, because development of the second resist material uses an organic solvent rather than the alkaline developer. If the first resist pattern is turned insoluble even in alkaline developer, the bake after development must be done at higher temperature, which can cause shrinkage or deformation of the first pattern. Deformation or shrinkage of the first resist pattern must be minimized.

When negative resist materials of organic solvent development type are used not only as the first resist, but also as the second resist, a rectangular space pattern with square corners can be formed without leaving scum where the second resist film straddles the first resist film.

Accordingly, the invention provides a pattern forming process comprising the steps of:

coating a first chemically amplified resist composition onto a processable substrate, said first resist composition comprising a resin comprising recurring units having an acid labile group which is eliminatable with acid so that it may turn insoluble in an organic solvent developer as a result of the acid labile group being eliminated, a photoacid generator capable of generating an acid upon exposure to high-energy radiation, and a first organic solvent, prebaking the coating to remove the unnecessary solvent and to form a resist film, exposing patternwise the resist film to high-energy radiation, post-exposure baking, and developing in the organic solvent developer to form a first negative pattern, heating the first negative pattern to render it resistant to a second organic solvent used in a second resist composition to be subsequently coated, coating the second resist composition comprising a resin and the second organic solvent onto the negative pattern-bearing substrate, prebaking, exposing, post-exposure baking, and developing in an organic solvent developer to form a second negative pattern, whereby the negative pattern of the first resist composition and the negative pattern of the second resist composition are simultaneously formed.

In one preferred embodiment, the second organic solvent in the second resist composition is selected from among propylene glycol monomethyl ether acetate, cyclohexanone, cyclopentanone, ethyl lactate, propylene glycol monomethyl ether, propylene glycol monoethyl ether, propylene glycol monopropyl ether, heptanone, γ-butyrolactone and mixtures thereof. The first negative pattern after heating experiences a film thickness loss of up to 10 nm when it is kept in contact with the second organic solvent for 30 seconds.

In one preferred embodiment, the resin in the first resist composition comprises recurring units having 7-oxanorbornane ring and recurring units having an acid labile group which is eliminatable with acid. During the heating step after development, crosslinking of the resin and elimination of the acid labile group are conducted at the same time in the first negative pattern.

In one preferred embodiment, the recurring units having 7-oxanorbornane ring are recurring units (a) having the general formula (1).

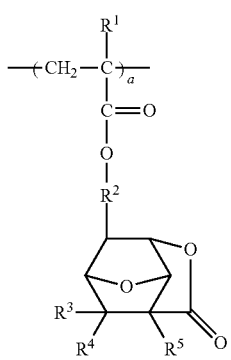

(1)

Herein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: 0<a<1.0.

In one preferred embodiment, the recurring units having an acid labile group are recurring units (b) having a carboxyl group substituted with an acid labile group and/or recurring units (c) having a hydroxyl group substituted with an acid labile group, represented by the general formula (2).

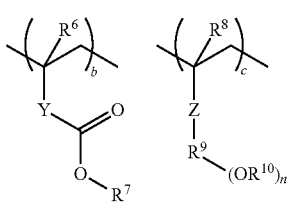

(2)

Herein $R^6$ and $R^8$ each are hydrogen or methyl, $R^7$ and $R^{10}$ each are an acid labile group, Y is a single bond or —C(=O)—O—$R^{11}$—, $R^{11}$ is a straight, branched or cyclic $C_1$-$C_{10}$ alkylene group which may have an ether or ester moiety, or a naphthylene group, z is a single bond or —C(=O)—O—, $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group, n is 1 or 2, b and c are numbers in the range: 0≤b<1.0, 0≤c<1.0, and 0<b+c<1.0.

In one preferred embodiment, the resin in the second resist composition comprises recurring units (b) having a carboxyl group substituted with an acid labile group and/or recurring units (c) having a hydroxyl group substituted with an acid labile group, represented by formula (2).

In one preferred embodiment, the organic solvent developer used in the developing steps to form the first and second negative patterns is selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

In one preferred embodiment, the first negative pattern crosses the second negative pattern; the first negative pattern and the second negative pattern are formed in different directions; or spaces of the second negative pattern are formed in proximity to the remaining portion of the first negative pattern.

ADVANTAGEOUS EFFECTS OF INVENTION

The pattern forming process of the invention is successful in forming a rectangular space pattern, which cannot be formed by single negative patterning, by forming a first negative pattern via organic solvent development, post-development baking the first negative pattern for thereby insolubilizing it in organic solvent, coating a second resist material thereon, exposure, and developing it in organic solvent to form a second negative pattern different from the first negative pattern. A pattern, which cannot be formed by the method of insolubilizing a first positive resist material and forming a second positive resist material thereon, can be formed by a combination of two negative resist materials.

BRIEF DESCRIPTION OF DRAWINGS

FIG. 1 schematically illustrates former steps of the pattern forming process of the invention; FIG. 1A showing a first resist film deposited on a processable substrate on a substrate; FIG. 1B showing exposure of the first resist film; FIG. 1C showing the first resist film during organic solvent development; FIG. 1D showing the first resist pattern being crosslinked via deprotection with the aid of acid and heat.

FIG. 2 schematically illustrates latter steps of the pattern forming process of the invention; FIG. 2E showing coating of a second resist material; FIG. 2F showing exposure of the second resist film; FIG. 2G showing the second resist film during organic solvent development; and FIG. 2H showing the processable substrate being dry etched.

DESCRIPTION OF PREFERRED EMBODIMENTS

Figure 3:
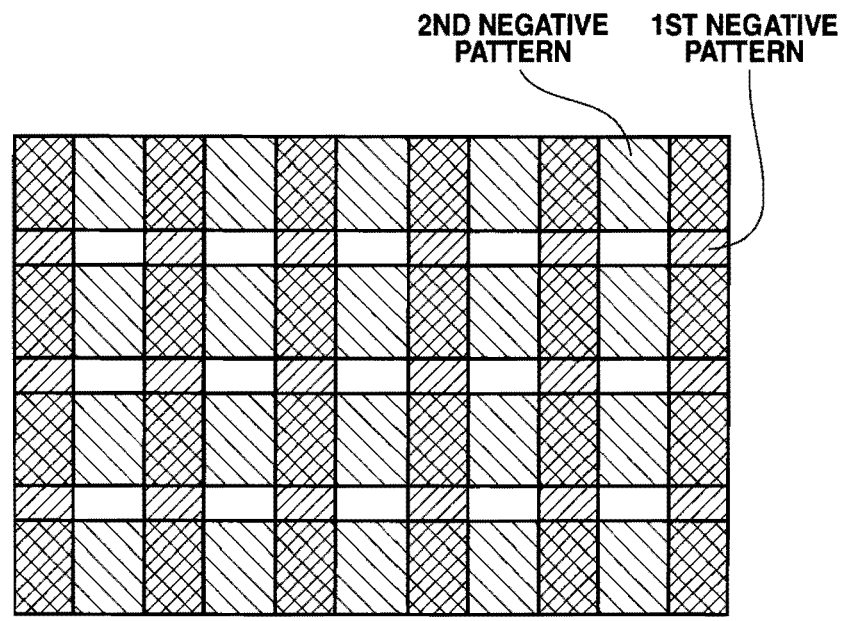
FIG. 3 illustrates a first negative pattern and a second negative pattern, which are combined as orthogonal lines.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

PAG: photoacid generator
Mw: weight average molecular weight
Mn: number average molecular weight
Mw/Mn: molecular weight distribution or dispersity
GPC: gel permeation chromatography
PEB: post-exposure baking The invention is directed to a pattern forming process comprising the steps of coating a first chemically amplified resist composition onto a processable substrate, said first resist composition comprising a resin comprising recurring units having an acid labile group so that it may turn insoluble in an organic solvent developer as a result of the acid labile group being eliminated, a photoacid generator, and a first organic solvent, prebaking the coating to remove the unnecessary solvent and to form a resist film, exposing patternwise the resist film to high-energy radiation, PEB, and developing in the organic solvent developer to form a first negative pattern; heating the first negative pattern to render it resistant to a second organic solvent used in a second resist composition to be subsequently coated; coating the second resist composition comprising a resin and the second organic solvent onto the negative pattern-bearing substrate, prebaking, exposing, PEB, and developing in an organic solvent developer to form a second negative pattern (which is different from the first negative pattern), whereby the negative pattern of the first resist composition and the negative pattern of the second resist composition are simultaneously formed.

In order that the first resist composition be turned insoluble in the second organic solvent by post-development baking, crosslinking reaction must take place during the bake. Since the second solvent used in the second resist composition has a higher solubility than the developer for the second resist composition, the first resist composition or resin must have such crosslinking characteristics that it may become insoluble in the second solvent used in the second resist composition.

The crosslink formation relies on electrophilic partial structures such as ester groups, cyclic ether and the like in the resin of the first resist composition. With the aid of acid and heat, crosslinking reaction takes place via ester exchange, ring opening, esterification and etherification of lactone ring, ring opening, etherification and esterification of cyclic ether, or the like.

The polymer advantageously used as the base resin in the first resist composition is a polymer comprising recurring units having a lactone ring, especially recurring units having 7-oxanorbornane ring, and specifically recurring units (a) of the general formula (1). Since this polymer has both an ester group and cyclic ether in a common recurring unit, it is highly reactive for crosslinking reaction. Since this unit is used as an adhesive unit, the inventive process is effectively applicable without adding any extra construction to the base resin. For the resin used in the second negative resist composition intended for second organic solvent development, recurring units having 7-oxanorbornane ring are not essential.

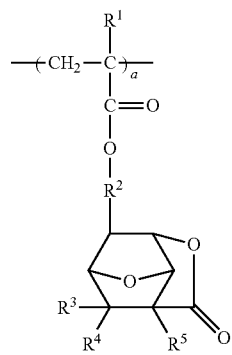

(1)

Herein $R^1$ is hydrogen or methyl. $R^2$ is a single bond, or a straight, branched or cyclic $C_1$-$C_6$ alkylene group which may contain an ether or ester moiety and which has a primary or secondary carbon atom through which it is linked to the ester moiety in the formula. $R^3$, $R^4$, and $R^5$ are each independently hydrogen, a straight, branched or cyclic $C_1$-$C_6$ alkyl group or cyano group, and a is a number in the range: 0<a<1.0.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene. Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

The monomer Ma from which recurring units (a) of formula (1) are derived has the following formula.

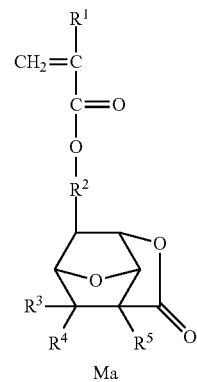

Ma

Herein $R^1$ to $R^5$ are as defined above.

Examples of the monomer Ma are shown below.

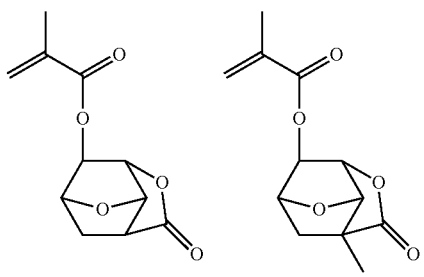

-continued

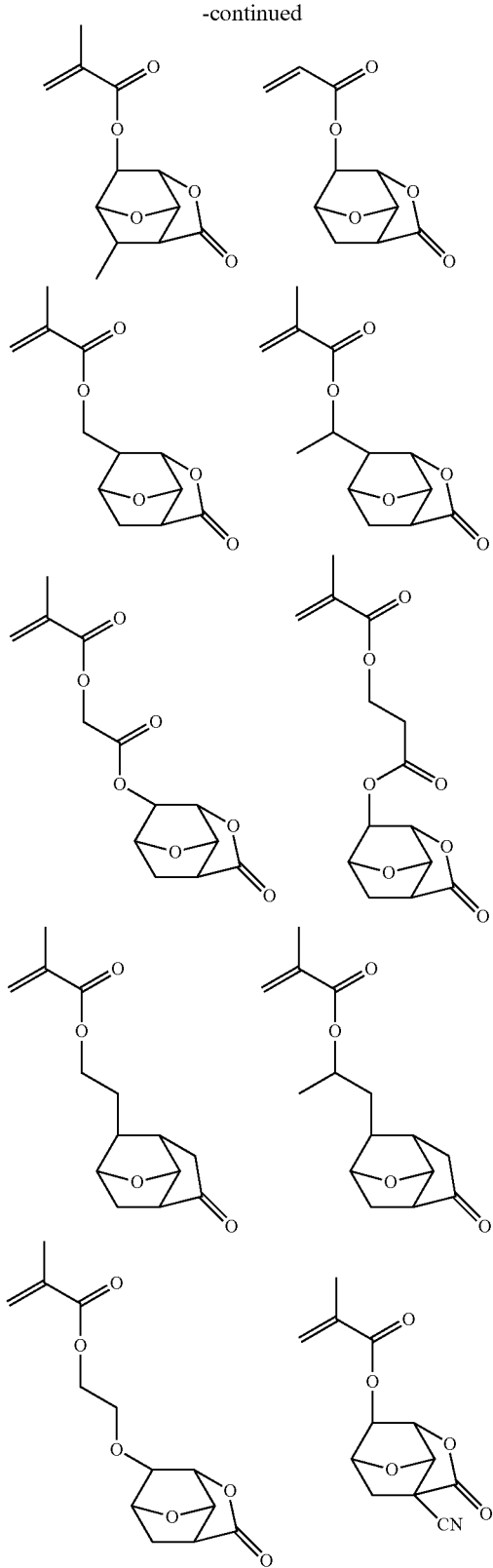

The process proceeds through the steps of forming a first negative pattern by exposure and organic solvent development, deprotection of the acid labile group and crosslinking reaction with the aid of acid and heat, coating a second resist composition thereon, and developing it in an organic solvent to form a second negative pattern. The first pattern becomes a film which is insoluble in organic solvent developer as a result of deprotection of the acid labile group on the acid labile group-containing recurring unit, and which is insoluble in the organic solvent of the second resist composition and the organic solvent developer for forming negative pattern as a result of crosslinking of 7-oxanorbornane ring. Therefore, when the second resist composition is coated on the first pattern which has been developed in organic solvent developer and subsequently heated for crosslinking, intermixing does not occur between the first pattern and the second resist composition.

If a polymer comprising recurring units having oxirane or oxetane is used as the base resin in the first resist composition, crosslinking with carboxyl groups can take place at the temperature of the resist process, for example, the PEB temperature of about 90 to 130° C., because the oxirane or oxetane ring has a very high rate of acid-catalyzed cleavage reaction. Although carboxyl groups are generated as a result of deprotection, they are substituted again, failing to form a negative pattern by organic solvent development. On the other hand, the 1,4-epoxy bond of 7-oxanorbornane ring has a low rate of acid-catalyzed cleavage reaction as compared with the oxirane or oxetane ring. Thus, no crosslinking takes place in the heating temperature range of PEB. The recurring unit having 7-oxanorbornane ring is stable against acid in the process until development, and behaves as a hydrophilic group to exert the function of improving adhesion and alkaline solubility. However, post-development heating causes cleavage to the 1,4-epoxy bond of 7-oxanorbornane ring, that is, ring-opening to promote crosslinking reaction.

The base resin used in the resist composition in the pattern forming process of the invention is preferably a polymer comprising crosslinkable recurring units (a) of formula (1) and acid labile group-containing recurring units (b) and/or (c) of the general formula (2).

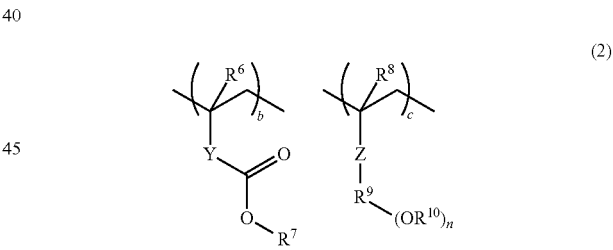

(2)

Herein $R^6$ and $R^9$ each are hydrogen or methyl. $R^7$ and $R^{10}$ each are an acid labile group. Y is a single bond or —C(=O)—O—$R^{11}$—, wherein $R^{11}$ is a straight, branched or cyclic $C_1$-$C_{10}$ alkylene group which may have an ether or ester moiety, or a naphthylene group. Z is a single bond or —C(=O)—O—. $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group. The subscript n is 1 or 2, b and c are numbers in the range: 0 b<1.0, 0 c<1.0, and 0<b+c<1.0.

The monomers Mb and Mc from which recurring units (b) and (c) of formula (2) are derived have the following formulae.

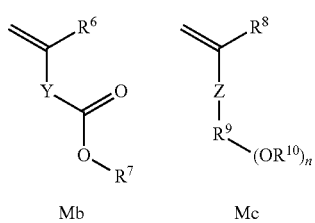
Herein $R^6$ to $R^{10}$, Y, Z and n are as defined above.
Examples of the monomer Mb wherein Y is a variant are shown below. Herein $R^6$ and $R^7$ are as defined above.
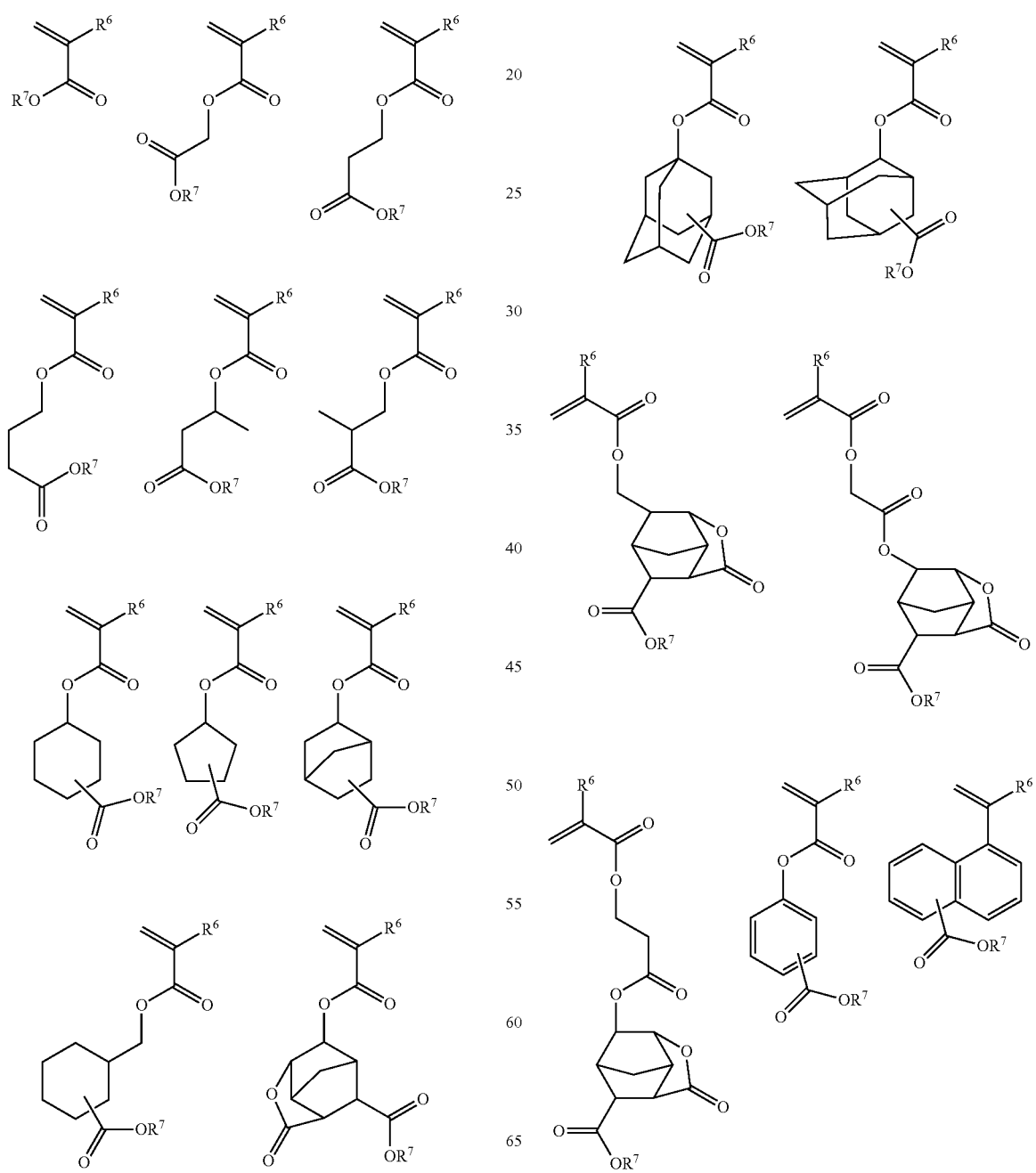

-continued
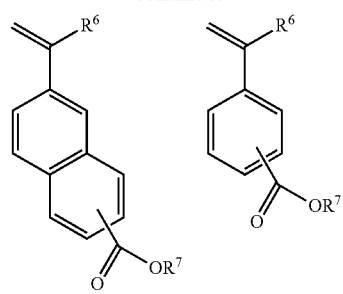
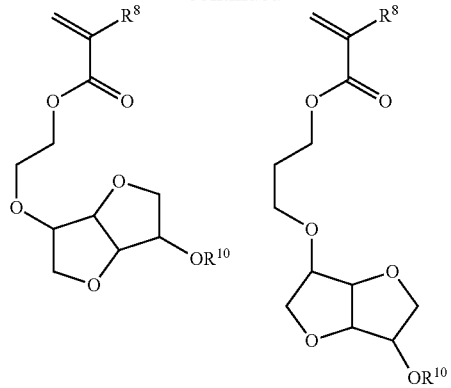
Examples of the monomer Mc are shown below. Herein $R^8$ and $R^{10}$ are as defined above.
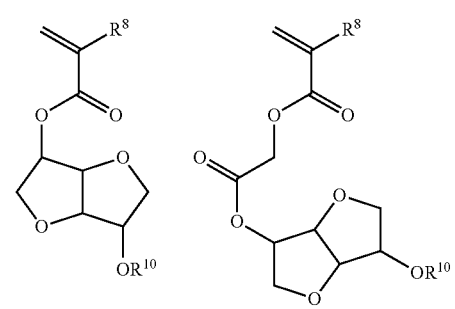
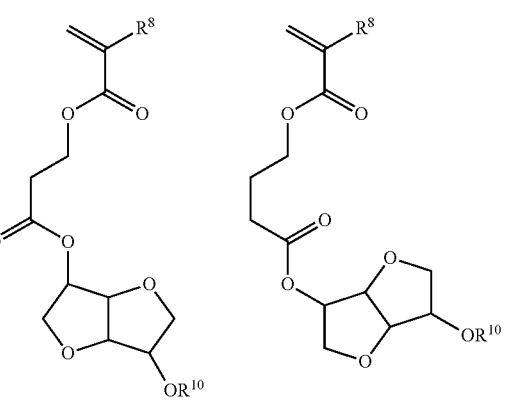
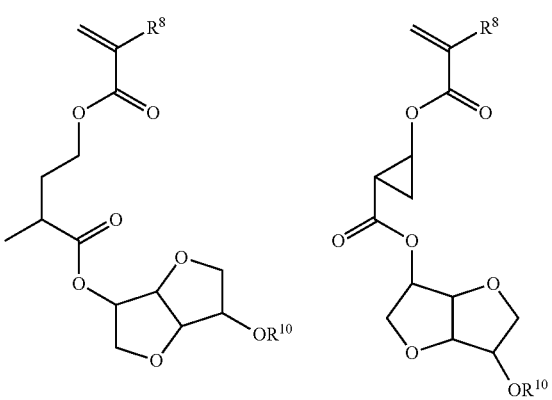
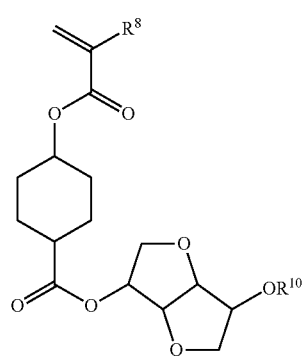
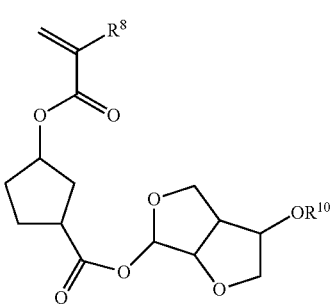
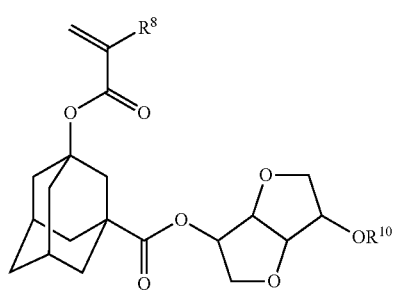
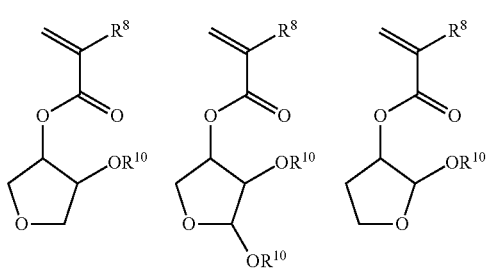

-continued
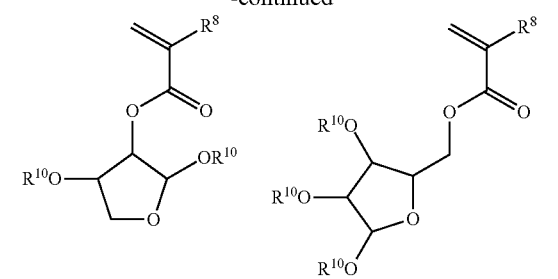
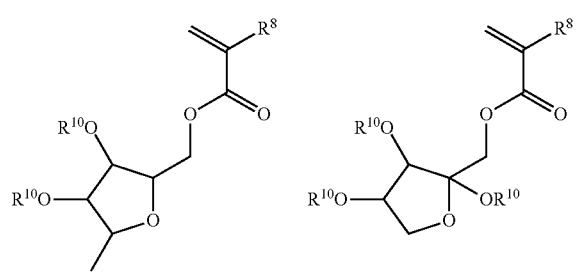
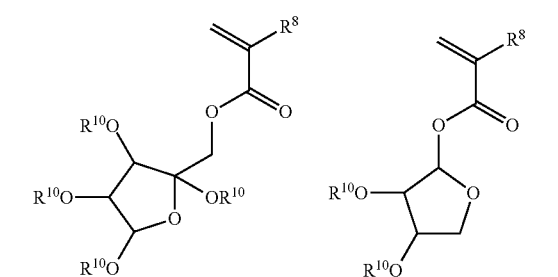
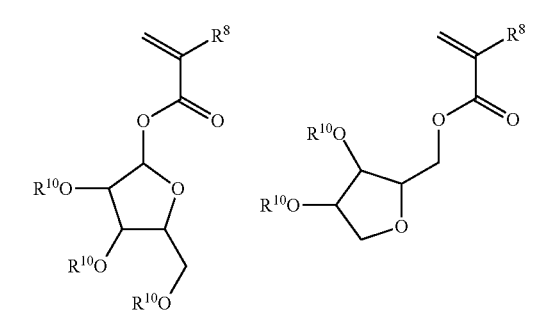
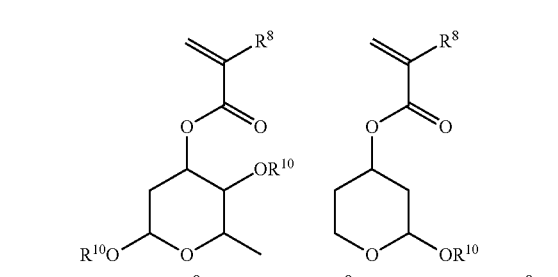
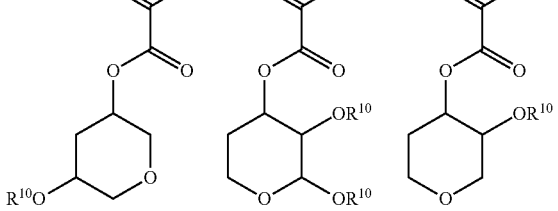
-continued
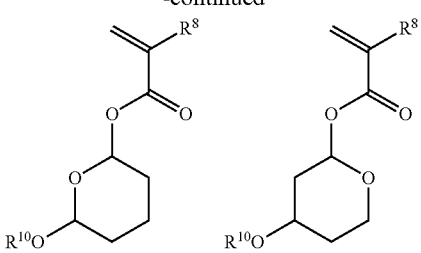
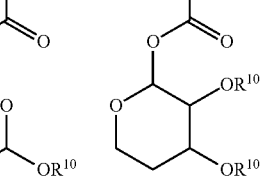
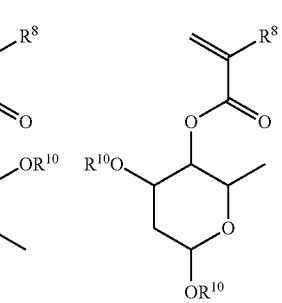
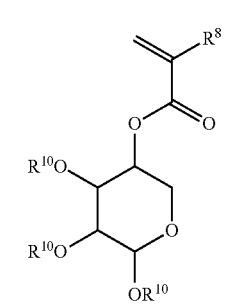
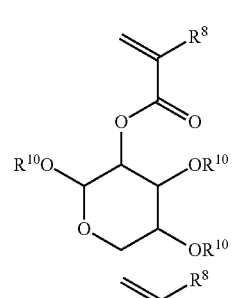
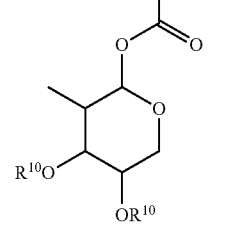

-continued
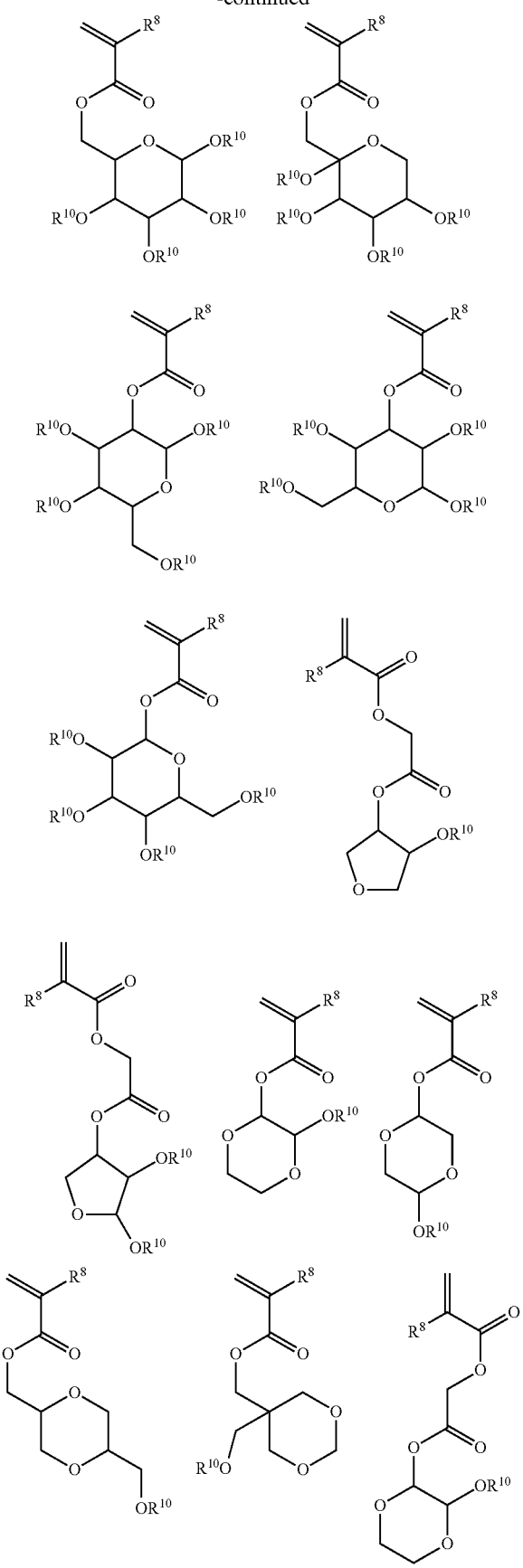
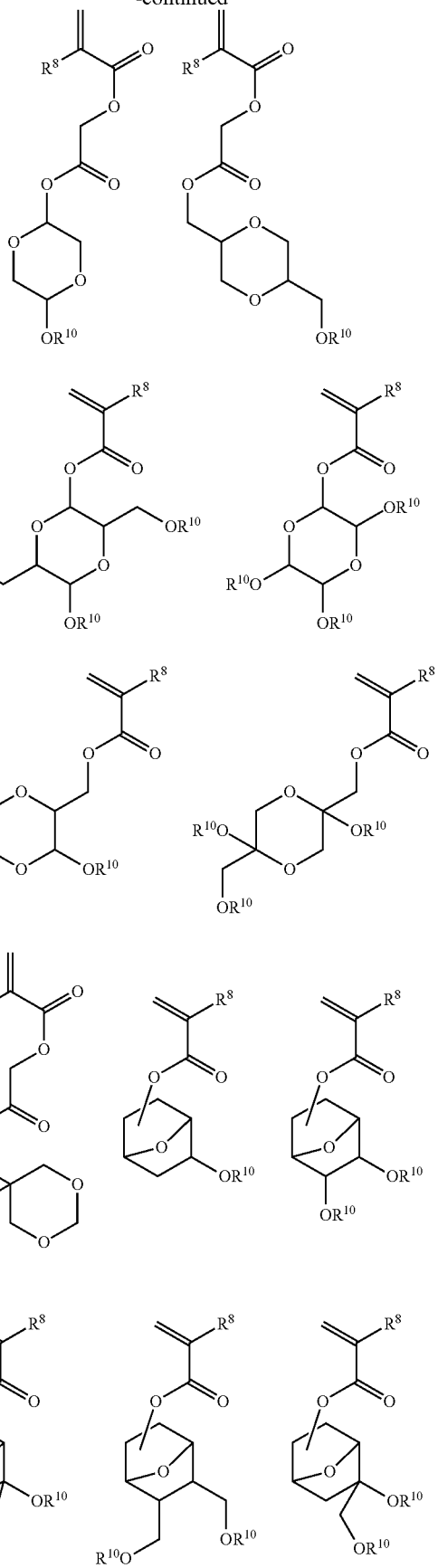

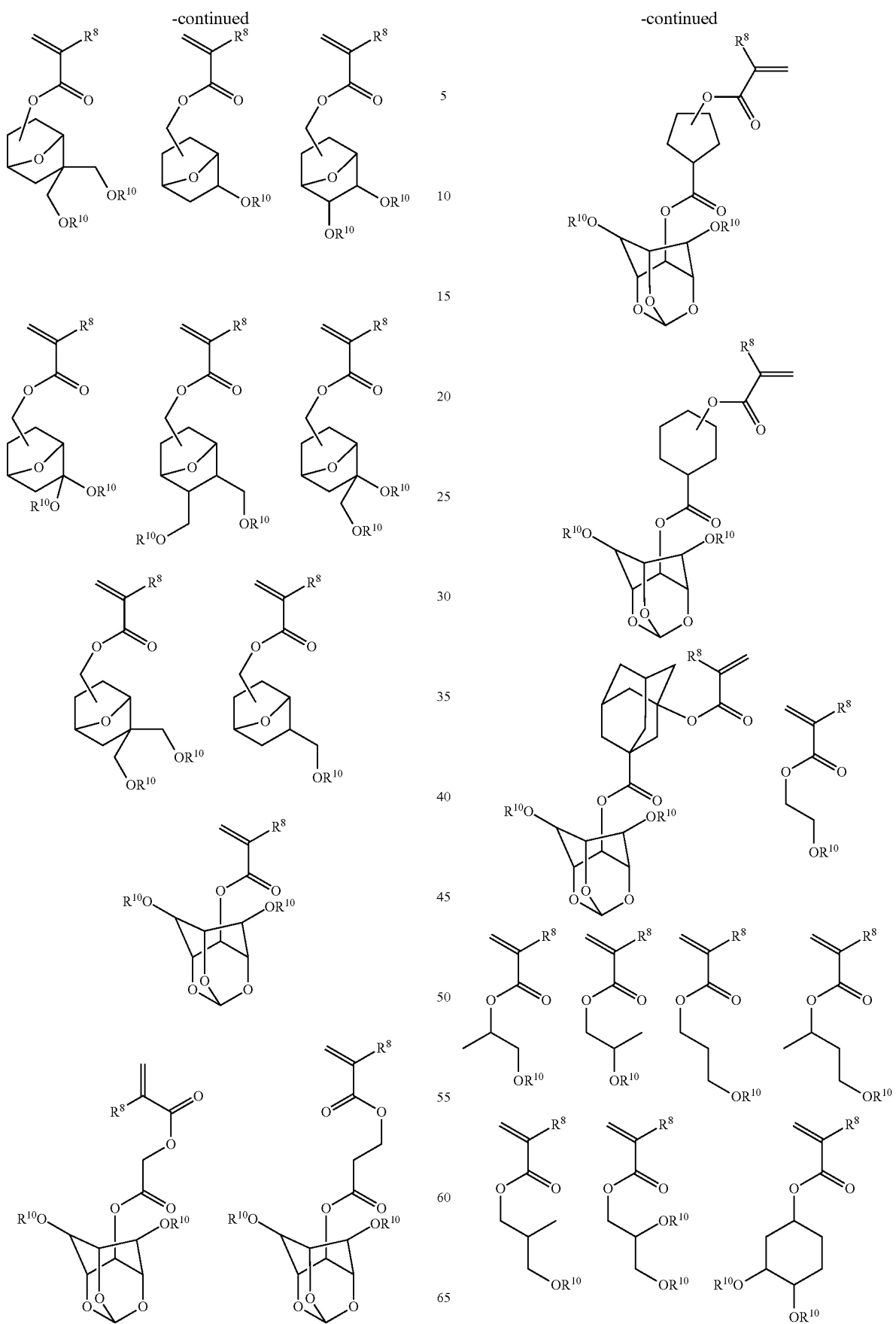

-continued
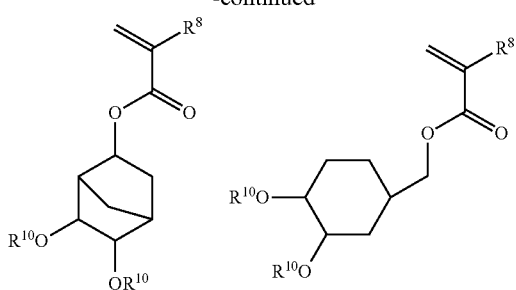
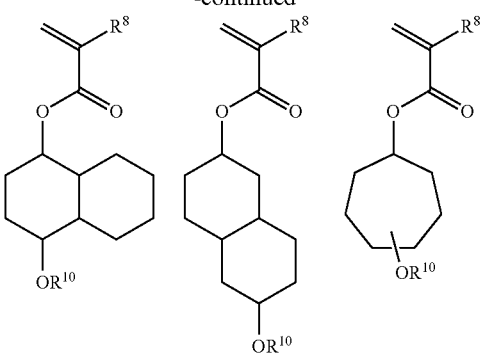
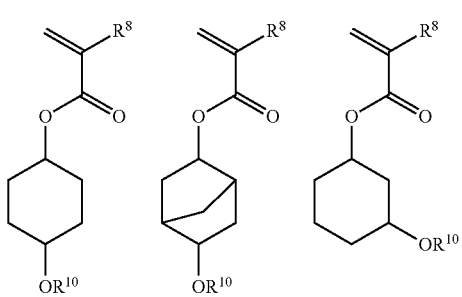
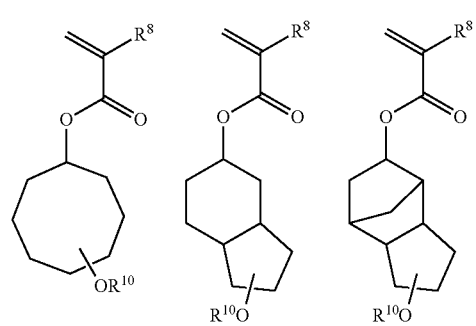
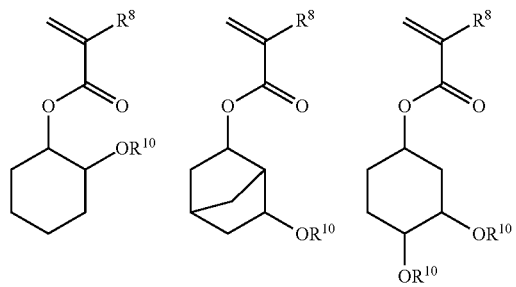
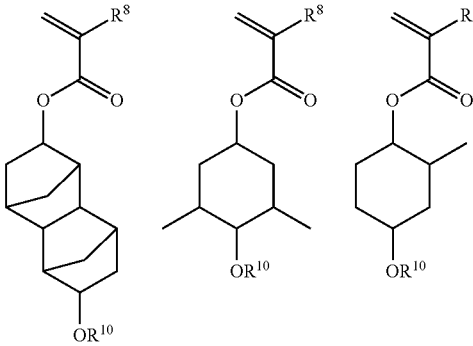
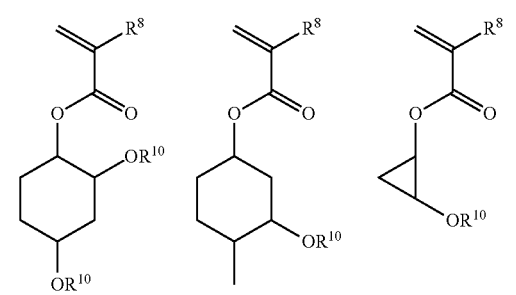
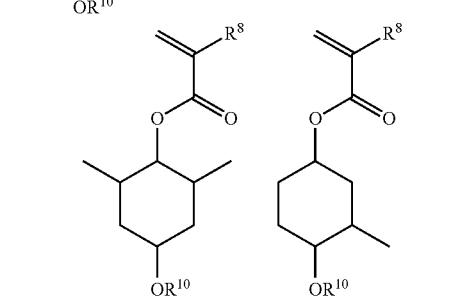
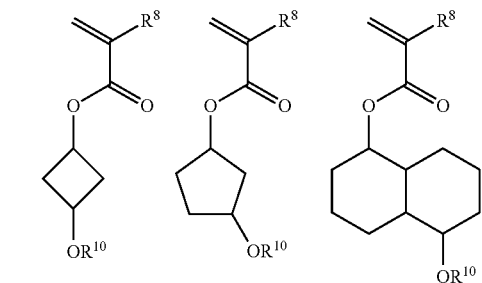
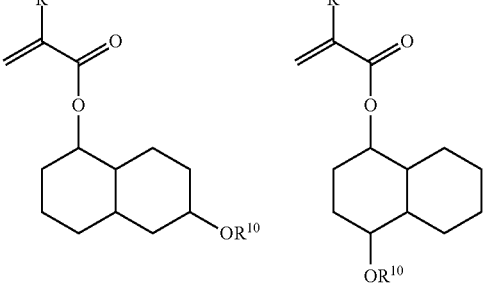

-continued
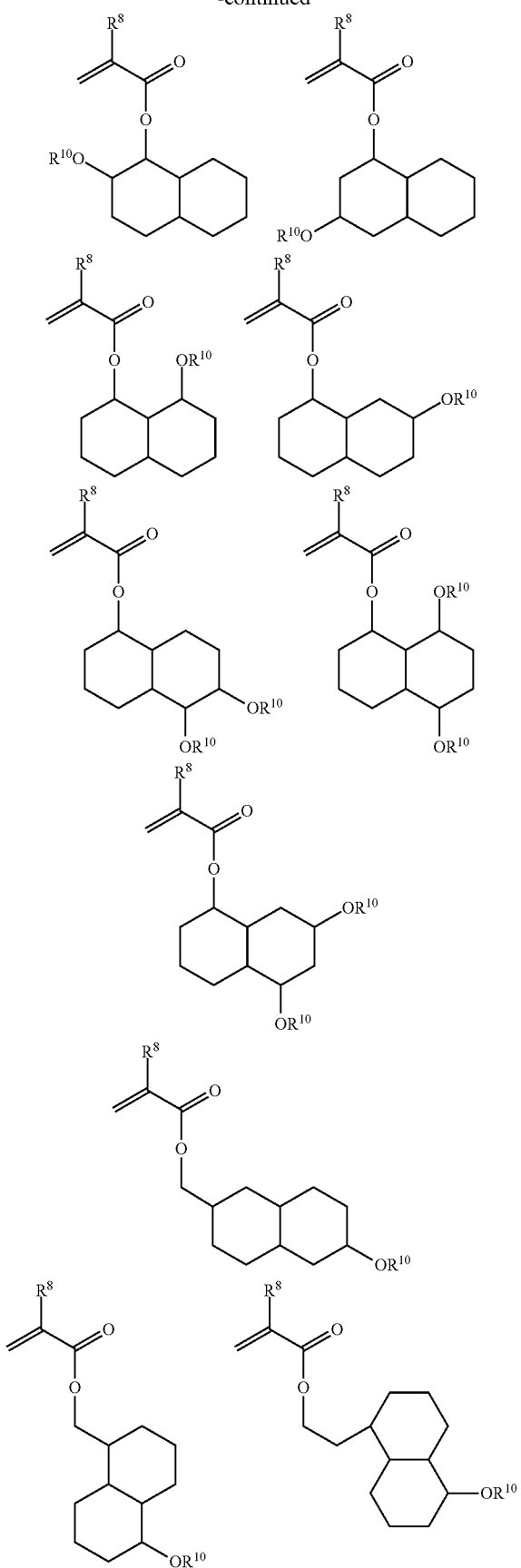
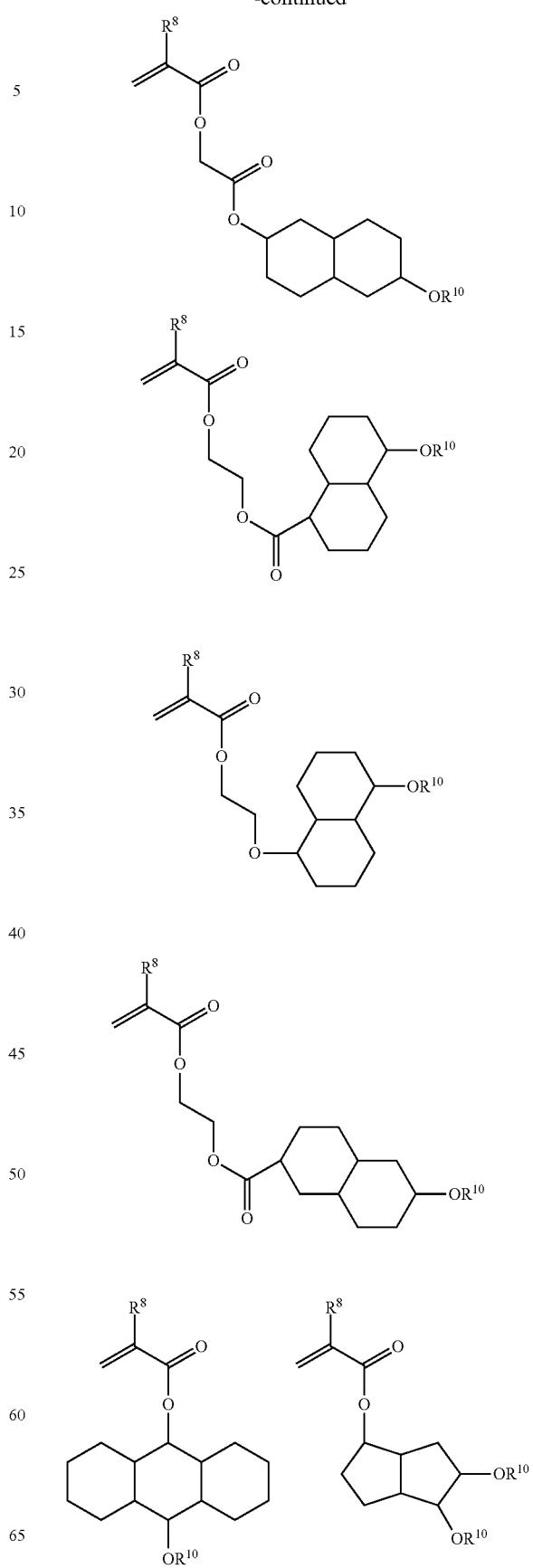

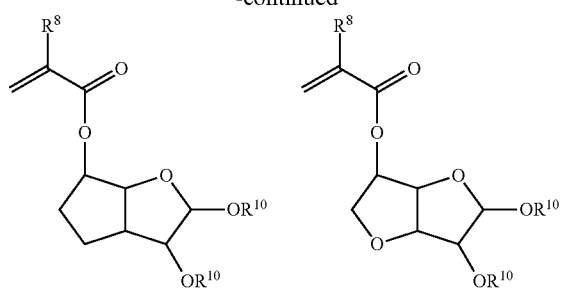
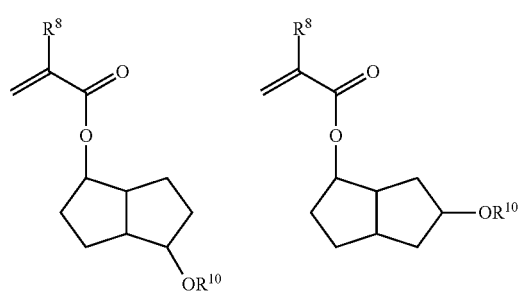
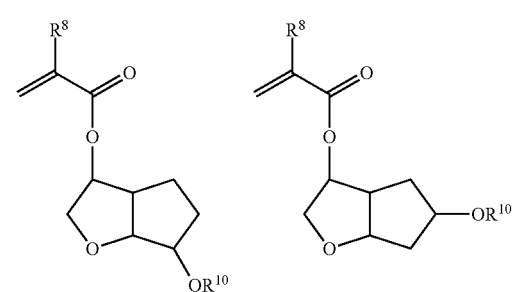
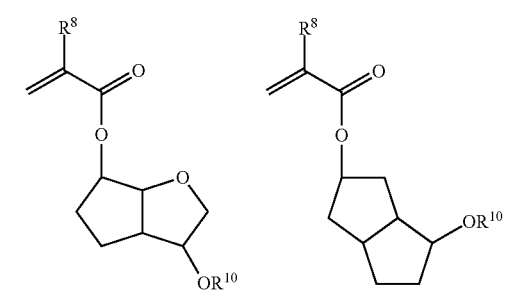
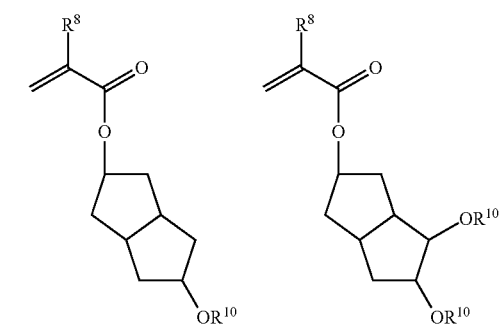
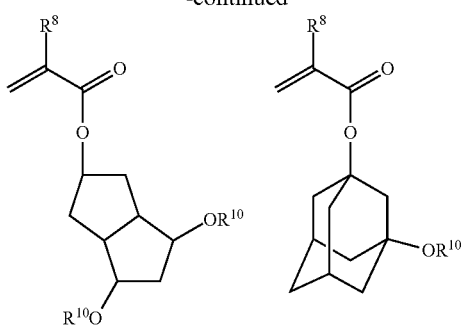
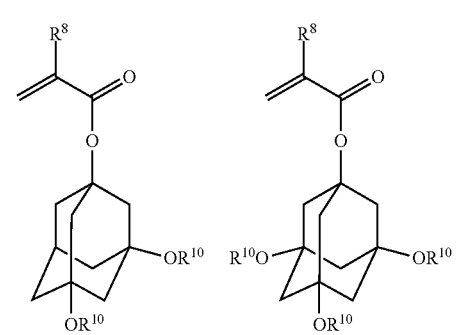
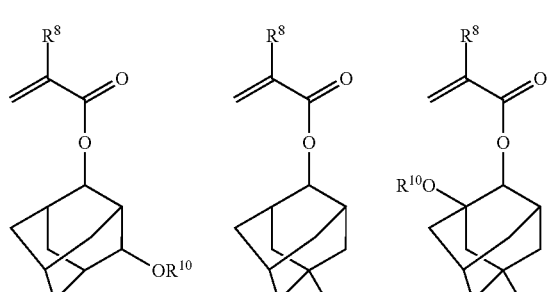
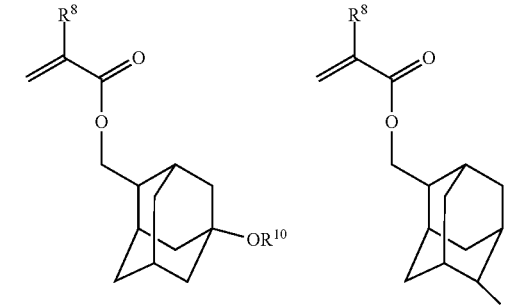
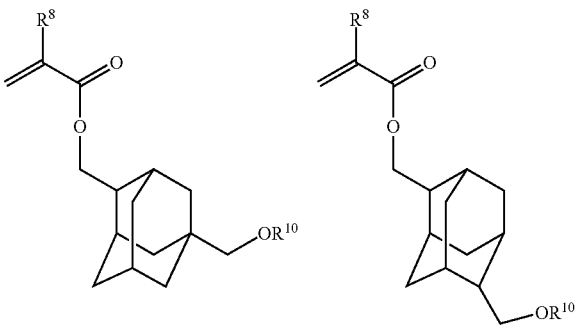

-continued

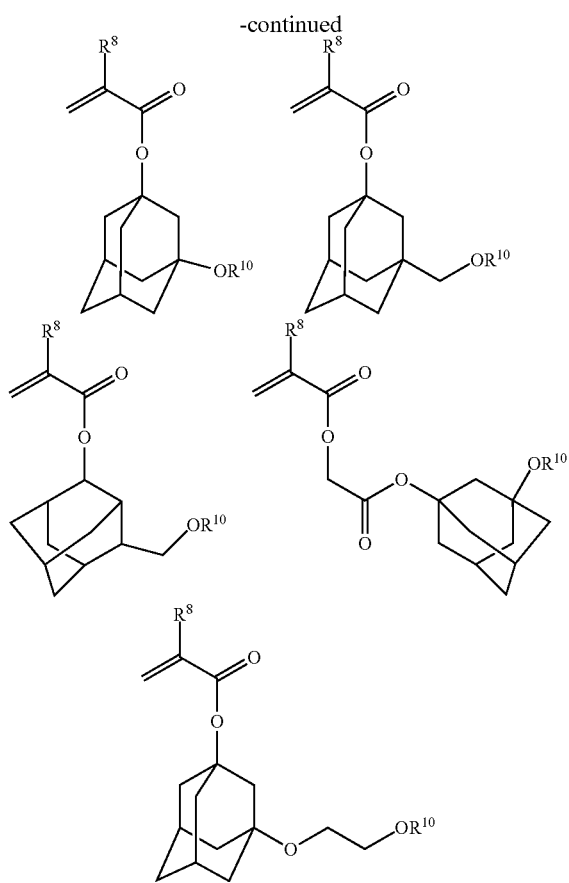

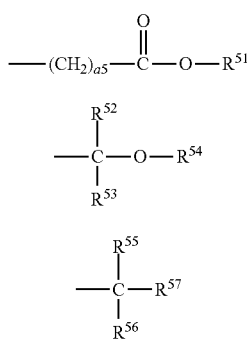

The acid labile groups represented by $R^7$ and $R^{10}$ in formula (2) may be selected from a variety of such groups. Preferred acid labile groups are groups of formulae (AL-10) and (AL-11), tertiary alkyl groups of formula (AL-12), and oxoalkyl groups of 4 to 20 carbon atoms, but not limited thereto.

$$—(CH_2)_{a5}—\overset{O}{\underset{\|}{C}}—O—R^{51} \quad (AL\text{-}10)$$

$$—\underset{R^{53}}{\overset{R^{52}}{\underset{|}{\overset{|}{C}}}}—O—R^{54} \quad (AL\text{-}11)$$

$$—\underset{R^{56}}{\overset{R^{55}}{\underset{|}{\overset{|}{C}}}}—R^{57} \quad (AL\text{-}12)$$

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxy-ethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

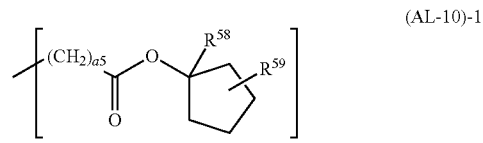
(AL-10)-1

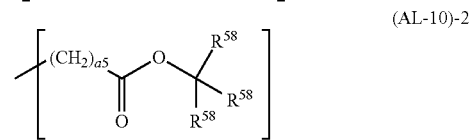
(AL-10)-2

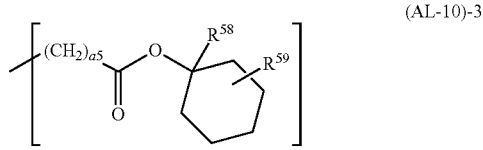
(AL-10)-3

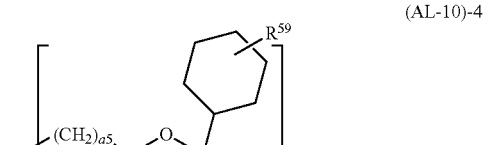
(AL-10)-4

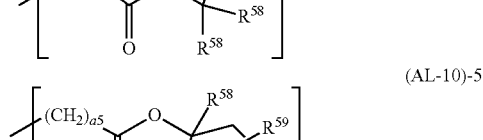
(AL-10)-5

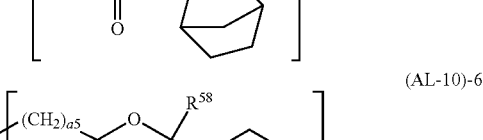
(AL-10)-6

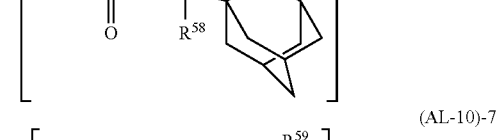
(AL-10)-7

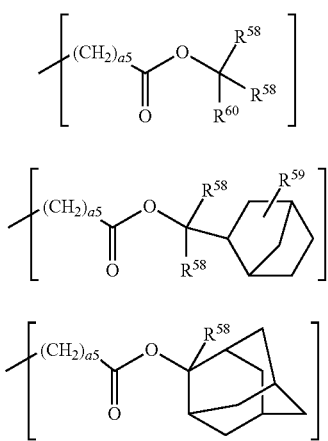
(AL-10)-8
(AL-10)-9
(AL-10)-10

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-112.

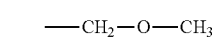 (AL-11)-1
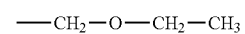 (AL-11)-2
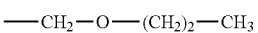 (AL-11)-3
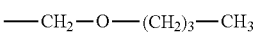 (AL-11)-4
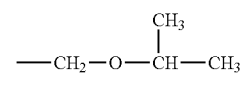 (AL-11)-5
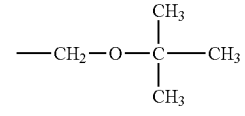 (AL-11)-6
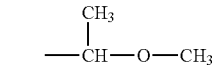 (AL-11)-7
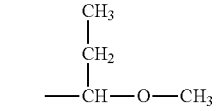 (AL-11)-8
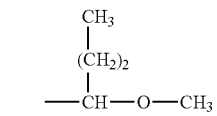 (AL-11)-9
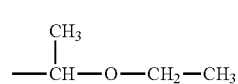 (AL-11)-10

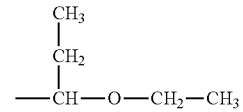 (AL-11)-11
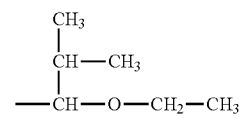 (AL-11)-12
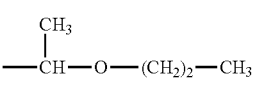 (AL-11)-13
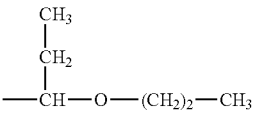 (AL-11)-14
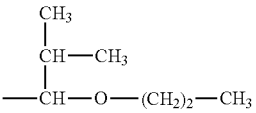 (AL-11)-15
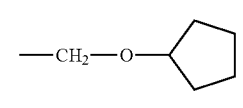 (AL-11)-16
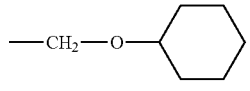 (AL-11)-17
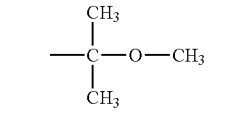 (AL-11)-18
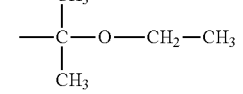 (AL-11)-19
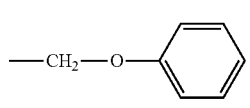 (AL-11)-20
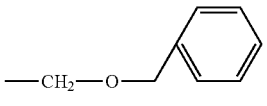 (AL-11)-21
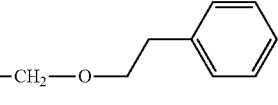 (AL-11)-22
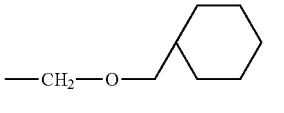 (AL-11)-23
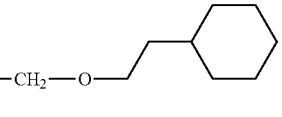 (AL-11)-24

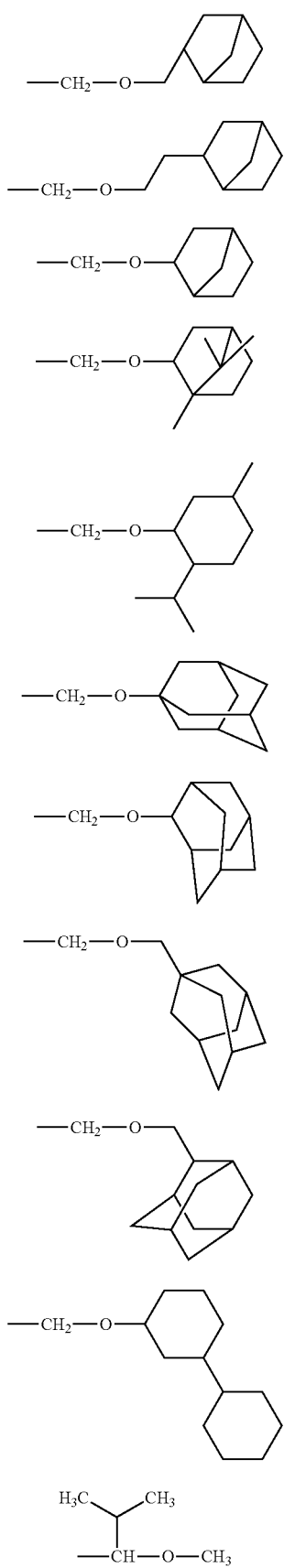
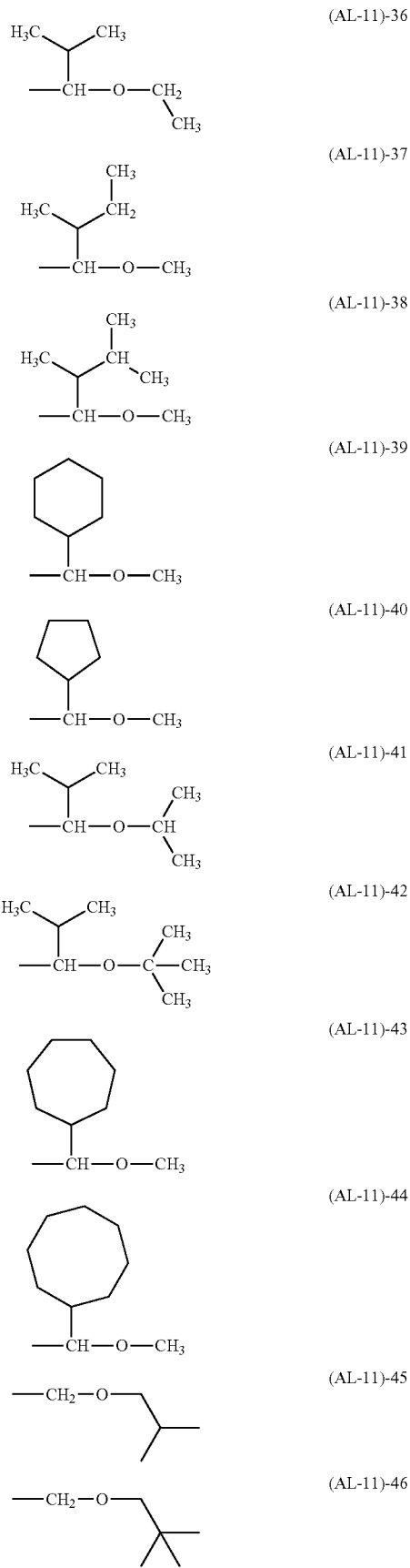

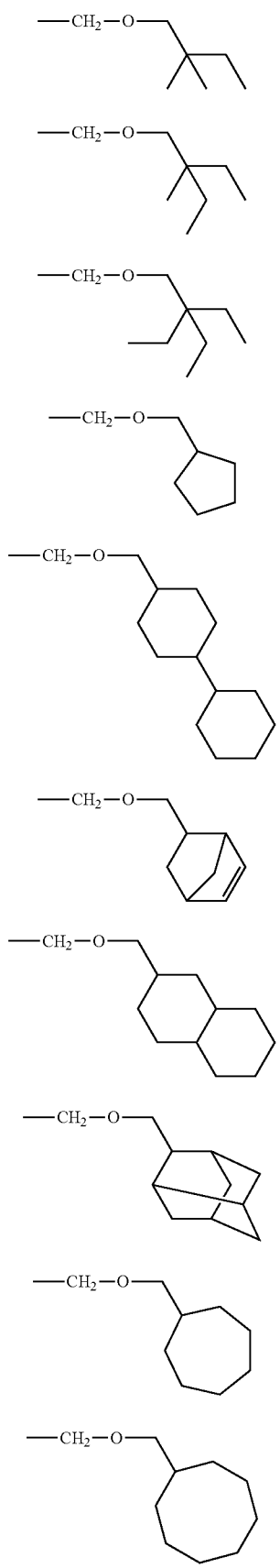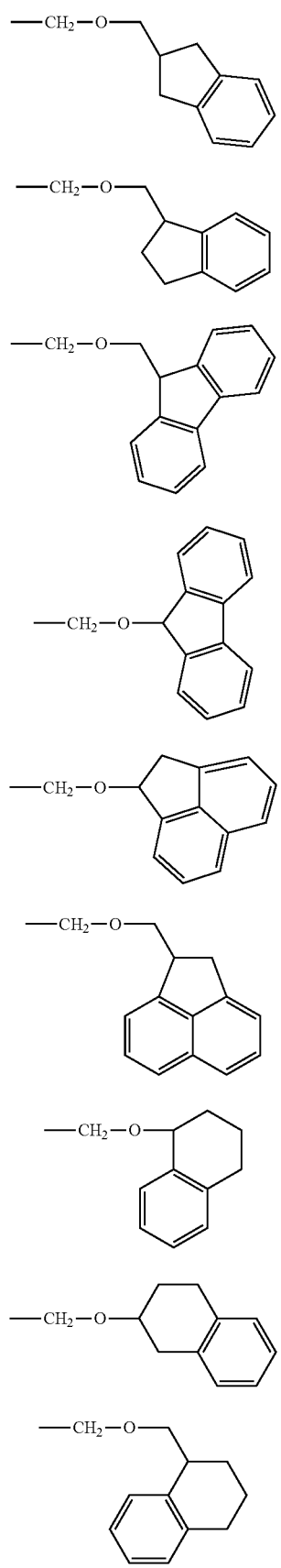

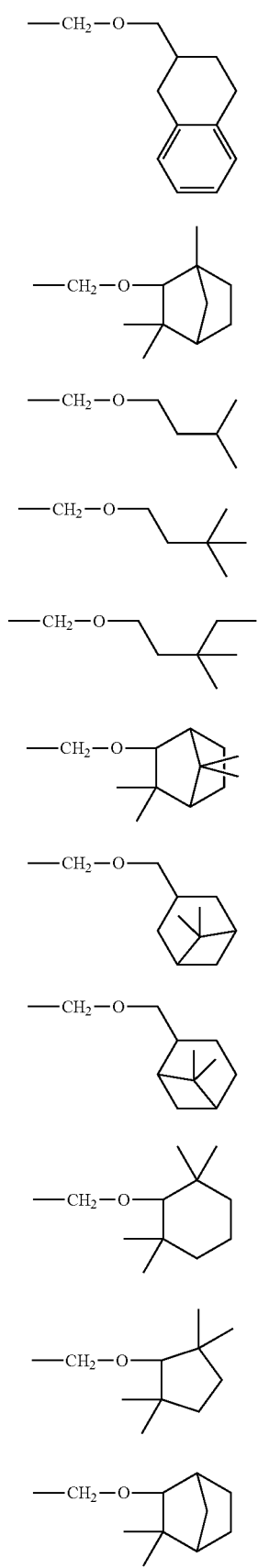
(AL-11)-66
(AL-11)-67
(AL-11)-68
(AL-11)-69
(AL-11)-70
(AL-11)-71
(AL-11)-72
(AL-11)-73
(AL-11)-74
(AL-11)-75
(AL-11)-76
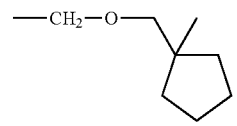
(AL-11)-77
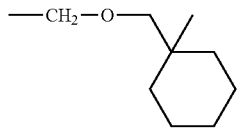
(AL-11)-78
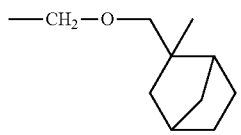
(AL-11)-79
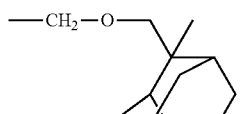
(AL-11)-80
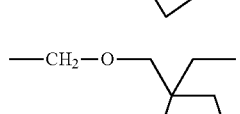
(AL-11)-81
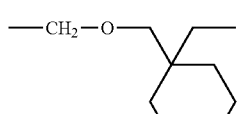
(AL-11)-82
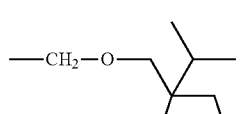
(AL-11)-83
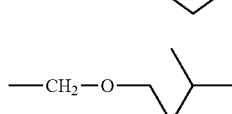
(AL-11)-84
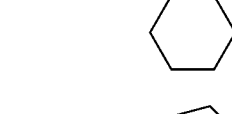
(AL-11)-85
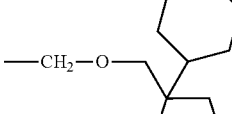
(AL-11)-86
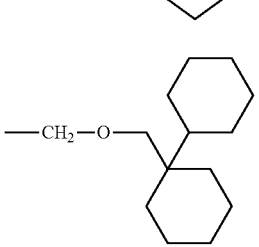

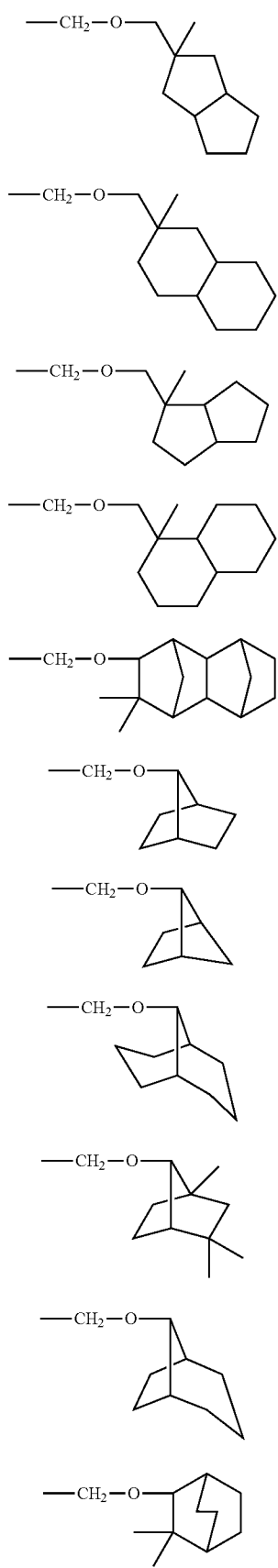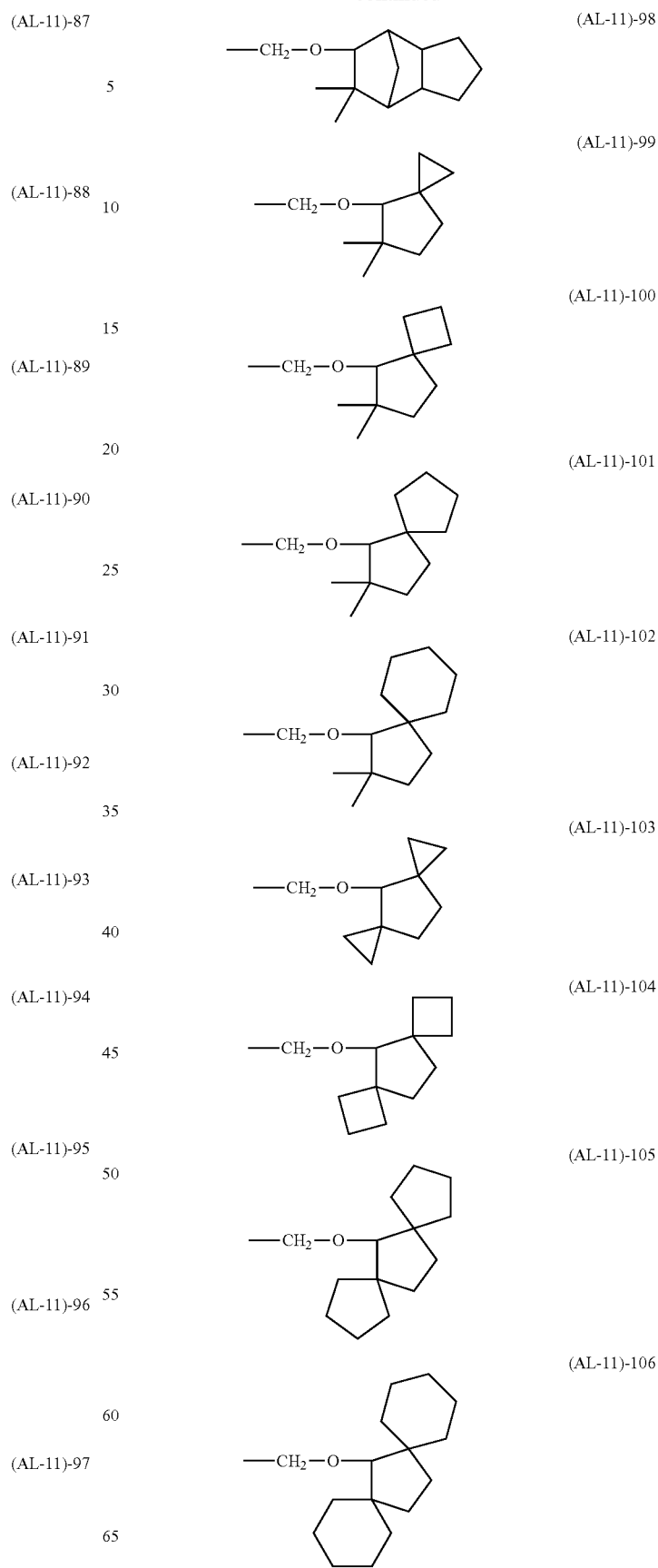

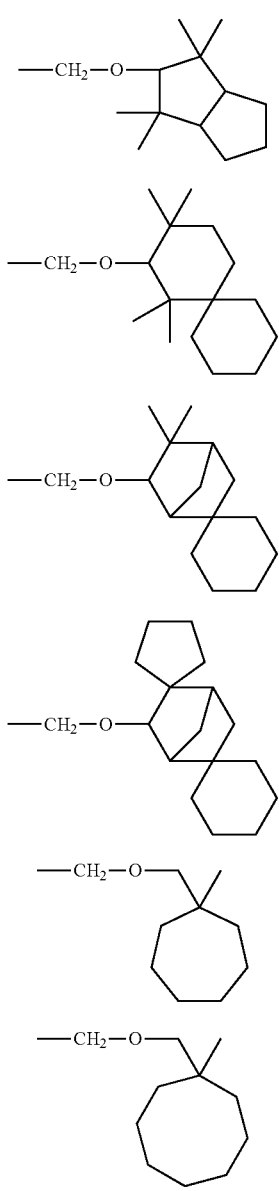

(AL-11)-107

(AL-11)-108

(AL-11)-109

(AL-11)-110

(AL-11)-111

(AL-11)-112

The polymer may be crosslinked within the molecule or between molecules with acid labile groups of formula (AL-11a) or (AL-11b).

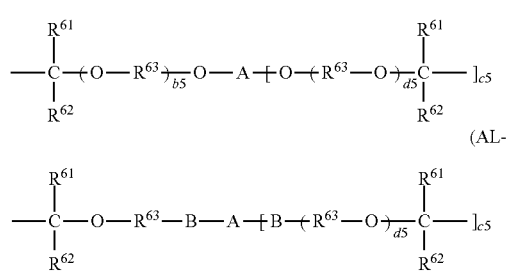

(AL-11a)

(AL-11b)

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ represent a straight or branched $C_1$-$C_8$ alkylene group when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

(AL-11)-113

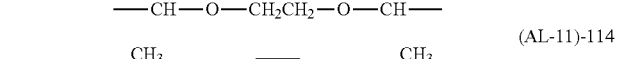

(AL-11)-114

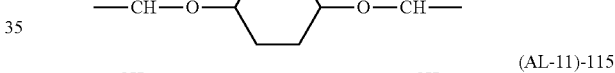

(AL-11)-115

(AL-11)-116

(AL-11)-117

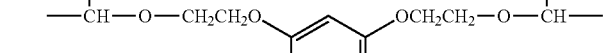

(AL-11)-118

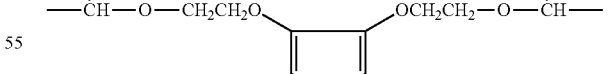

(AL-11)-119

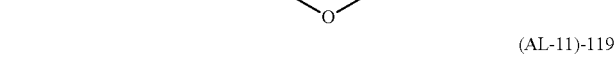

(AL-11)-120
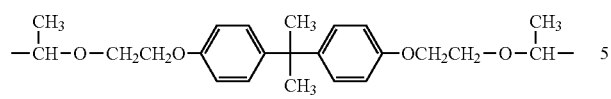
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
(AL-12)-1
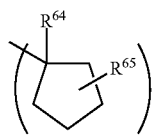
(AL-12)-2
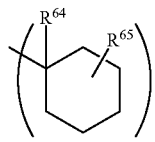
(AL-12)-3
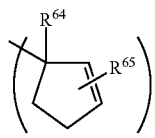
(AL-12)-4
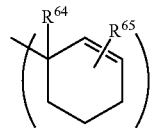
(AL-12)-5
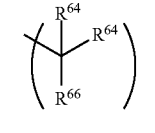
(AL-12)-6
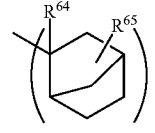
(AL-12)-7
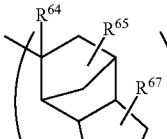
(AL-12)-8
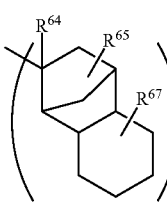
(AL-12)-9
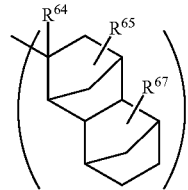
(AL-12)-10
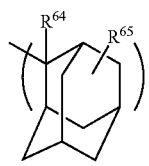
(AL-12)-11
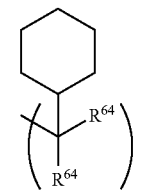
(AL-12)-12
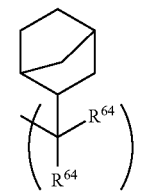
(AL-12)-13
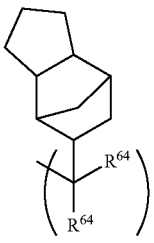
(AL-12)-14
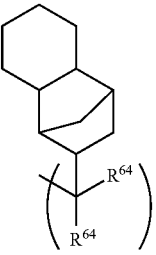
(AL-12)-15
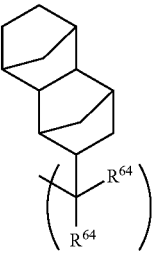

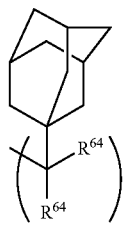
(AL-12)-16

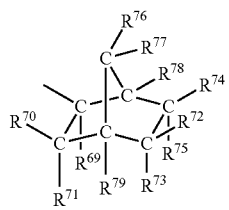
(AL-12)-19

Herein $R^{64}$ is independently a straight, branched or cyclic $C_1$-$C_8$ alkyl group, $C_6$-$C_{20}$ aryl group or $C_7$-$C_{20}$ aralkyl group. Two $R^{63}$ may bond together to form a ring. $R^{65}$ and $R^{67}$ each are hydrogen, methyl or ethyl. $R^{66}$ is a $C_6$-$C_{20}$ aryl group or $C_7$-$C_{20}$ aralkyl group.

Also included are acid labile groups of formula (AL-12)-17. With acid labile groups comprising $R^{68}$ representative of a di- or multivalent alkylene or arylene group, the polymer may be crosslinked within the molecule or between molecules.

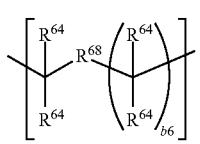
(AL-12)-17

In formula (AL-12)-17, $R^{64}$ is as defined above; $R^{68}$ is a single bond or a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

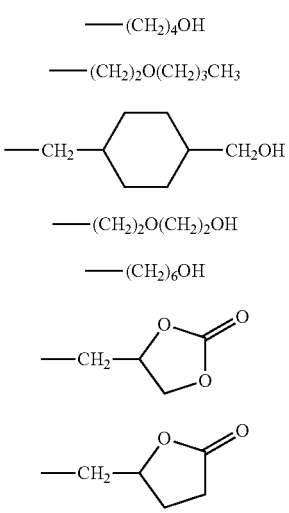

Of the acid labile groups of formula (AL-12), groups having an exo-form structure represented by the formula (AL-12)-19 are preferred.

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically $C_1$-$C_{15}$ alkyl group, which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically alicyclic, with the carbon atom to which they are attached, and in this case, each group participating in ring formation is a divalent hydrocarbon group, typically $C_1$-$C_{15}$ alkylene group, which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

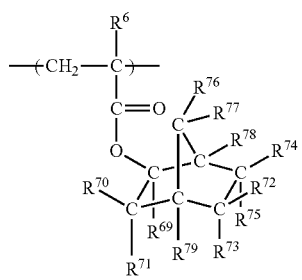

Herein $R^6$ and $R^{69}$ to $R^{79}$ are as defined above.

Illustrative non-limiting examples of suitable monomers are given below.

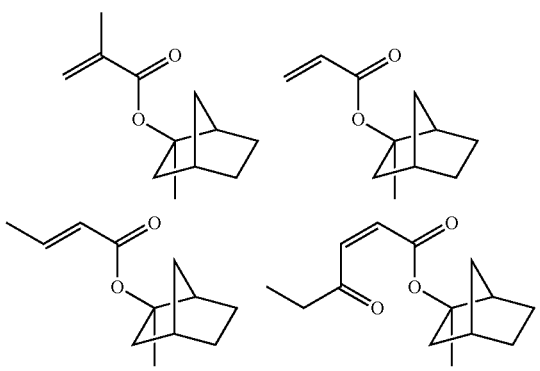

-continued

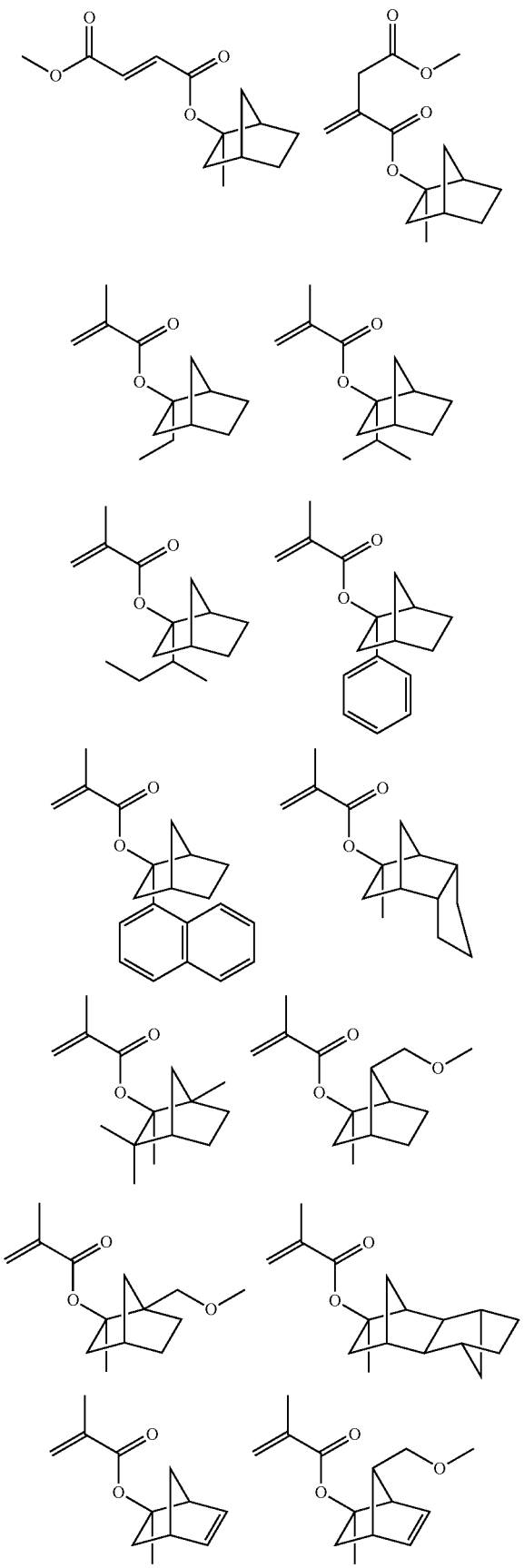

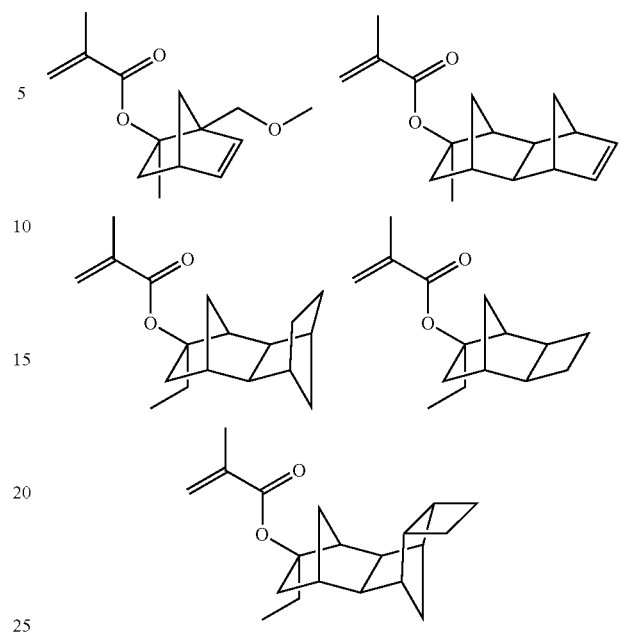

Also included in the acid labile groups of formula (AL-12) are acid labile groups having furandiyl, tetrahydrofurandiyl or oxanorbornanediyl as represented by the following formula (AL-12)-20.

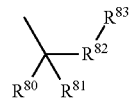
(AL-12)-20

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{62}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

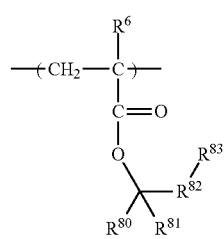

(wherein $R^{80}$ to $R^{83}$ and $R^6$ are as defined above) are derived from monomers, examples of which are shown below. Note that Me is methyl and Ac is acetyl.

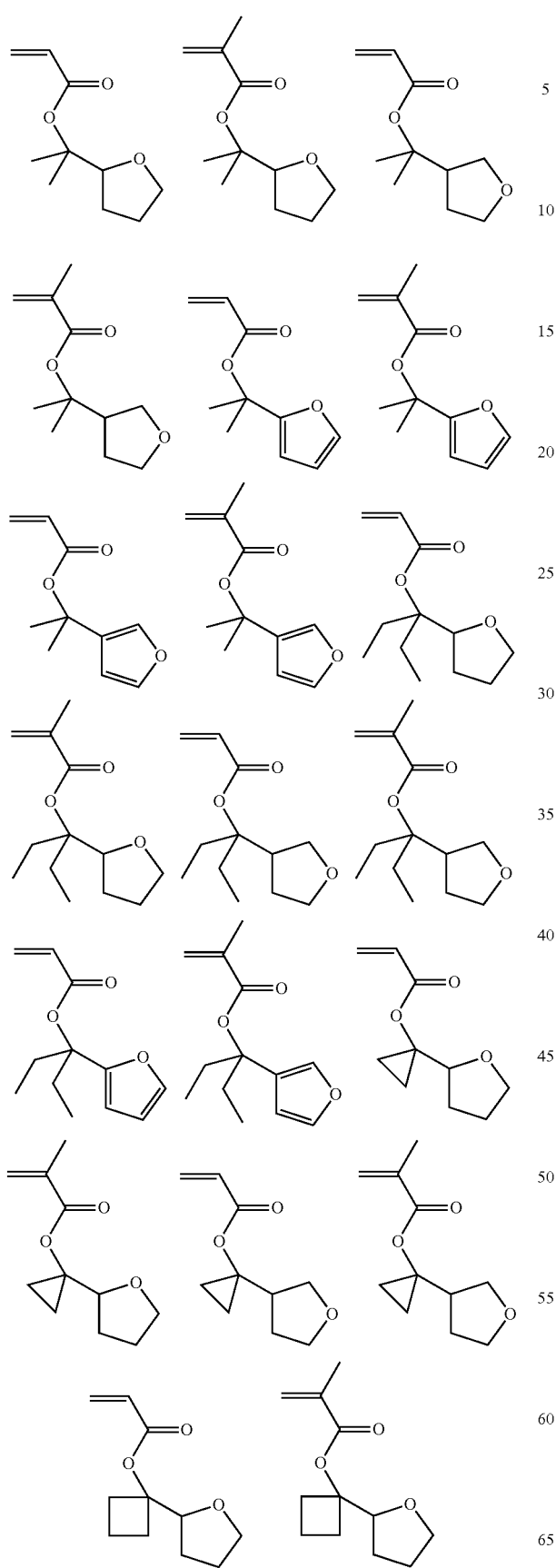
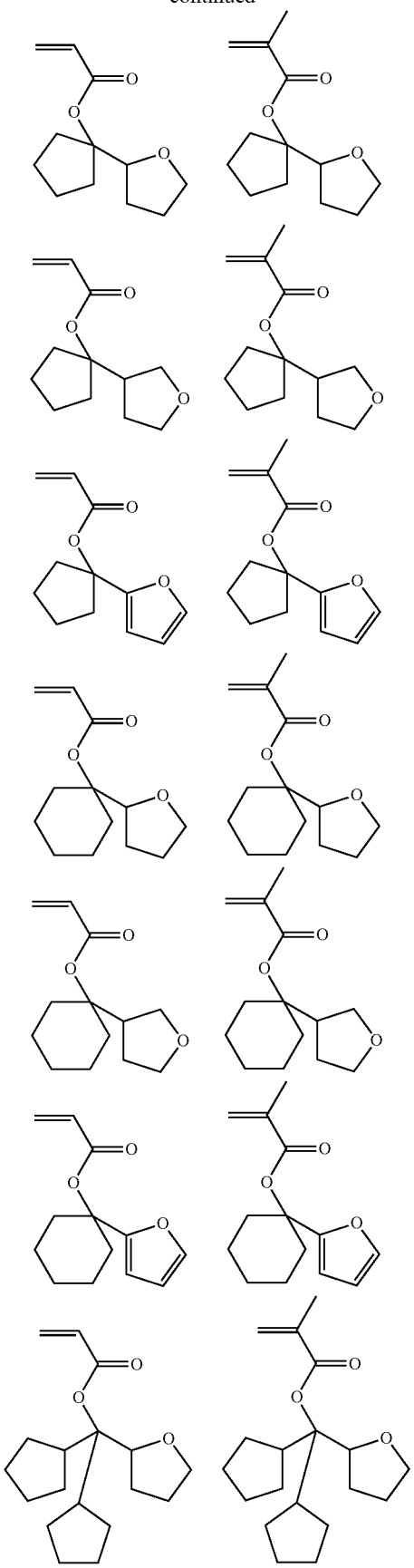

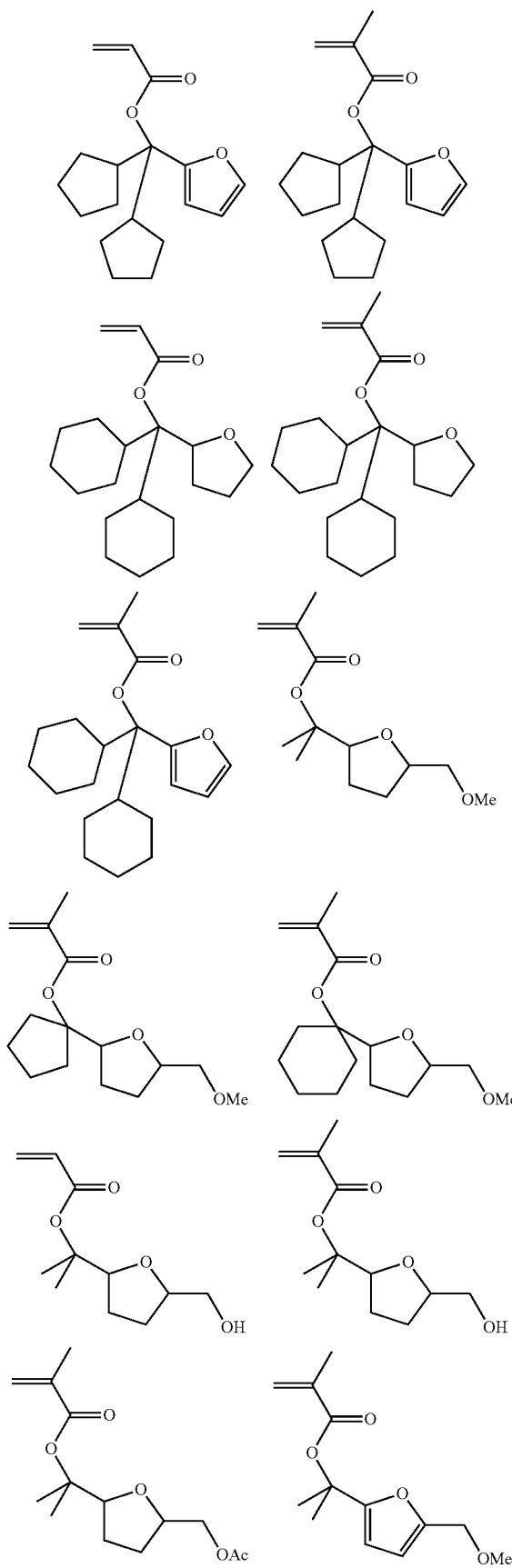
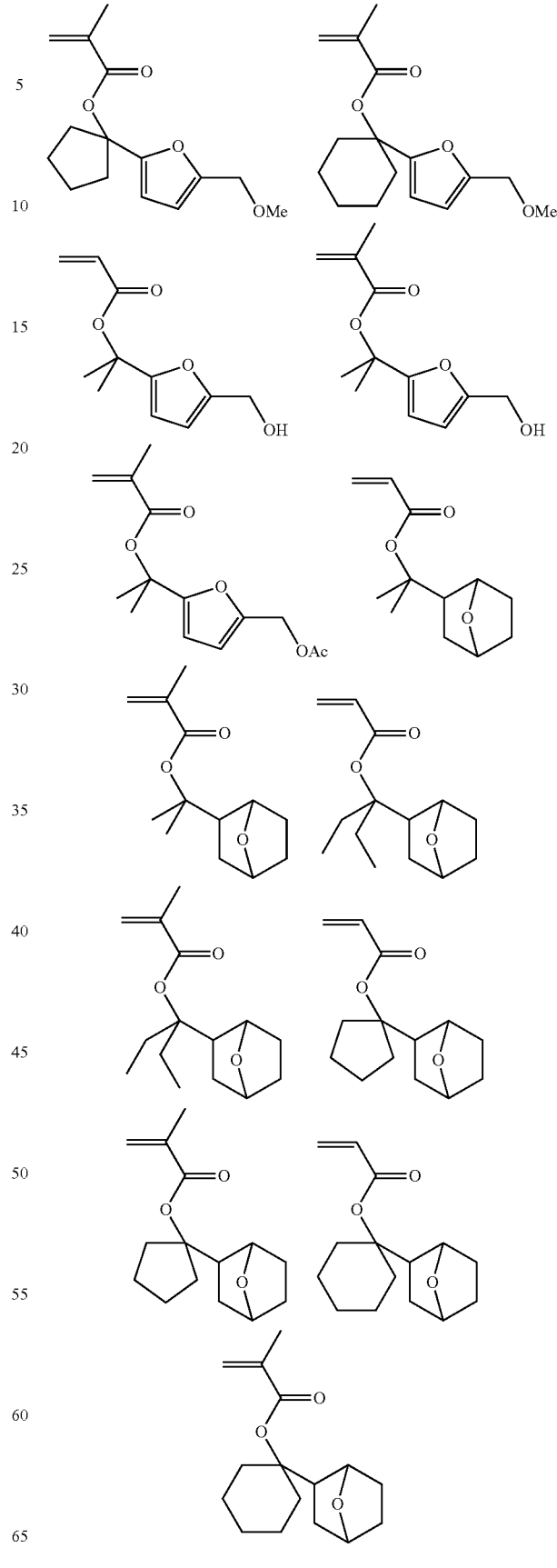

Where the tertiary alkyl group of formula (AL-12) as the acid labile group is a branched alkyl directly bonded to a ring, the polymer has a higher solubility in organic solvent. Such acid labile groups are exemplified below.
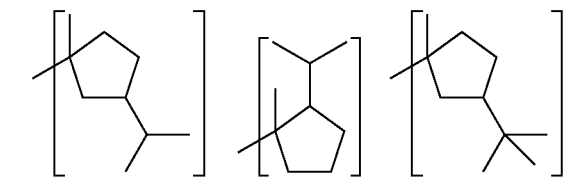
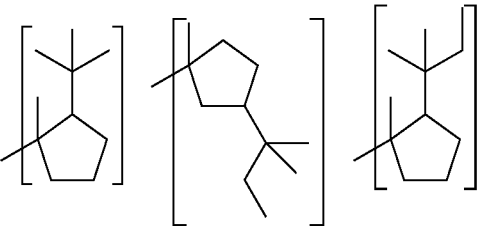
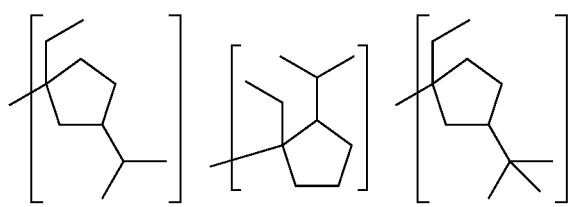
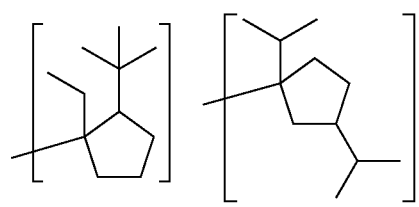
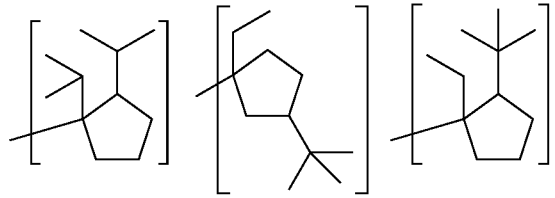
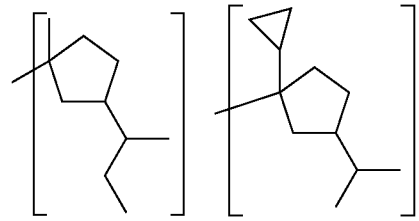
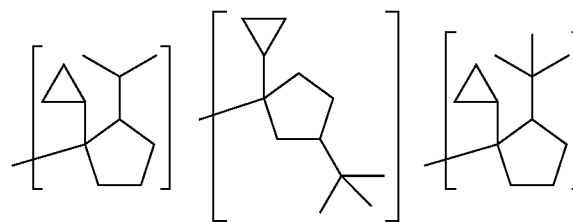
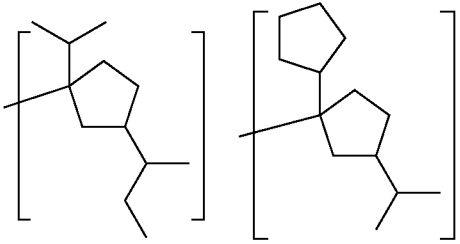
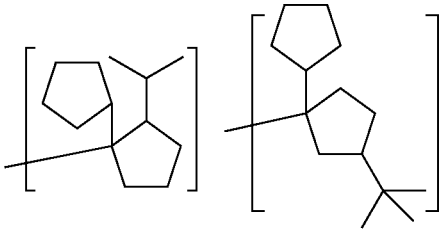
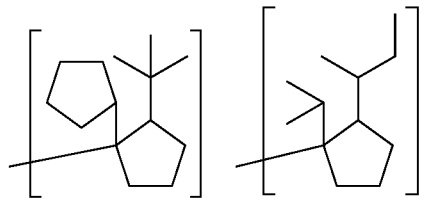
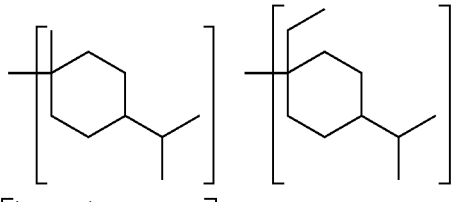
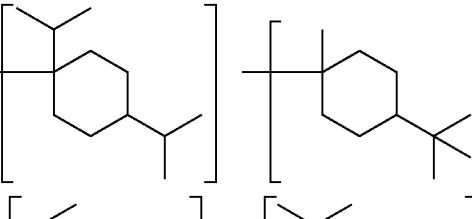
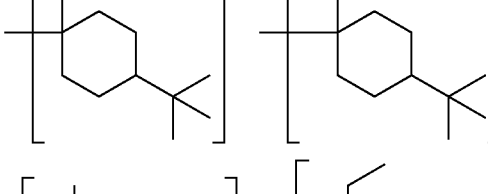
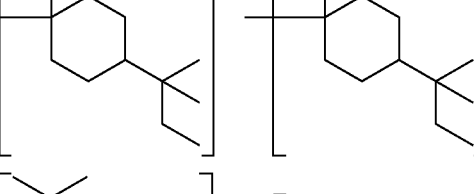
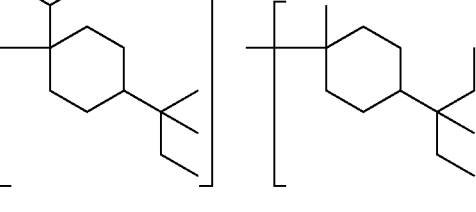

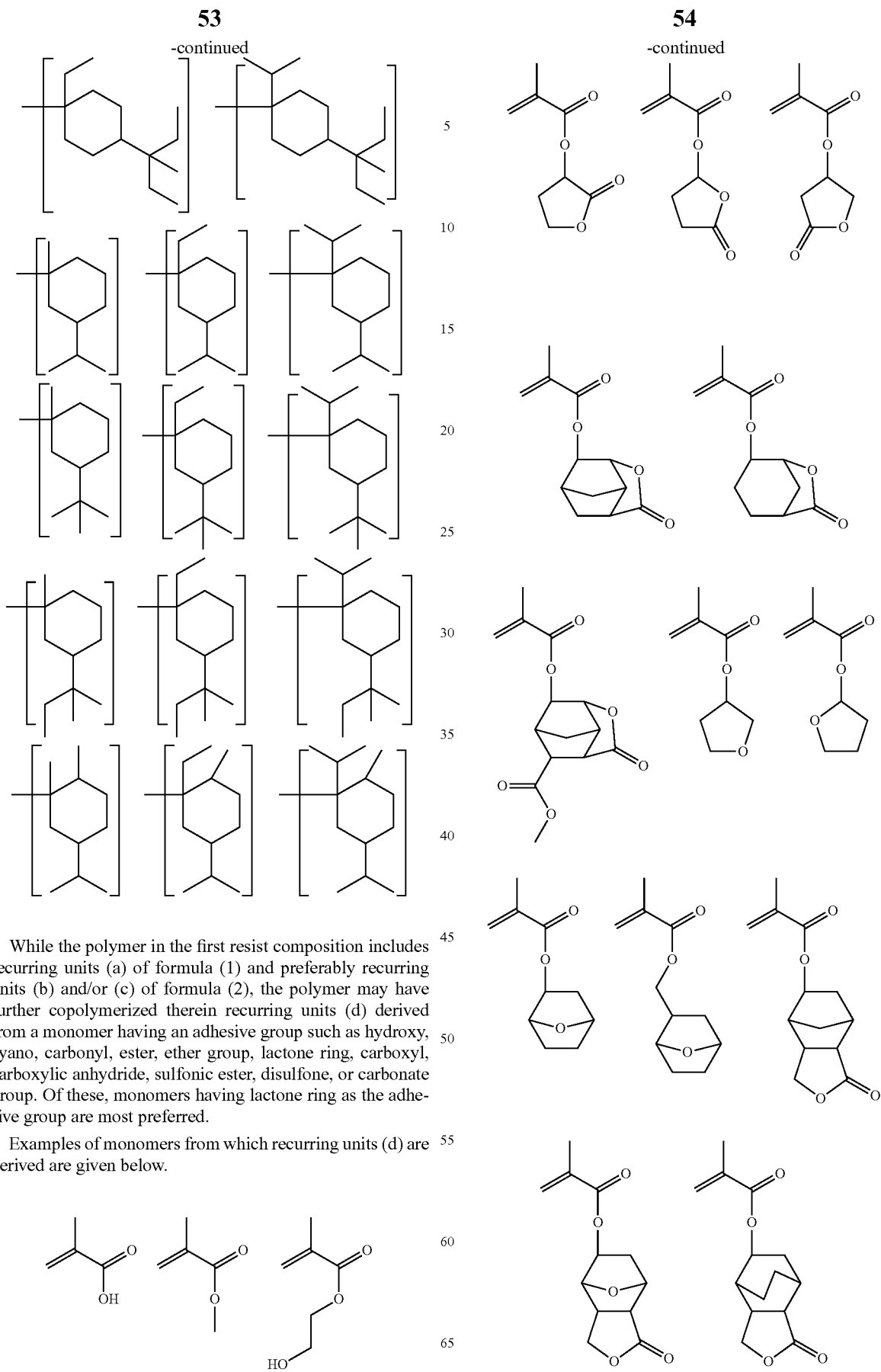

While the polymer in the first resist composition includes recurring units (a) of formula (1) and preferably recurring units (b) and/or (c) of formula (2), the polymer may have further copolymerized therein recurring units (d) derived from a monomer having an adhesive group such as hydroxy, cyano, carbonyl, ester, ether group, lactone ring, carboxyl, carboxylic anhydride, sulfonic ester, disulfone, or carbonate group. Of these, monomers having lactone ring as the adhesive group are most preferred.

Examples of monomers from which recurring units (d) are derived are given below.

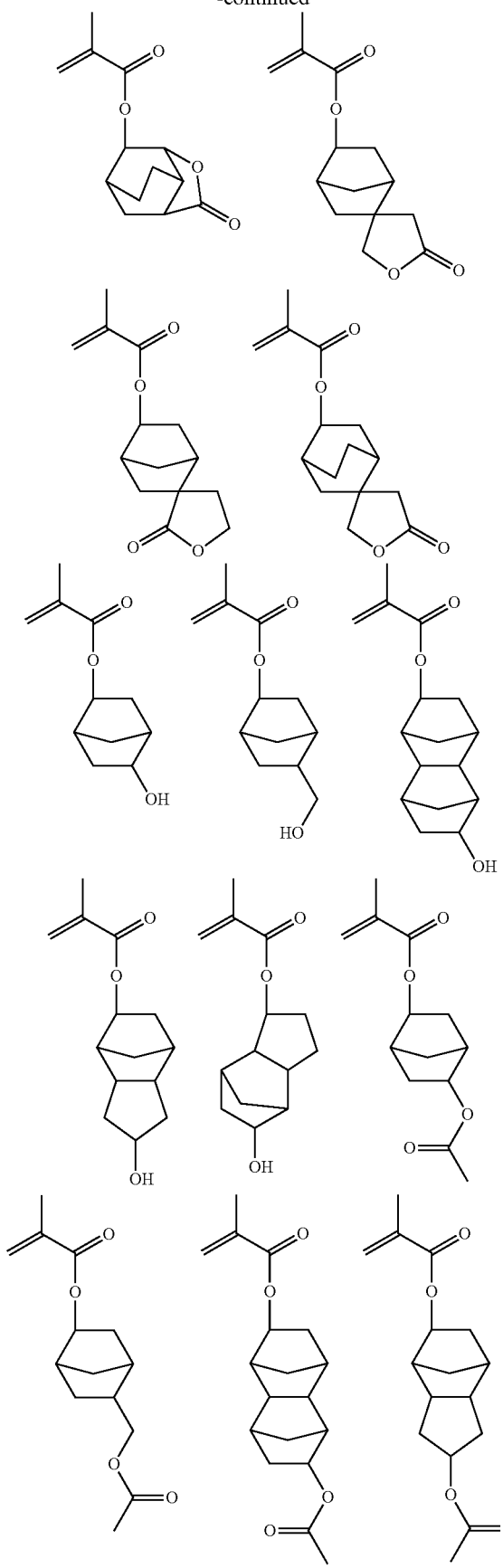
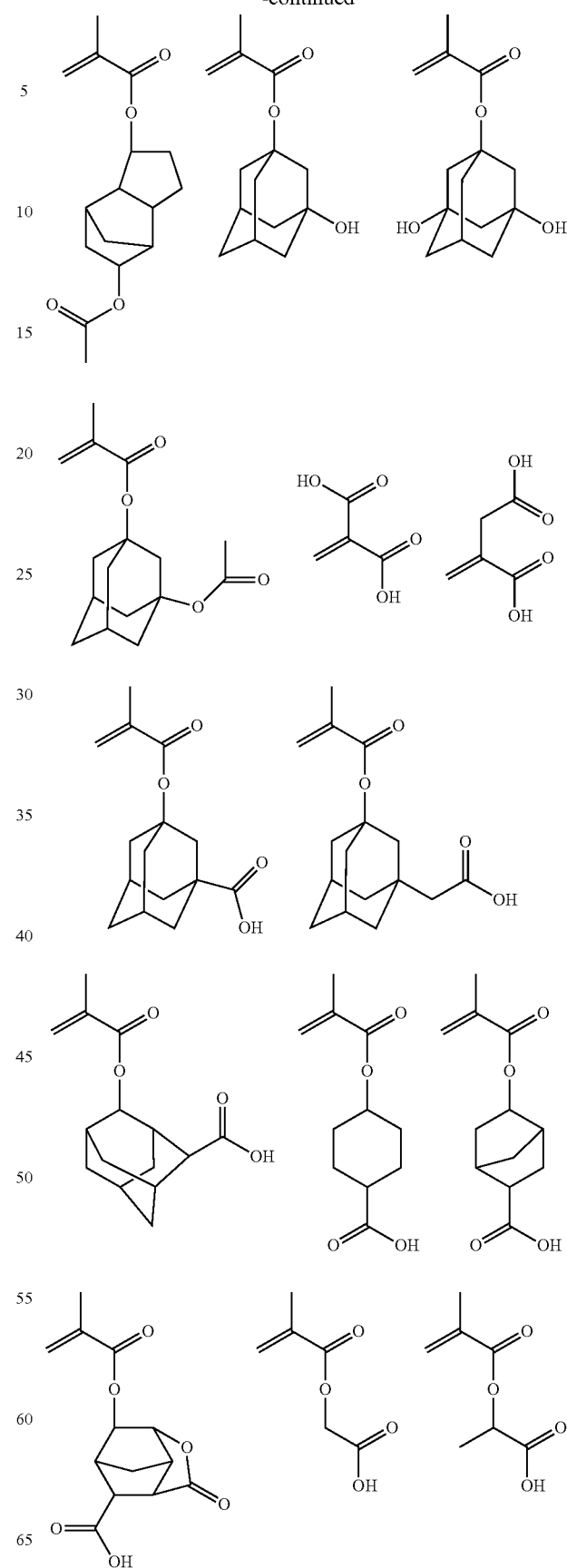

57
-continued
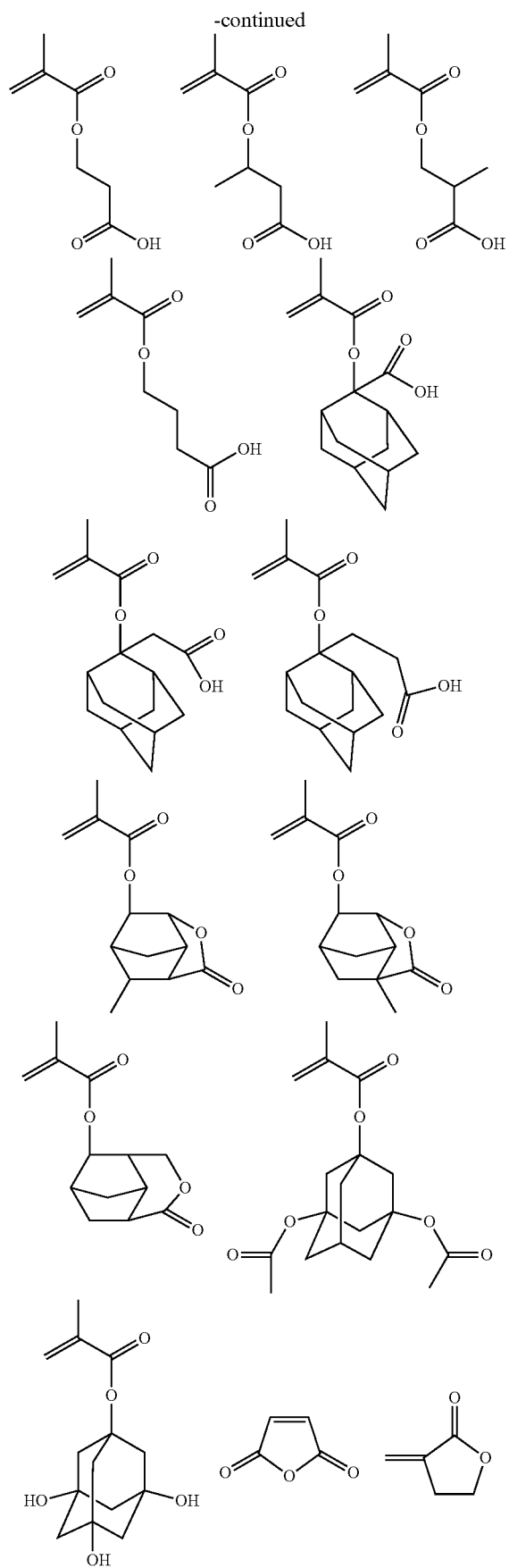
58
-continued
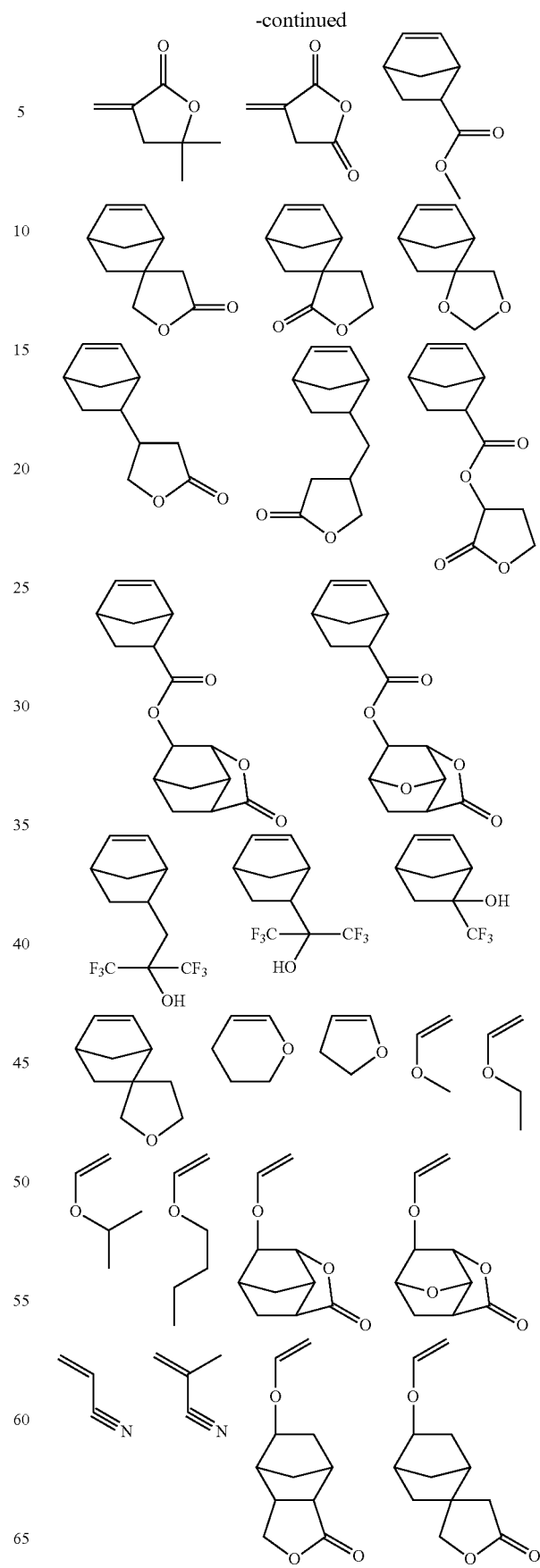

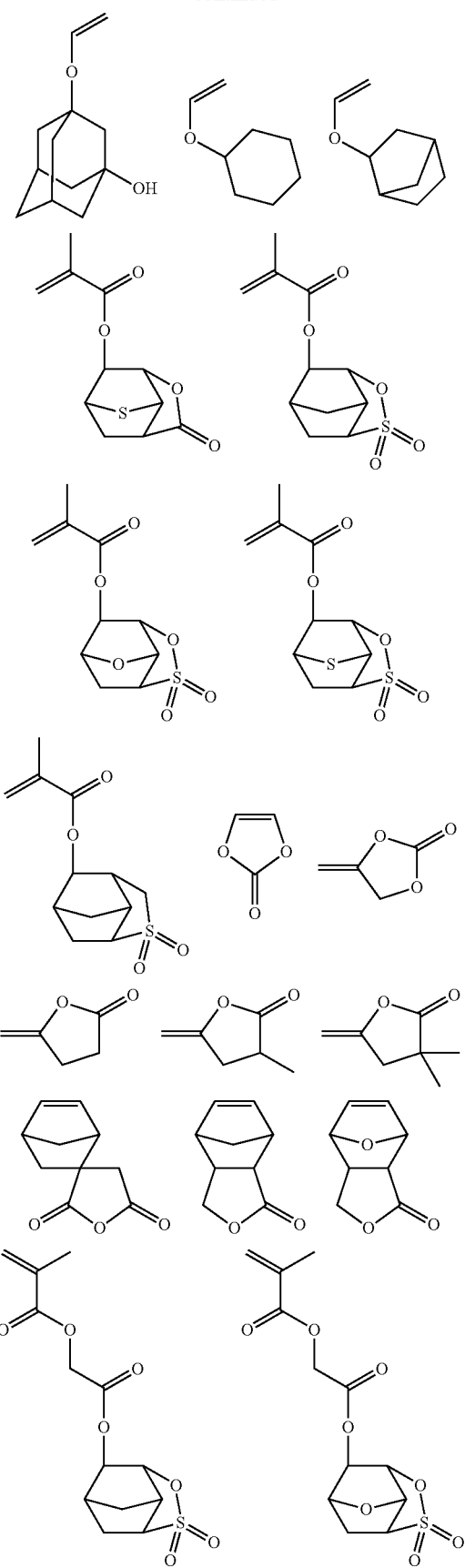
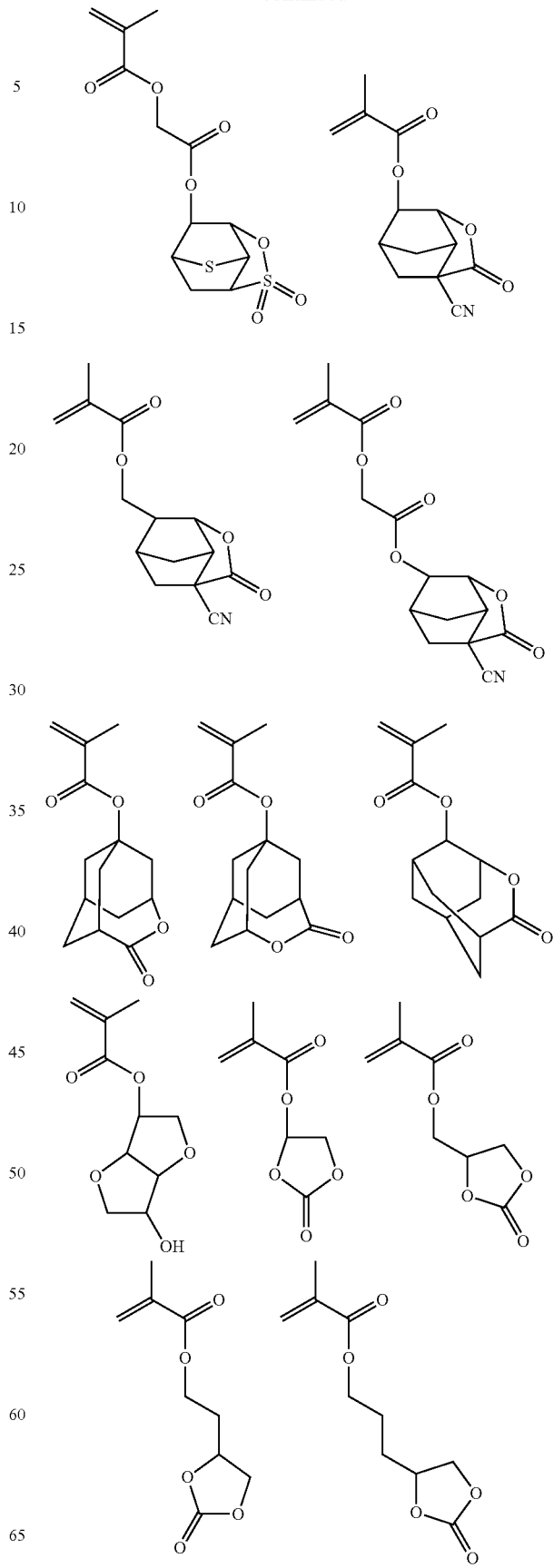

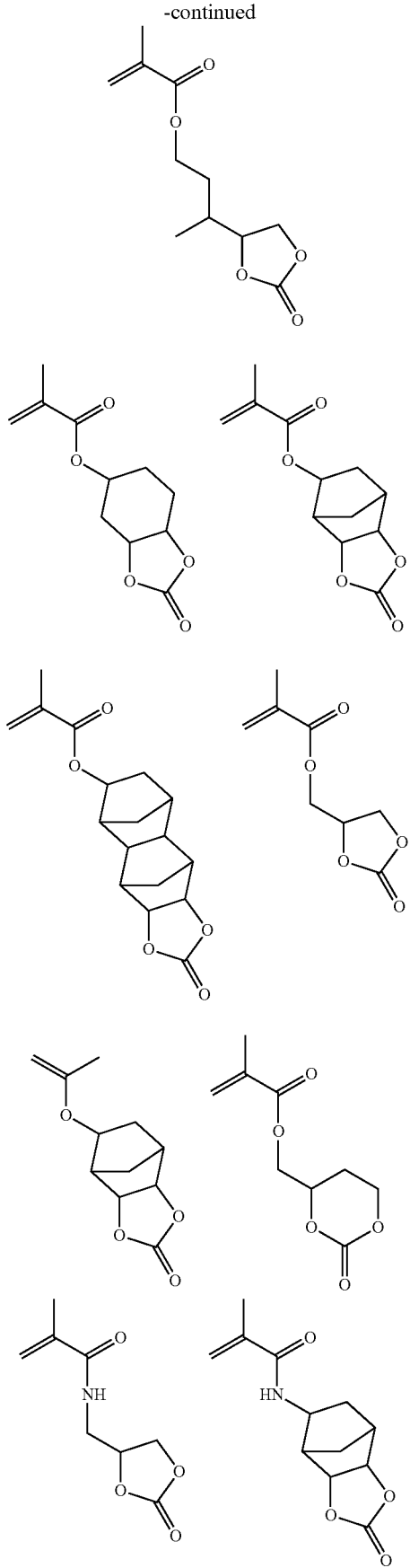
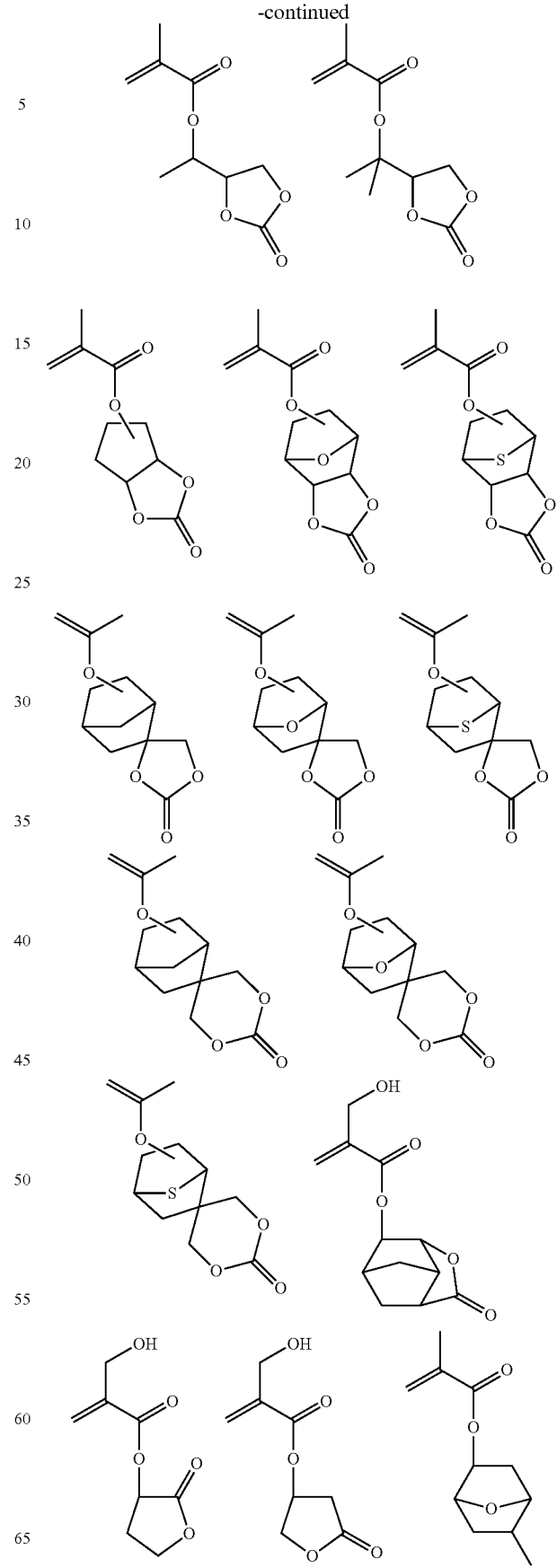

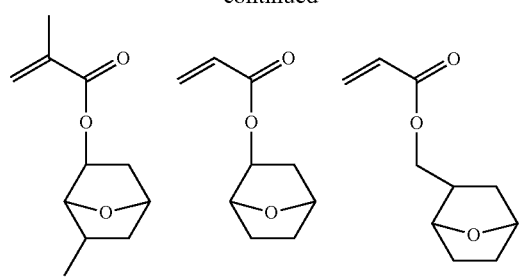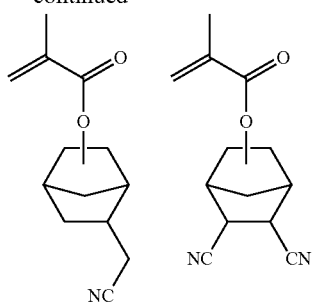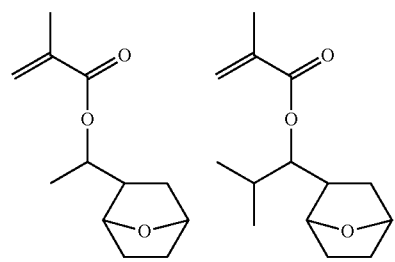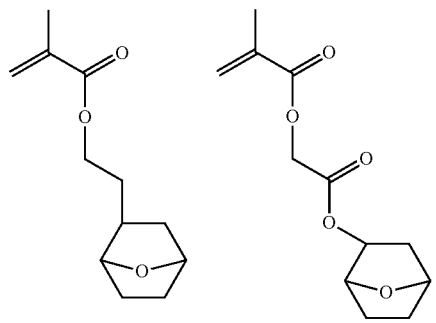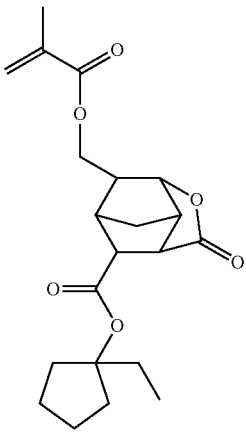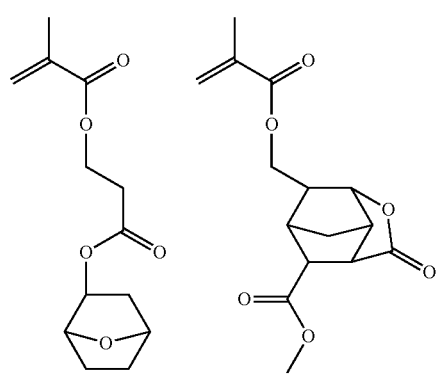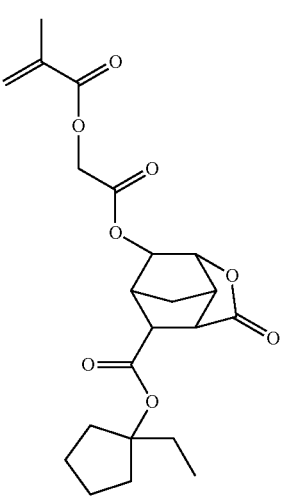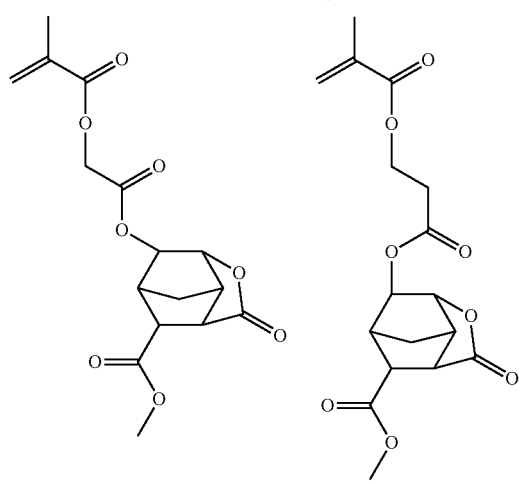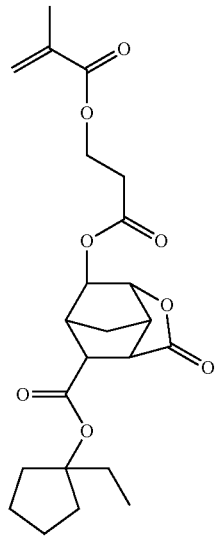

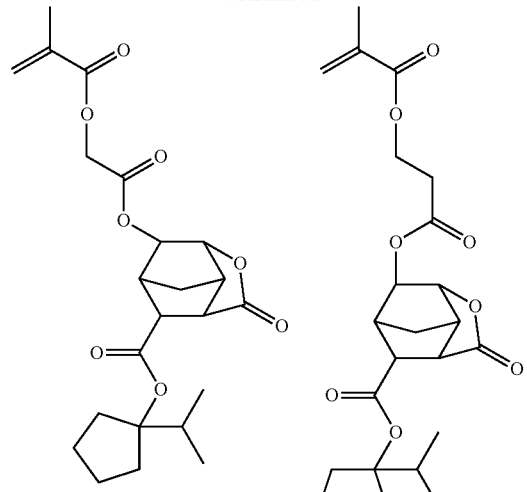
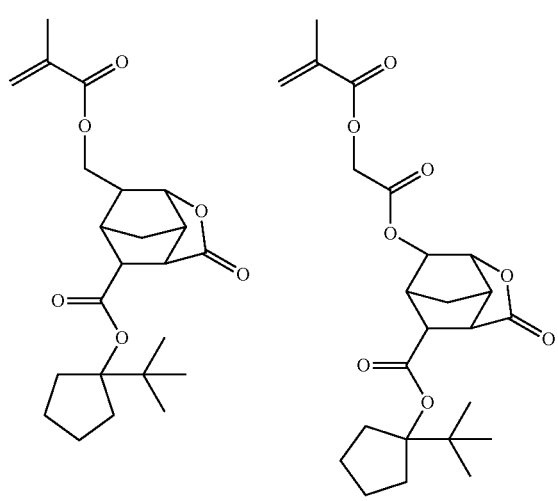
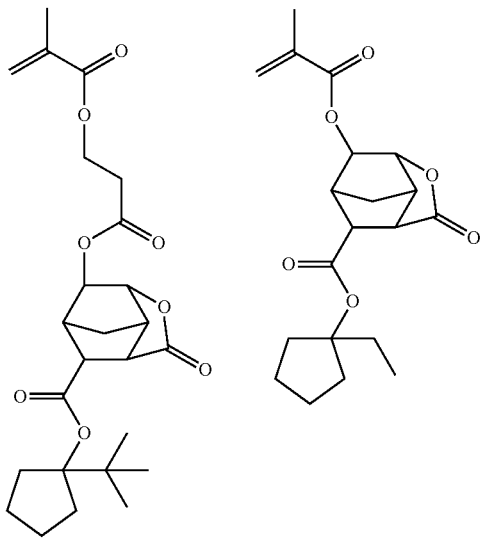
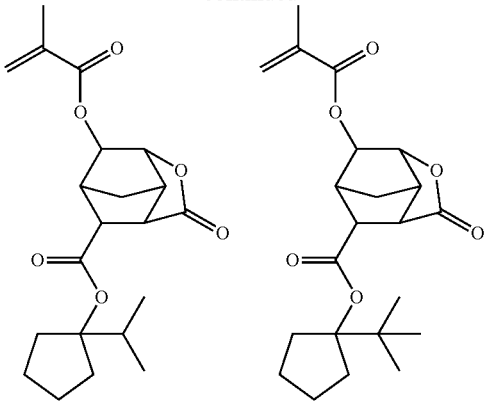
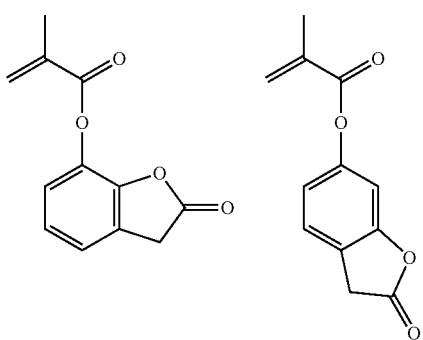
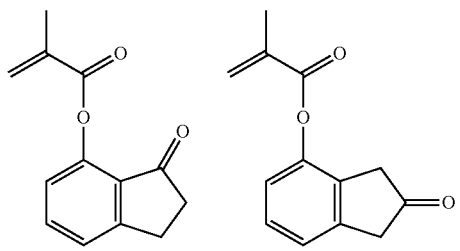
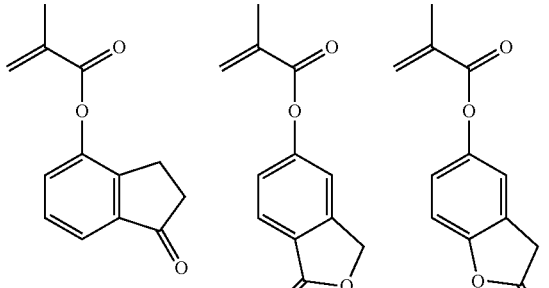
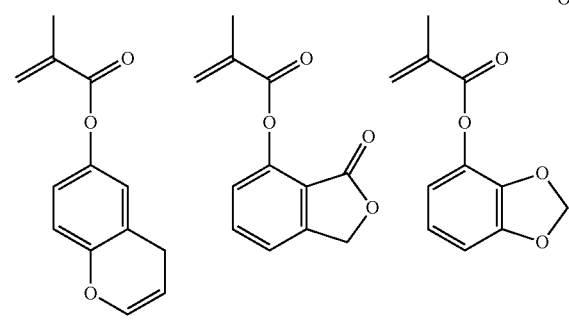

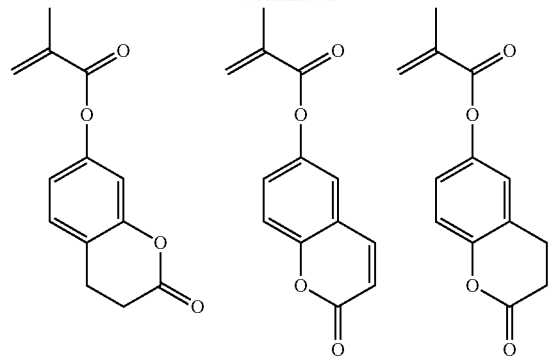
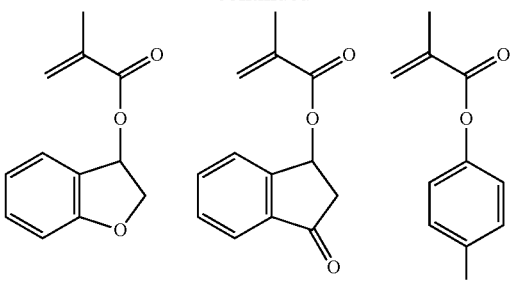
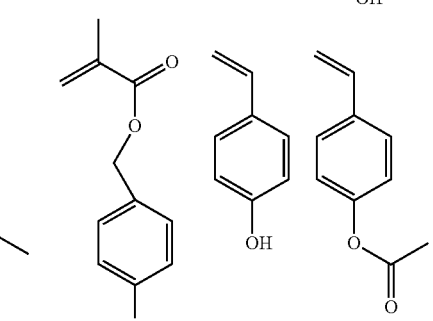
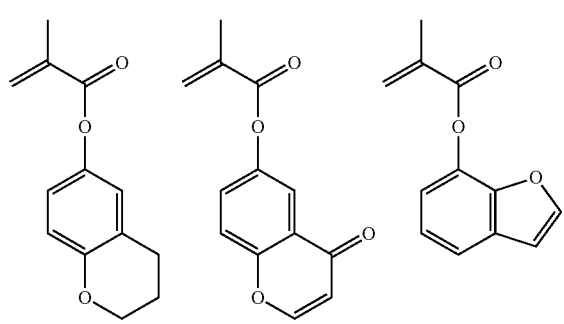
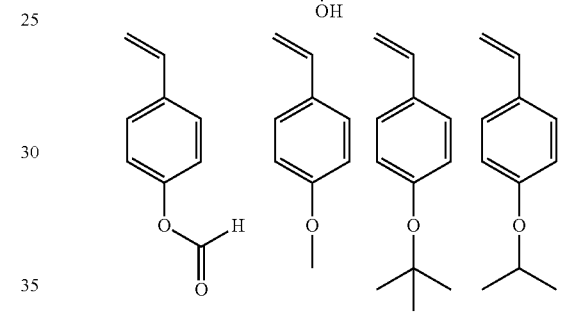
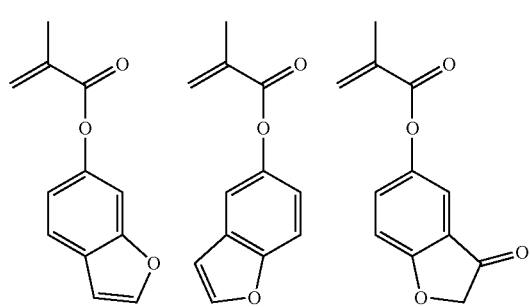
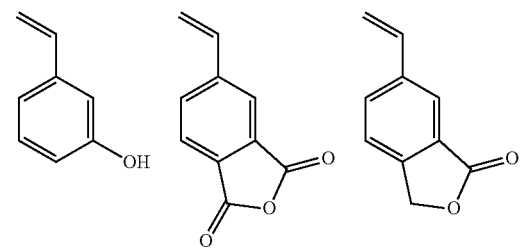
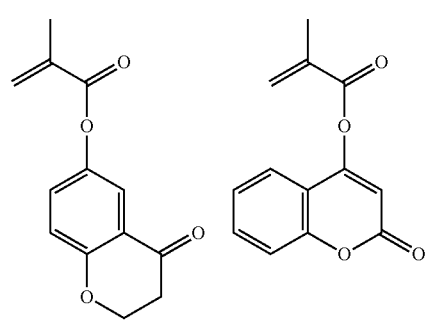
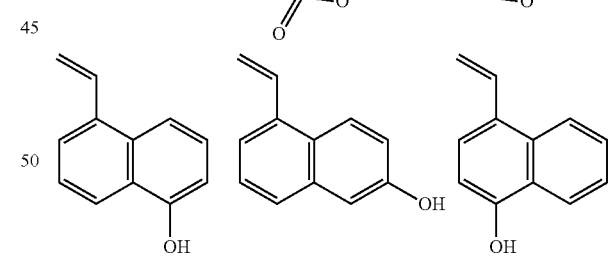
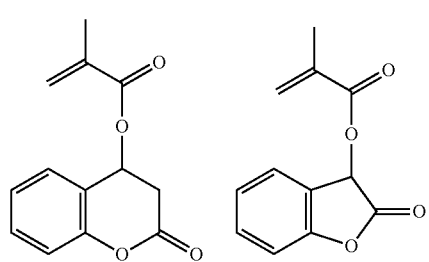

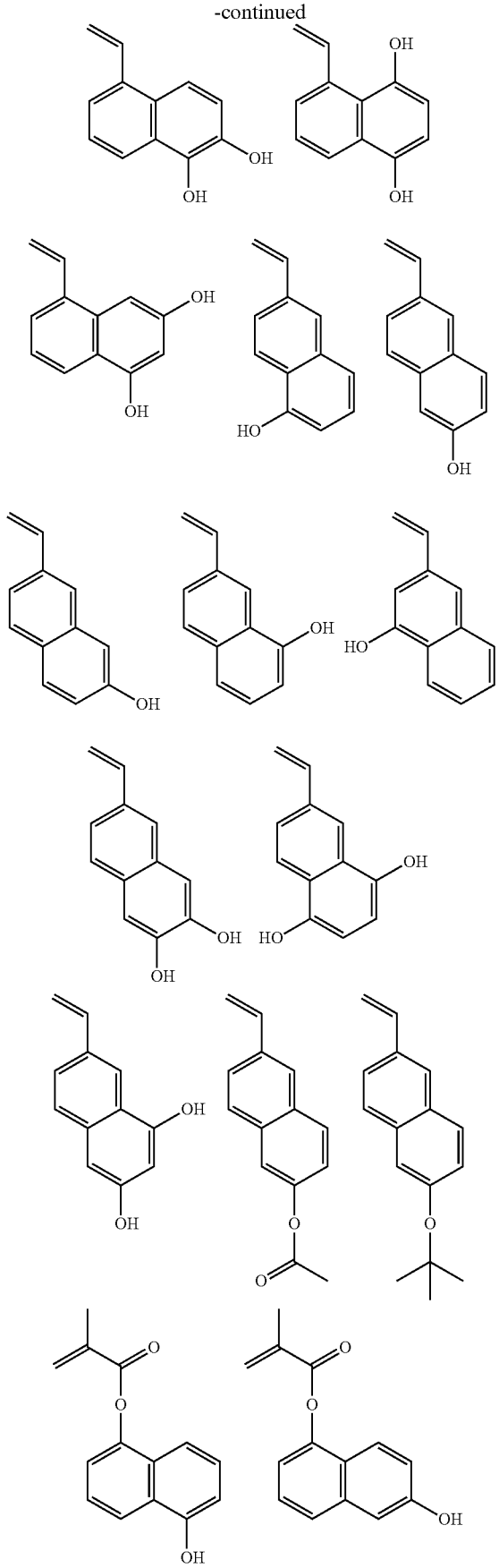

71
-continued
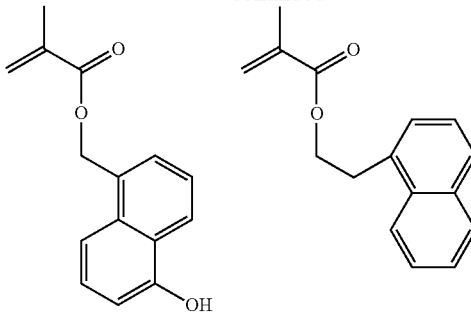
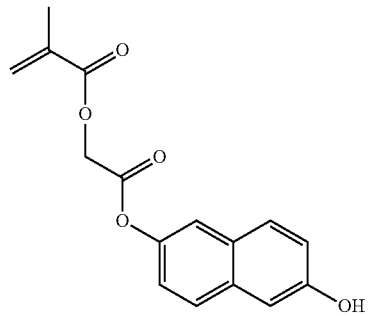
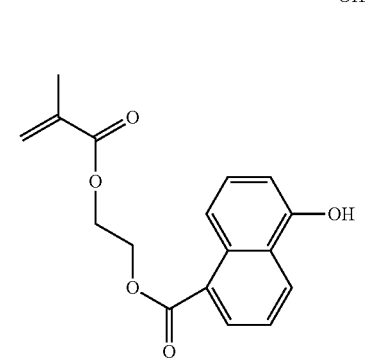
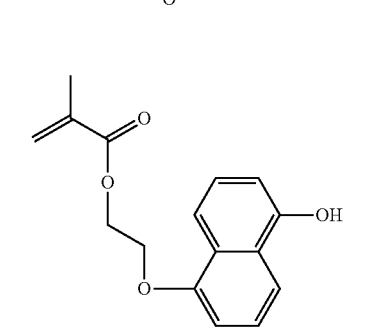
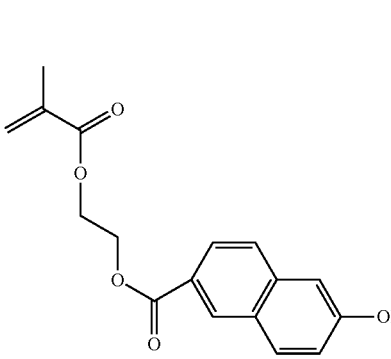
72
-continued
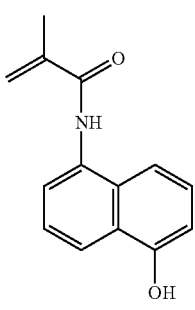
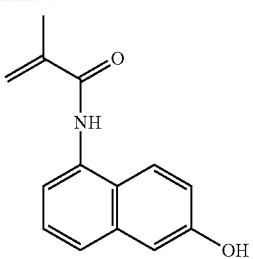
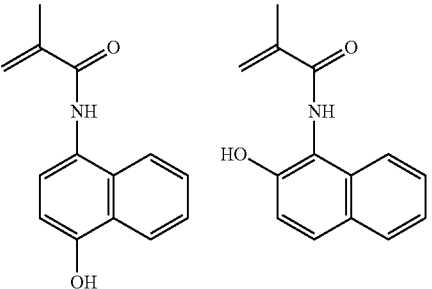
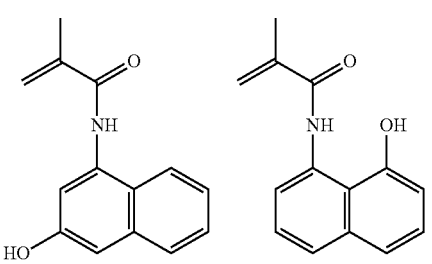
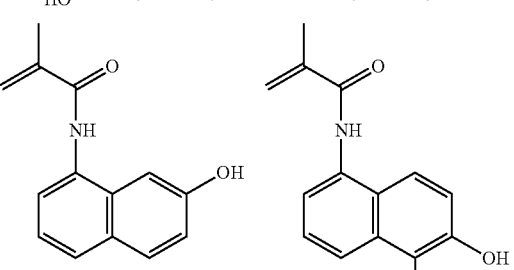
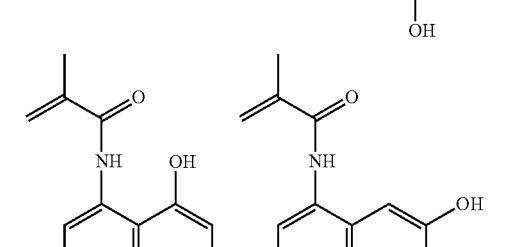
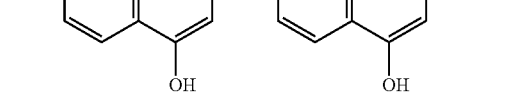
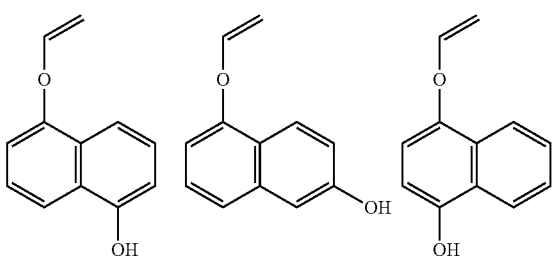

73
-continued
74
-continued
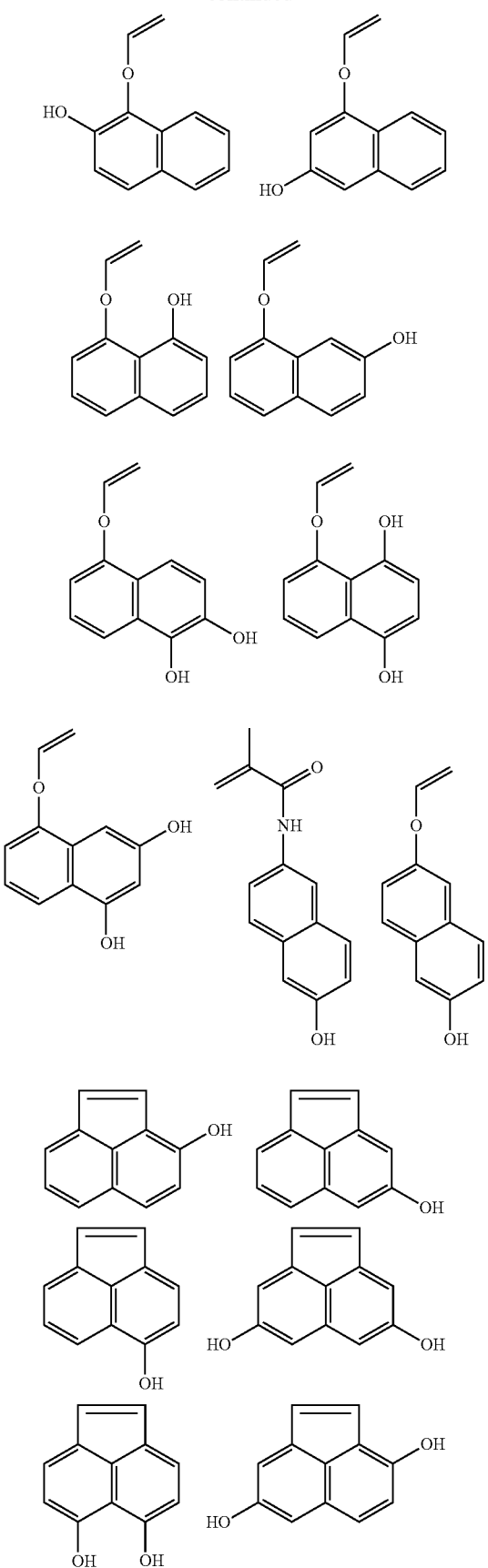
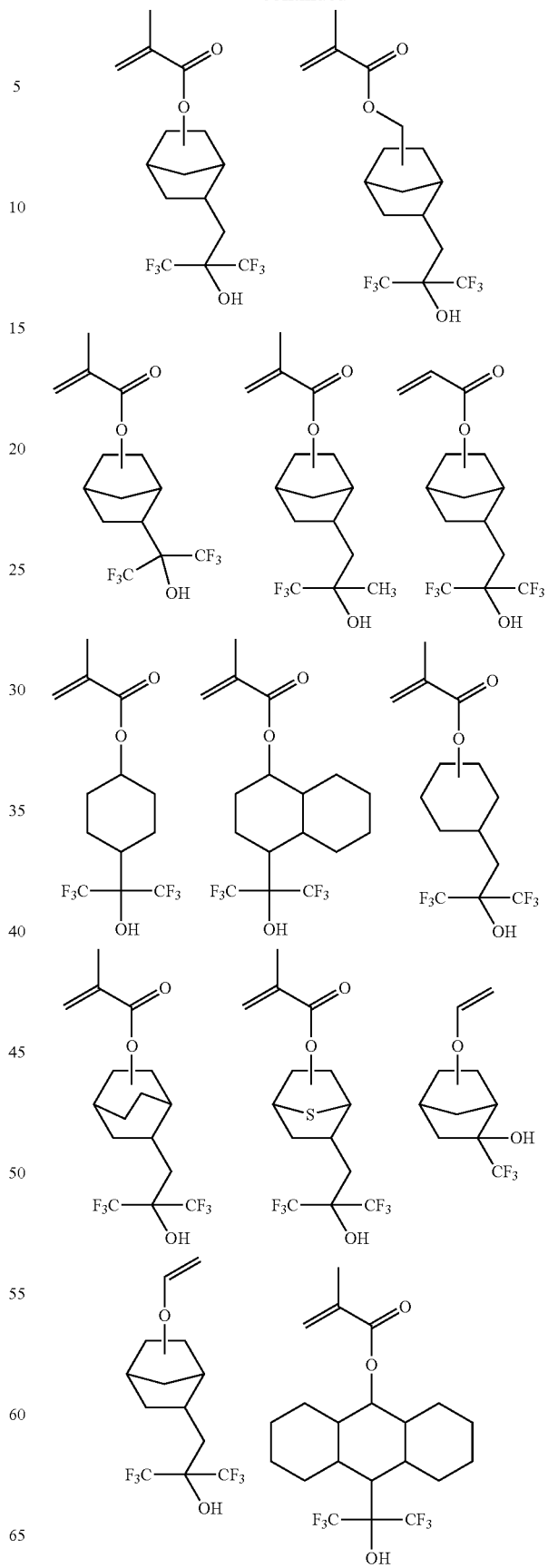

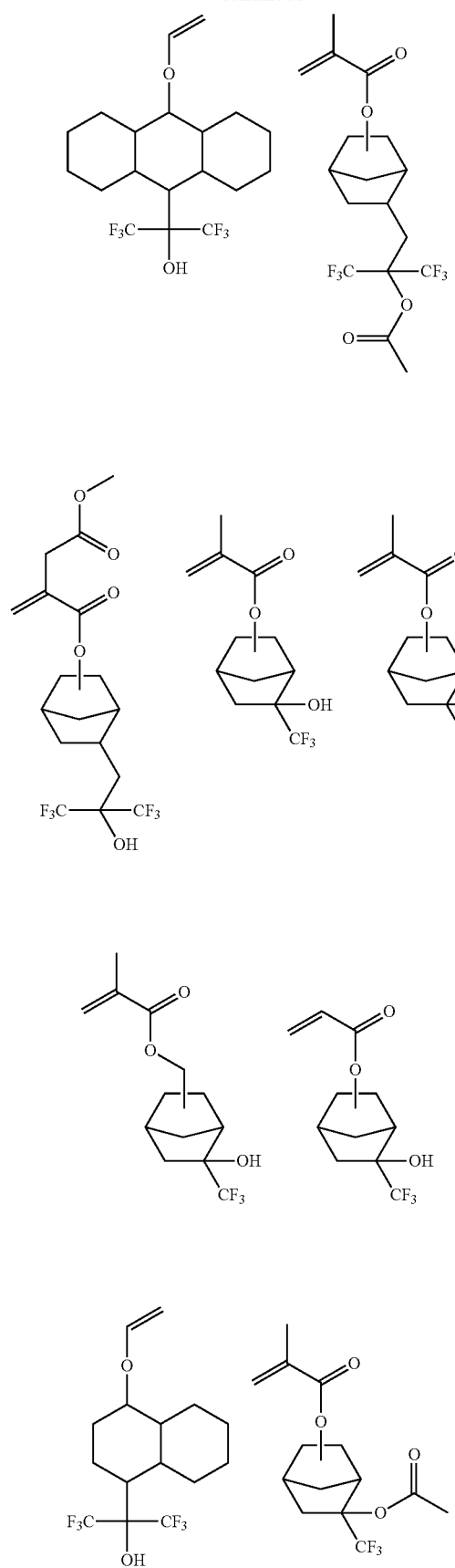

77
-continued
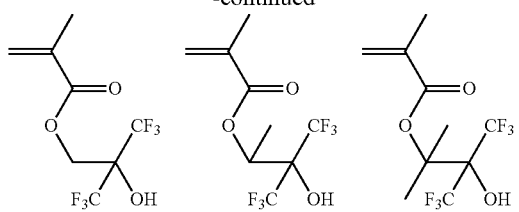
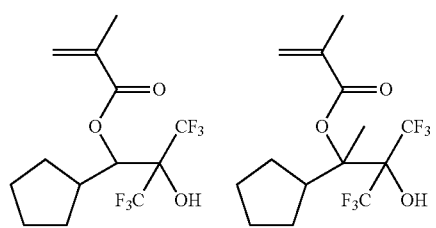
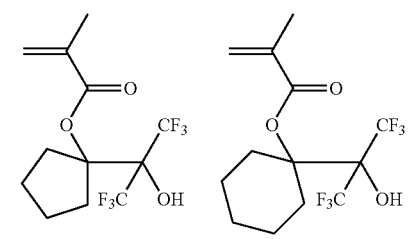
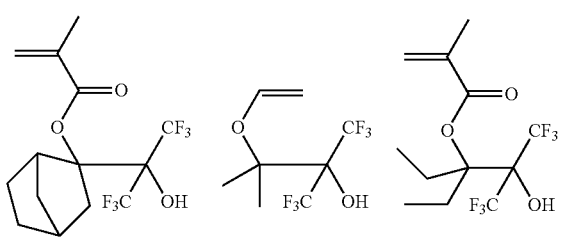
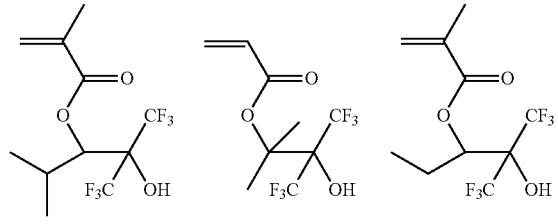
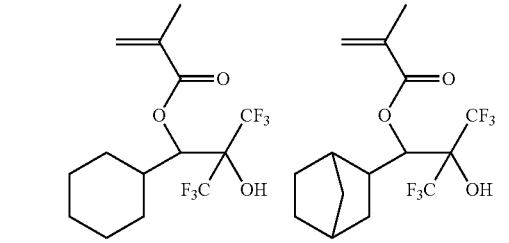
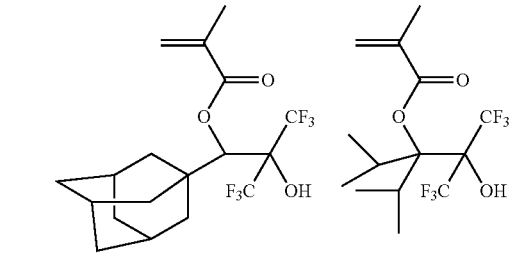
78
-continued
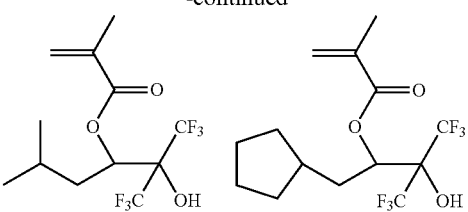
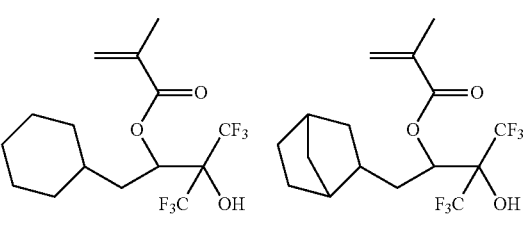
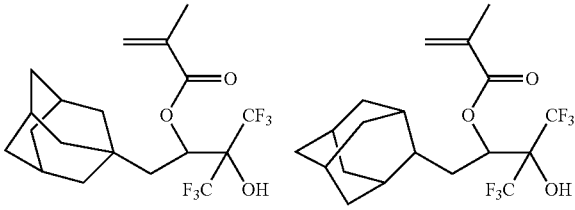
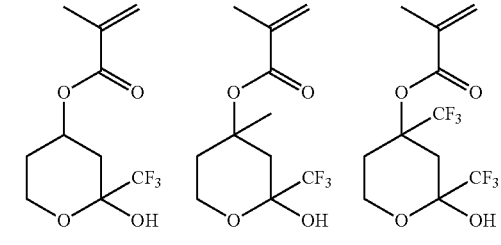
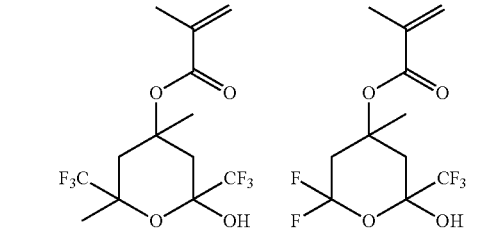
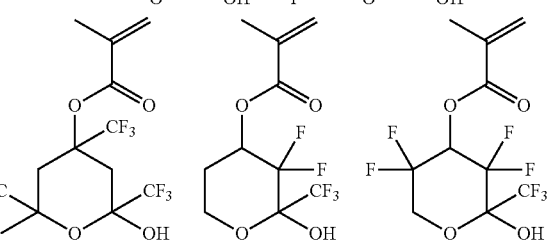
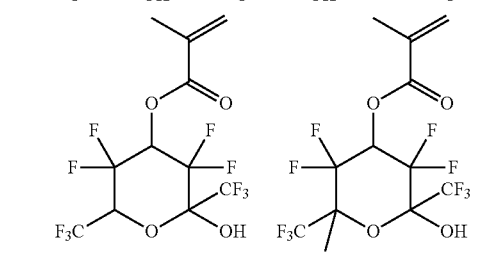

-continued
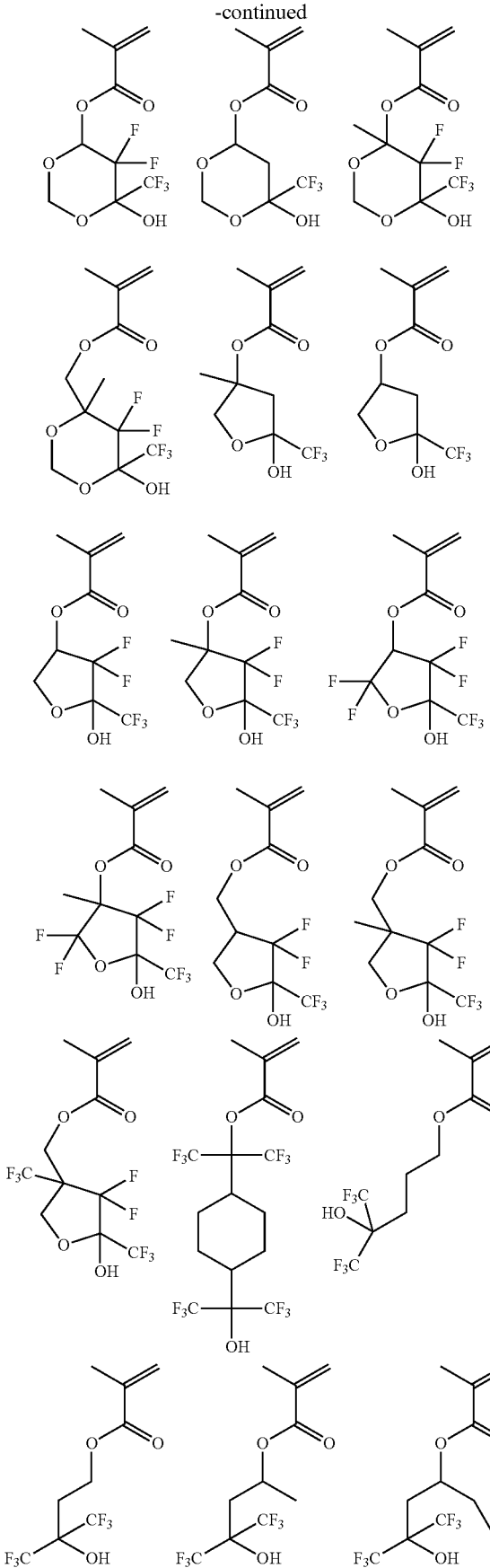
-continued
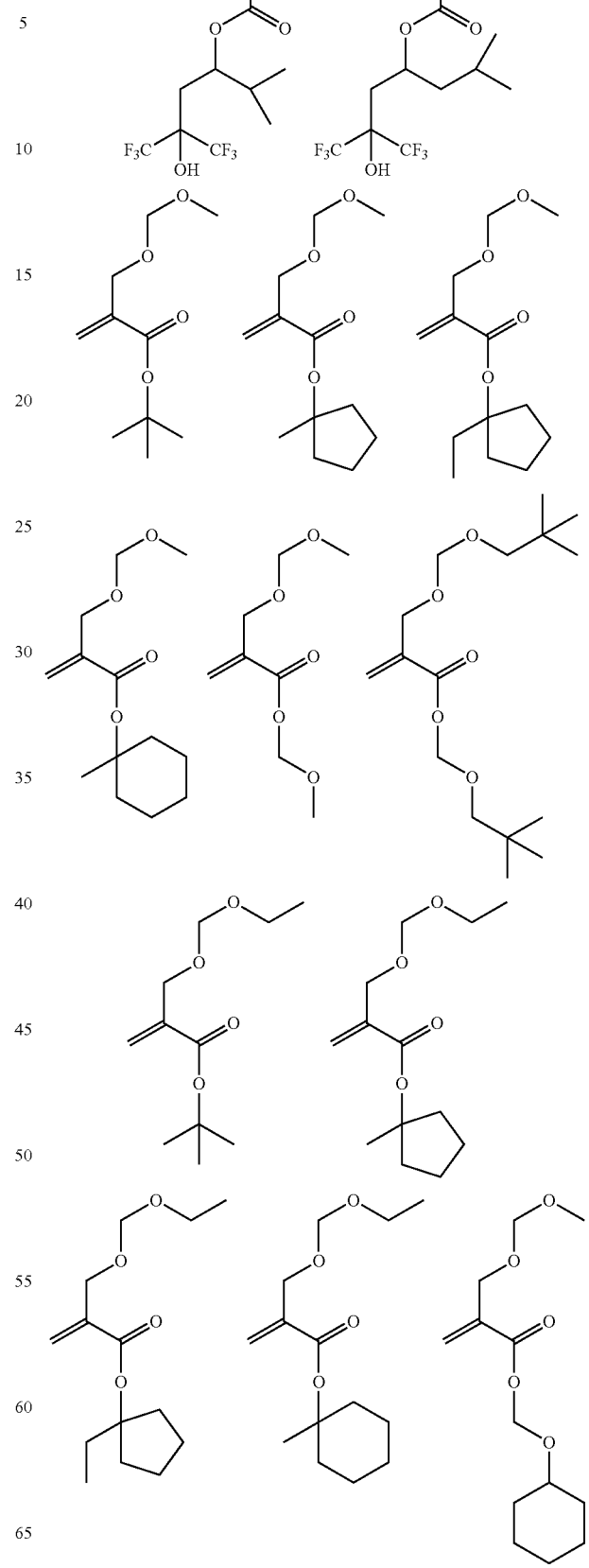

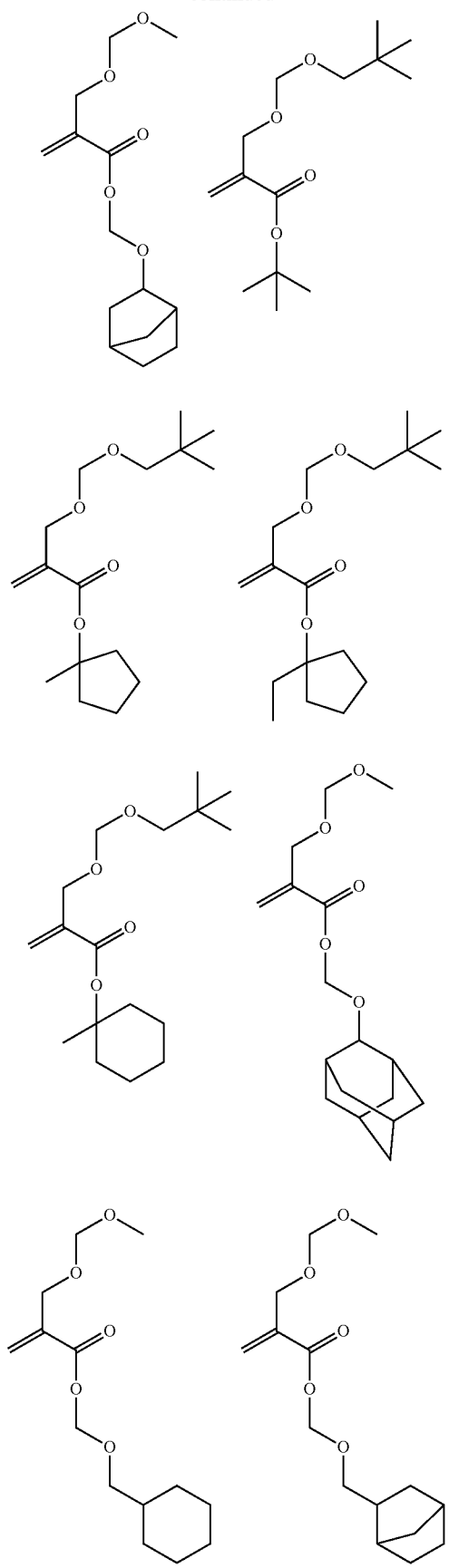
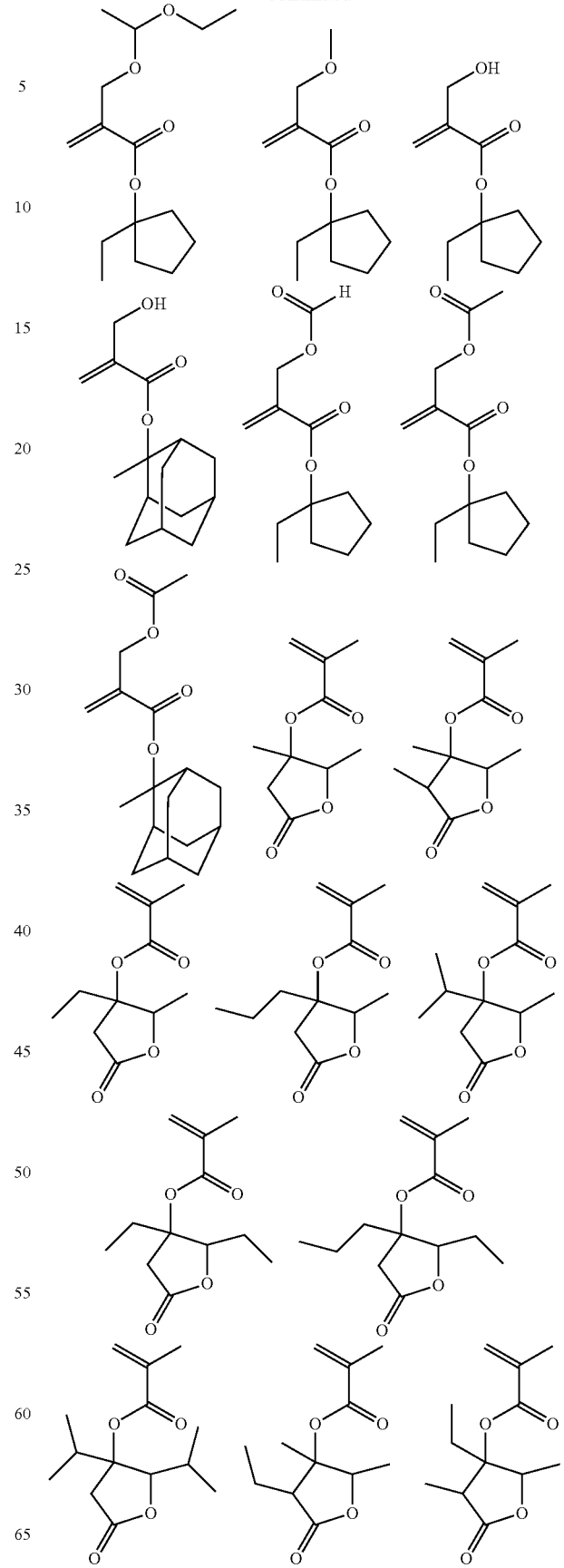

-continued

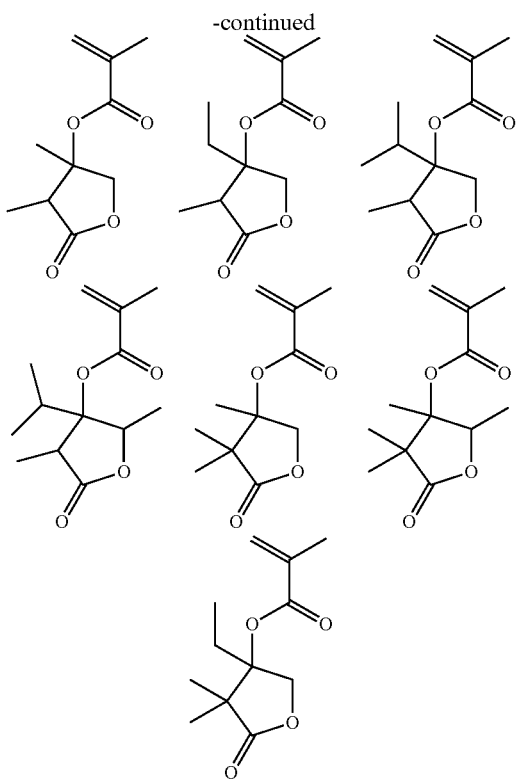

Further preferably, the polymer has further copolymerized therein recurring units of at least one type selected from sulfonium salt units (e1) to (e3), as represented by the following general formula.

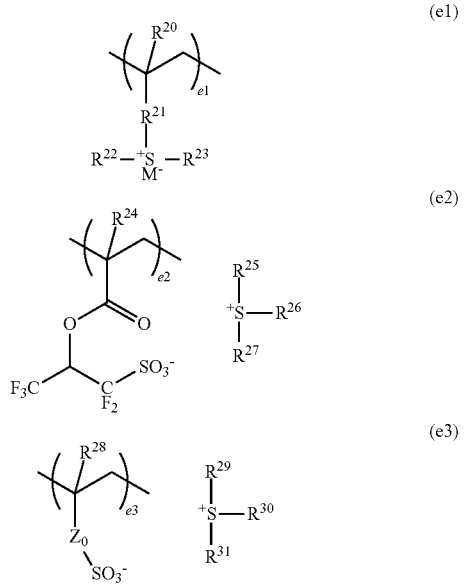

Herein $R^{20}$, $R^{24}$, and $R^{28}$ each are hydrogen or methyl. $R^{21}$ is a single bond, phenylene, —O—$R^{33}$—, or —C(=O)—$Y_1$—$R^{33}$—, wherein $Y_1$ is oxygen or NH, and $R^{33}$ is a straight, branched or cyclic $C_1$-$C_6$ alkylene group, alkenylene group or phenylene group, which may contain a carbonyl (—CO—), ester (—COO—), ether (—O—), or hydroxyl moiety. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $Z_0$ is a single bond, methylene, ethylene, phenylene, fluorinated phenylene, —O—$R^{32}$—, or —C(=O)—$Z_1$—$R^{32}$—, wherein $Z_1$ is oxygen or NH, and $R^{32}$ is a straight, branched or cyclic $C_1$-$C_6$ alkylene, alkenylene or phenylene group, which may contain a carbonyl, ester, ether or hydroxyl moiety. M is a non-nucleophilic counter ion.

Besides the recurring units described above, the polymer may have further copolymerized therein additional recurring units, for example, recurring units (f) having a non-leaving hydrocarbon group as described in JP-A 2008-281980. Examples of the non-leaving hydrocarbon group other than those described in JP-A 2008-281980 include indene, acenaphthylene, and norbornadiene derivatives. Copolymerization of recurring units (f) having a non-leaving hydrocarbon group is effective for improving the dissolution of the polymer in organic solvent developer.

In the polymer for the first resist composition, recurring units (a), (b), (c), (d), (e1), (e2), (e3) and (f) are preferably incorporated in the following molar fraction: $0<a<1.0$, $0≤b≤1.0$, $0≤c<1.0$, $0<b+c<1.0$, $0≤d≤0.9$, $0≤e1≤0.4$, $0≤e2≤0.4$, $0≤e3≤0.4$, $0≤e1+e2+e3≤0.4$, $0≤f≤0.6$;
more preferably $0.1≤a≤0.9$, $0≤b≤0.9$, $0≤c≤0.9$, $0<b+c<1.0$, $0≤d≤0.9$, $0≤e1≤0.3$, $0≤e2≤0.3$, $0≤e3≤0.3$, $0≤e1+e2+e3≤0.3$, $0≤f≤0.5$,
provided that $a+b+c+d+e1+e2+e3+f=1$.

The meaning of $a+b=1$, for example, is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (c).

The polymer serving as the base resin in the resist composition should desirably have a weight average molecular weight (Mw) in the range of 1,000 to 500,000, and more desirably 2,000 to 30,000, as measured by GPC versus polystyrene standards. With too low a Mw, the resist composition after development may have a low efficiency of heat crosslinking. A polymer with too high a Mw may have a low solubility in organic solvent developer, giving rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

A blend of two or more polymers which differ in compositional ratio, molecular weight or dispersity is acceptable.

The polymer may be synthesized by any desired methods, for example, by dissolving suitable unsaturated bond-bearing monomers corresponding to recurring units (a) to (f) in an organic solvent, adding a radical initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethyl-valeronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and thereafter the polymer be protected or partially protected.

Now reference is made to the second resist composition comprising at least a second polymer as base resin and a second organic solvent. Since the second resist composition used in the pattern forming process does not necessarily need the step of heating its resist film after organic solvent development for insolubilizing it in organic solvent, recurring units (a) of formula (1) need not necessarily be incorporated in the second polymer. In this sense, the second polymer may comprise recurring units (a) wherein a is in the range: $0 \leq a < 1.0$. Recurring units other than units (a) may be the same as described for the polymer in the first resist composition, with the same range being applicable. Preferably the second polymer comprises recurring units (b) having a carboxyl group whose hydrogen is substituted by an acid labile group and/or recurring units (c) having a hydroxyl group whose hydrogen is substituted by an acid labile group, represented by formula (2).

The second organic solvent in the second resist composition is preferably selected from among propylene glycol monomethyl ether acetate (PGMEA), cyclohexanone, cyclopentanone, ethyl lactate, propylene glycol monomethyl ether, propylene glycol monoethyl ether, propylene glycol monopropyl ether, heptanone, γ-butyrolactone and mixtures thereof.

Preferably the first negative pattern after heating experiences a film thickness loss of up to 10 nm when it is kept in contact with the second organic solvent for 30 seconds. The film thickness loss is more preferably up to 5 nm, and even more preferably up to 2 nm. With respect to the step of heating the first negative pattern after development, heating at a temperature of 130 to 300° C., especially 140 to 250° C. for a time of 3 to 300 seconds, especially 5 to 200 seconds is preferred because effective crosslinking takes place. The restricted thickness loss of the first film in the second organic solvent is achievable as long as a polymer comprising recurring units having 7-oxanorbornane ring is used as base resin in the first resist composition.

The resist composition (which may be either the first or second resist composition) used in the pattern forming process may further comprise an organic solvent, a compound capable of generating an acid in response to high-energy radiation (i.e., acid generator), and optionally a dissolution regulator, basic compound, surfactant and other components. In the embodiment wherein a polymer comprising recurring units (e1) to (e3) of acid generator is used as the base resin, the acid generator need not be separately added.

The organic solvent used in the first and second resist compositions, especially chemically amplified resist compositions is not particularly limited as long as the base resin, acid generator and other additives are soluble therein. Exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, ethylene glycol monopropyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxy-propionate, tert-butyl acetate, tert-butyl propionate, and propylene glycol mono-tert-butyl ether acetate; and lactones such as γ-butyrolactone, which may be used alone or in admixture of two or more. Of these, diethylene glycol dimethyl ether, 1-ethoxy-2-propanol, PGMEA and mixtures thereof are preferred because the acid generator is most soluble therein.

The organic solvent is preferably used in an amount of 200 to 3,000 parts, more preferably 400 to 2,000 parts by weight per 100 parts by weight of the base resin.

The first or second resist composition used herein may include an acid generator in order for the composition to function as a chemically amplified resist composition.

Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

The PAG is preferably compounded in an amount of 0.1 to 50 parts and more preferably 0.5 to 40 parts by weight per 100 parts by weight of the base resin. Less than 0.1 part of PAG may generate, upon exposure, an insufficient amount of acid to provide sensitivity and resolution. More than 50 parts of PAG may reduce the transmittance of a resist film, detracting from resolution. Where the polymer has acid generator units (e1) to (e3) copolymerized therein, the acid generator is not essential.

To the resist composition, a basic compound, typically amine may be added as quencher. The basic compound serves to improve contrast by trapping the acid generated by the acid generator to control acid diffusion. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146] to [0164], and compounds having a carbamate group, as described in JP 3790649. Onium salts such as sulfonium salts, iodonium salts and ammonium salts of sulfonic acids which are not fluorinated at α-position as described in JP-A 2008-158339 (US 20080153030) and similar onium salts of carboxylic acids as described in JP 3991462 may be used as the quencher. Although onium salts of sulfonic acids which are not fluorinated at α-position and onium salts of carboxylic acids lack basicity, they function as a quencher by salt exchange with a super strong acid fluorinated at α-position to neutralize the α-position fluorinated sulfonic acid.

The basic compound or quencher is preferably compounded in an amount of 0.001 to 15 parts and more preferably 0.01 to 10 parts by weight per 100 parts by weight of the base resin. Less than 0.001 part of the basic compound may achieve no addition effect whereas more than 15 parts may result in too low a sensitivity.

Also useful are quenchers of polymer type as described in JP-A 2008-239918. The polymeric quencher segregates at the resist surface after coating and thus enhances the rectangularity of resist pattern. The polymeric quencher is effective for reducing top bulging or bridging in the case of negative resist film.

Also a polymeric additive may be added for improving the water repellency on surface of a resist film as spin coated. This additive may be used in the topcoatless immersion lithography. The additive has a specific structure with a 1,1,1,3,3,3-hexafluoro-2-propanol residue and is described in JP-A 2007-297590 and JP-A 2008-111103. The water repellency improver to be added to the resist should be soluble in the organic solvent developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

To the resist composition, especially chemically amplified resist composition, a surfactant may be added for the purpose of facilitating coating operation. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. An appropriate amount of the surfactant is up to 2 parts, preferably up to 1 part by weight per 100 parts by weight of the base resin.

Process

Now referring to the drawings, the pattern forming process of the invention is illustrated in FIGS. 1 and 2. The first resist composition is coated on a substrate to form a resist film thereon. Specifically, a first resist film 30 of the first resist composition is formed on a processable substrate 20 disposed on a substrate 10 directly or via an intermediate intervening layer as shown in FIG. 1A. The first resist film 30 preferably has a thickness of 10 to 1,000 nm and more preferably 20 to 500 nm. Prior to exposure, the first resist film 30 is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, $\alpha$-Si, TiN, WSi, BPSG, SOG, Cr, CrO, CrON, MoSi, low dielectric film, and etch stopper film. The intermediate intervening layer (not shown) includes hard masks of $SiO_2$, SiN, SiON or p-Si, an undercoat in the form of carbon film, a silicon-containing intermediate film, and an organic antireflective coating.

Next comes exposure depicted by arrows in FIG. 1B. For the exposure, preference is given to high-energy radiation having a wavelength of 140 to 250 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light from a projection lens while pure water or suitable liquid is introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a composition comprising a polymer having 1,1,1,3,3,3-hexafluoro-2-propanol residues and a solvent selected from alcohols of at least 4 carbon atoms, ethers of 8 to 12 carbon atoms, and mixtures thereof.

In the protective film-forming composition, an amine compound may be compounded. The amine compound may be selected from the compounds enumerated as the basic compound to be added to the resist composition. An appropriate amount of the amine compound added is 0.01 to 10 parts, preferably 0.02 to 8 parts by weight per 100 parts by weight of the base resin for the protective film. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. Deposition of an amine-containing protective film is effective for preventing top bulging of negative resist film.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Thereafter the exposed resist film is developed in an organic solvent developer for 0.1 to 3 minutes, preferably 0.5 to 2 minutes by any conventional techniques such as dip, puddle and spray techniques. In this way, a first negative resist pattern 30a is formed on the substrate 20 as shown in FIG. 1C.

Next, a crosslinked first negative pattern 30b is formed, as shown in FIG. 1D, by crosslinking the polymer. Heat is necessary for crosslinking. Appropriate heating conditions to ensure crosslinking include a temperature of 130 to 300° C., especially 140 to 250° C. and a time of 3 to 300 seconds, especially 5 to 200 seconds, as previously mentioned.

Next, as shown in FIG. 2E, the second resist composition is coated until it covers or overlies the crosslinked first negative pattern 30b, forming a second resist film 40. While the thickness of the second resist film 40 varies over a wide range, it is typically in the range of 10 to 300 nm, especially 20 to 200 mm.

Thereafter, the second resist film 40 is subjected to second exposure as shown in FIG. 2F, PEB, and developed in an organic solvent as shown in FIG. 2G, forming a negative resist pattern 40a. Since the first negative pattern has been turned insoluble in the organic solvent developer, it is retained even after the second organic solvent development. Thereafter, as shown in FIG. 2H, the processable substrate 20 is dry etched through the first and second resist patterns 30b and 40a serving as the mask.

Preferably the organic solvent used as developer in the developing steps to form the first and second negative patterns is at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

The first resist pattern and second resist pattern may be combined in various ways. As shown in FIG. 3, the first and second resist patterns are combined as orthogonally intersecting lines. When a negative pattern of 1:1 pattern is combined with a negative pattern resulting from over-exposure of 1:1 pattern, a rectangular hole pattern is formed. When first and second negative patterns are 1:1, a square hole pattern is formed.

Figure 4:
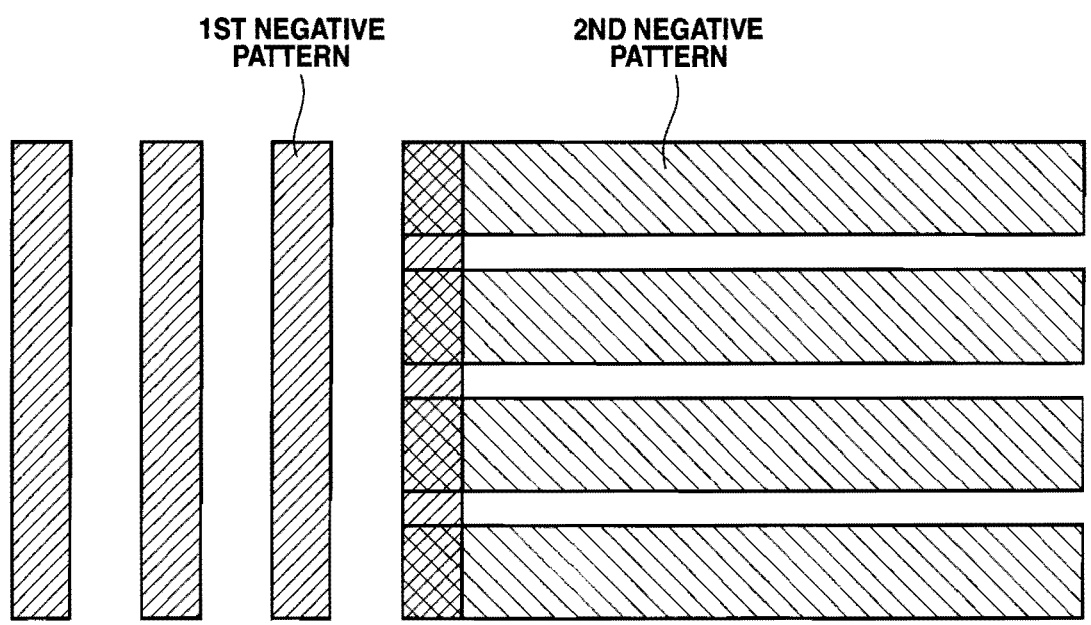
FIG. 4 illustrates a first negative pattern and a second negative pattern, which are formed contiguous and spaced apart.

The first and second resist patterns may be formed in different directions rather than the orthogonal crossing. The first and second resist patterns may be contiguous somewhere and spaced apart somewhere. As shown in FIG. 4, one feature of the first resist pattern overlaps the second resist pattern while the other features of the first resist pattern are spaced apart from the second resist pattern.

Figure 5:
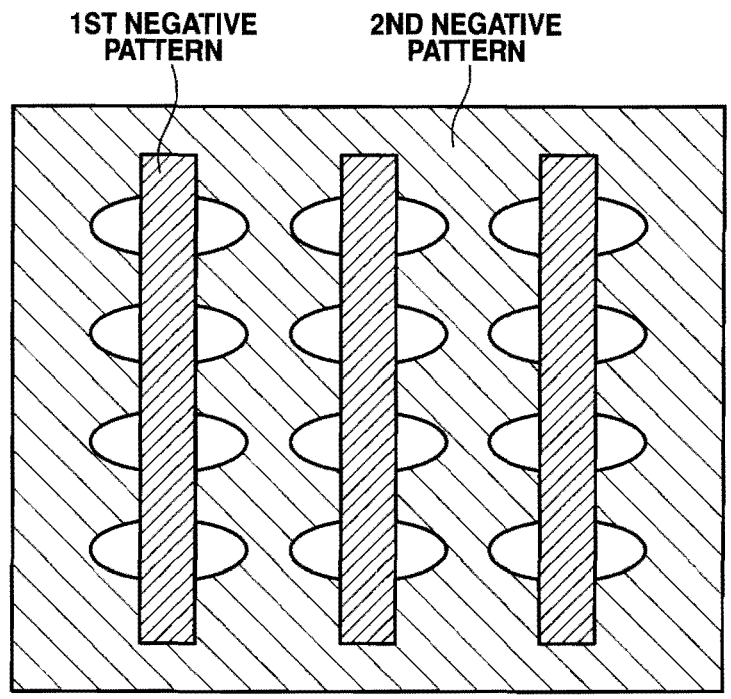
FIG. 5 illustrates a first negative pattern that divides elliptic holes of a second negative pattern.

It is also possible that first negative lines divide elliptic holes of the second negative pattern as shown in FIG. 5. In this case, a hole pattern with a very narrow pitch is formed.

Figure 6:
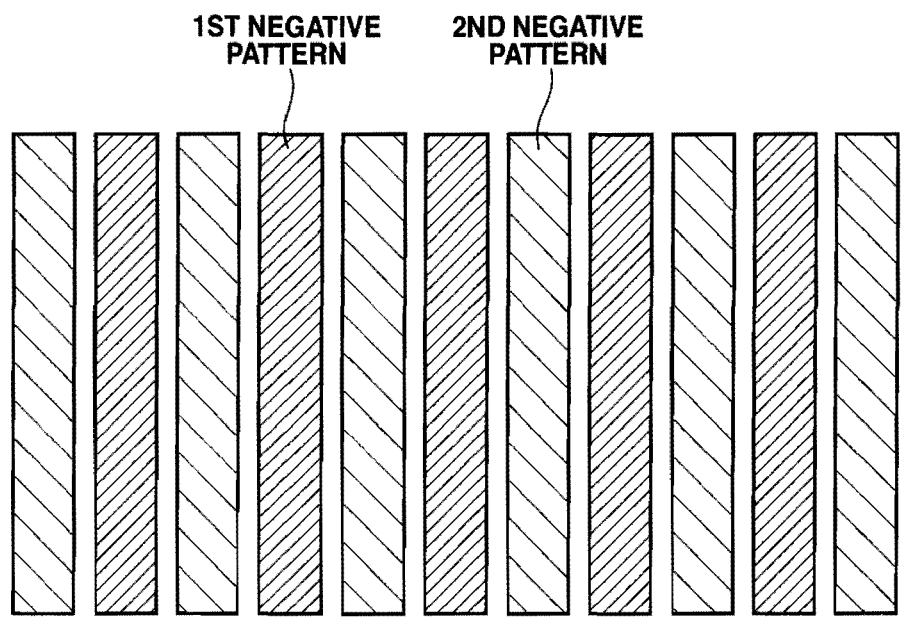
FIG. 6 illustrates a first negative pattern and a second negative pattern, which are alternately arranged.

In FIG. 6, the first and second resist patterns are alternately formed. That is, lines of the first resist pattern and lines of the second resist pattern are alternately arranged. In this case, a pattern of very narrow trenches can be formed between the first and second negative patterns, thereby reducing the pitch to one half.

Figure 7:
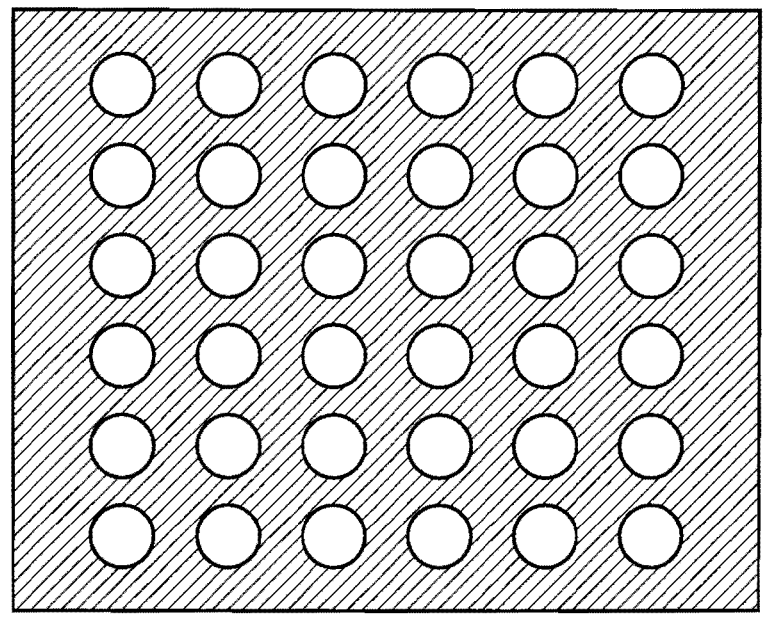
FIG. 7 illustrates a dense hole pattern as one exemplary first pattern.
Figure 8:
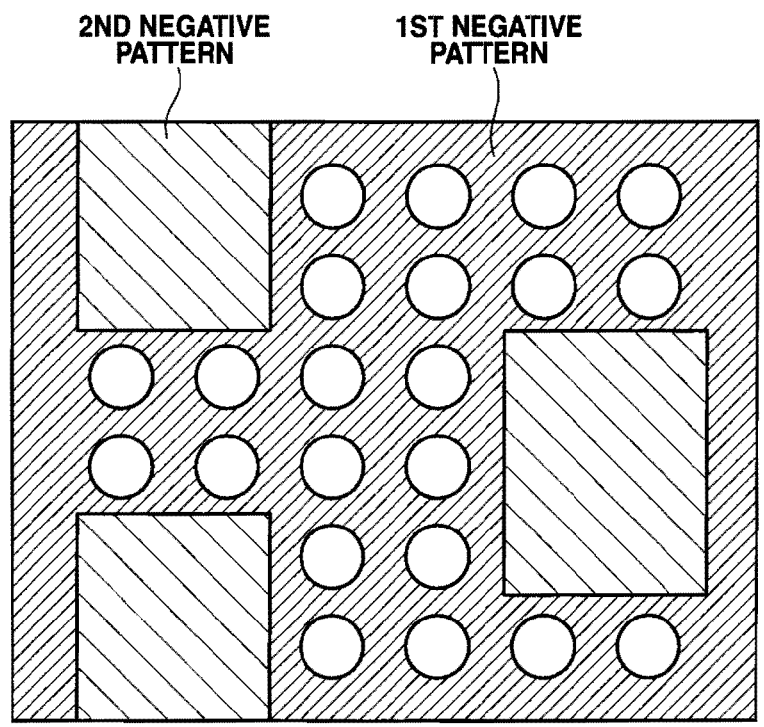
FIG. 8 illustrates a second pattern covering some holes of the first hole pattern of FIG. 7.

In a further embodiment, a dense hole pattern is formed via negative development in organic solvent as shown in FIG. 7. The hole pattern is baked for insolubilizing in the second solvent. The second resist composition is coated thereon and developed in an organic solvent developer to form a second negative pattern so that the second pattern covers selected portions of the hole pattern as shown in FIG. 8 (i.e., the second pattern blocks out some holes of the first pattern). In this way, a pattern of randomly arranged holes can be formed. If desired, the pattern of FIG. 8 may be further baked for insolubilizing the second resist composition, and a third resist composition be coated thereon and developed to form a third pattern. Similarly, fourth and fifth resist patterns may be formed.

EXAMPLE

Examples of the invention are given below by way of illustration and not by way of limitation. For all polymers, Mw and Mn are determined by GPC versus polystyrene standards.

Preparation of Resist Material

First and second resist compositions in solution form were prepared by dissolving a polymer (Resist Polymer) and components in a solvent according to the formulation shown in Tables 1 and 2, and filtering through a filter with a pore size of 0.2 μm. The components used are identified below.

Acid Generator: PAG1 of the Following Structural Formula

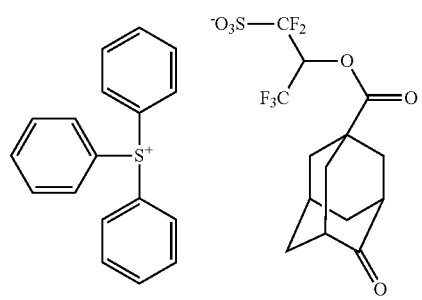

PAG 1

Resist Polymer 1

-continued

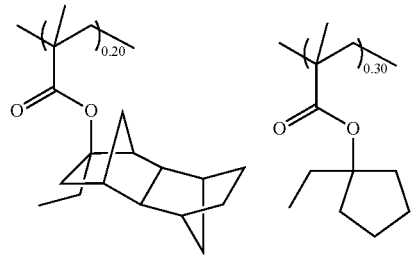

Resist Polymer 1

Mw = 8,300
Mw/Mn = 1.76

Resist Polymer 2

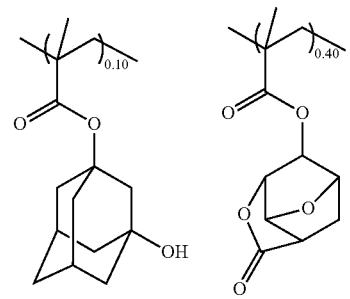

Resist Polymer 2

Mw = 7,300
Mw/Mn = 1.67

Resist Polymer 3

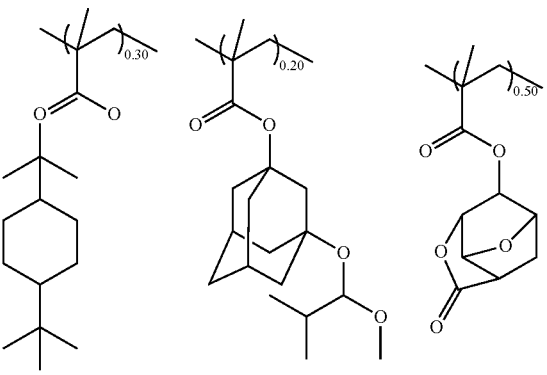

Resist Polymer 3

Mw = 7,800
Mw/Mn = 1.88

Resist Polymer 4

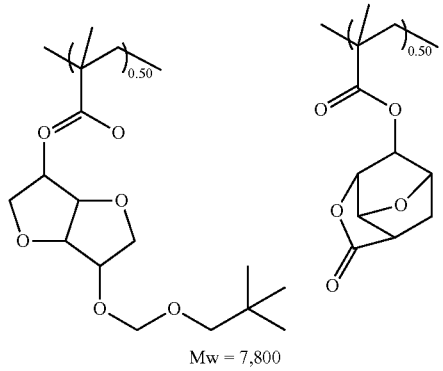

Resist Polymer 4
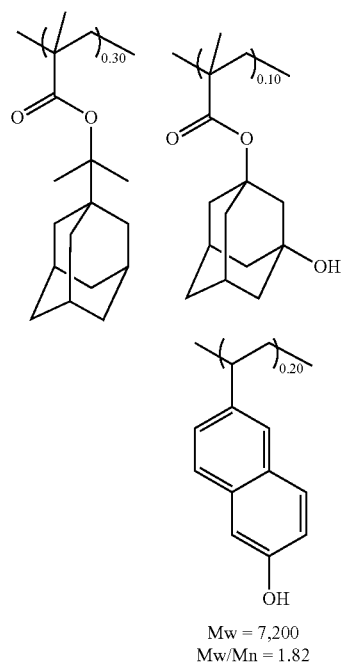
Mw = 7,200
Mw/Mn = 1.82
Resist Polymer 5
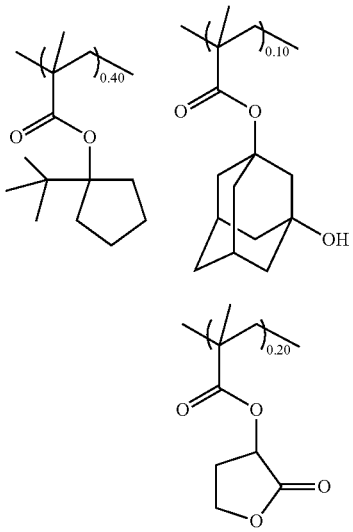
Mw = 8,300
Mw/Mn = 1.78
Resist Polymer 6
Resist Polymer 6
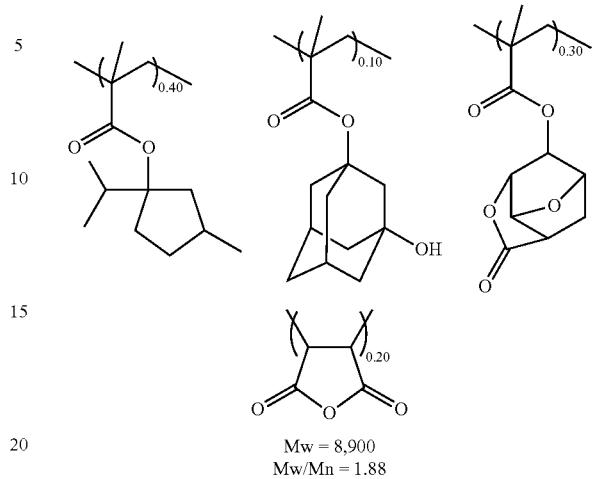
Mw = 8,900
Mw/Mn = 1.88
Resist Polymer 7
Resist Polymer 7
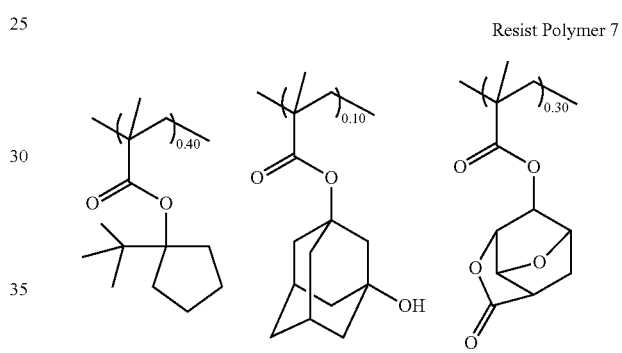
Mw = 9,100
Mw/Mn = 1.83
Resist Polymer 8
Resist Polymer 8
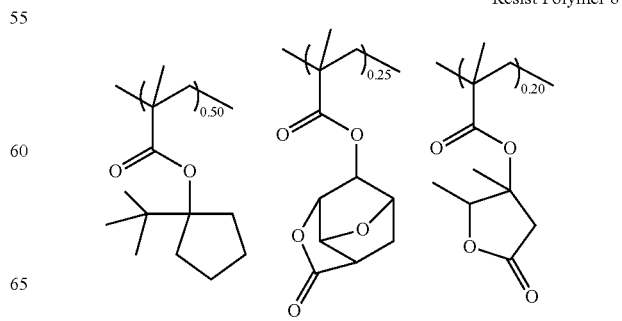

-continued
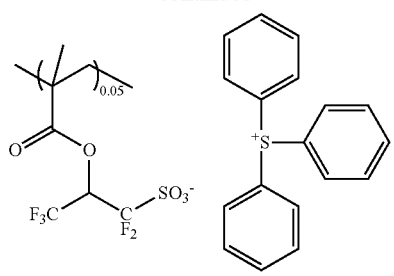
Resist Polymer 9
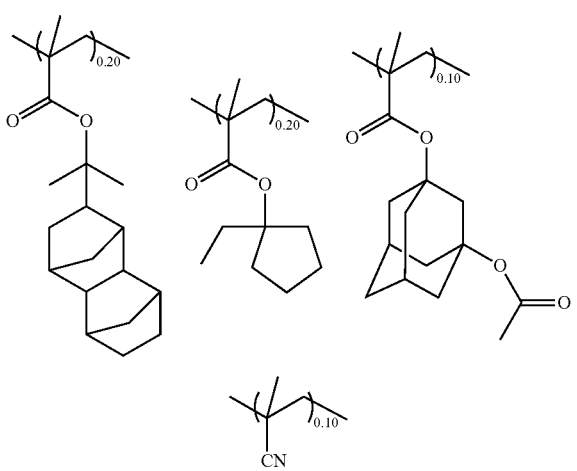
Basic compound: Quencher 1, Quencher 2, polymeric Quencher 3 of the following structural formulae
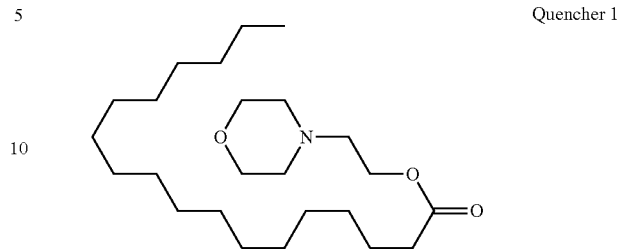
Water-Repellent Polymer 1 of the Following Structural Formula
Organic Solvent:
PGMEA (propylene glycol monomethyl ether acetate)
CyH (cyclohexanone)

GBL (gamma-butyrolactone)
EL (ethyl lactate)

TABLE 1

|  | Polymer (pbw) | Acid generator (pbw) | Basic compound (pbw) | Water-repellent polymer (pbw) | Organic solvent (pbw) |
| --- | --- | --- | --- | --- | --- |
| Resist 1-1 | Resist Polymer 1 (100) | PAG1 (10.0) | Quencher1 (2.20) | Water-repellent polymer 1 (4.0) | PGMEA(2,500) |
| Resist 1-2 | Resist Polymer 2 (100) | PAG1 (10.0) | Quencher1 (2.20) | Water-repellent polymer 1 (4.0) | PGMEA(2,500) |
| Resist 1-3 | Resist Polymer 3 (100) | PAG1 (10.0) | Quencher1 (2.20) | Water-repellent polymer 1 (4.0) | PGMEA(2,000) GBL(500) |
| Resist 1-4 | Resist Polymer 4 (100) | PAG1 (8.0) | Quencher1 (2.00) | Water-repellent polymer 1 (4.0) | PGMEA(2,000) CyH(500) |
| Resist 1-5 | Resist Polymer 5 (100) | PAG1 (8.0) | Quencher1 (2.00) | Water-repellent polymer 1 (4.0) | PGMEA(2,000) CyH(500) |
| Resist 1-6 | Resist Polymer 6 (100) | PAG1 (8.0) | Quencher1 (2.00) | Water-repellent polymer 1 (4.0) | PGMEA(2,000) CyH(500) |
| Resist 1-7 | Resist Polymer 7 (100) | PAG1 (8.0) | Quencher1 (2.00) | Water-repellent polymer 1 (4.0) | PGMEA(2,000) CyH(500) |
| Resist 1-8 | Resist Polymer 8 (100) | — | Quencher2 (5.00) | Water-repellent polymer 1 (4.0) | PGMEA(2,000) GBL(500) |
| Resist 1-9 | Resist Polymer 1 (100) | PAG1 (5.0) | Quencher2 (6.00) Quencher3 (3.00) | Water-repellent polymer 1 (4.0) | PGMEA(2,500) |
| Comparative Resist 1-1 | Resist Polymer 9 (100) | PAG1 (10.0) | Quencher1 (2.20) | Water-repellent polymer 1 (4.0) | PGMEA(2,500) |
| Comparative Resist 1-2 | Resist Polymer 10 (100) | PAG1 (10.0) | Quencher1 (2.00) | Water-repellent polymer 1 (4.0) | PGMEA(2,000) CyH(500) |

TABLE 2

|  | Polymer (pbw) | Acid generator (pbw) | Basic compound (pbw) | Water-repellent polymer (pbw) | Organic solvent (pbw) |
| --- | --- | --- | --- | --- | --- |
| Resist 2-1 | Resist Polymer 1 (100) | PAG1 (5.0) | Quencher2 (5.20) | Water-repellent polymer 1 (4.0) | PGMEA(2,500) |
| Resist 2-2 | Resist Polymer 9 (100) | PAG1 (5.0) | Quencher2 (5.20) | Water-repellent polymer 1 (4.0) | PGMEA(2,000) CyH(500) |
| Resist 2-3 | Resist Polymer 10 (100) | PAG1 (5.0) | Quencher2 (5.20) | Water-repellent polymer 1 (4.0) | PGMEA(2,000) GBL(500) |

Examples and Comparative Examples

Measurement of Solvent Solubility of Resist Film after High-Temperature Bake

The first resist composition of the formulation shown in Table 1 was spin coated on an antireflective coating (ARC-29A, Nissan Chemical Industries, Ltd., 90 nm) on a silicon wafer and baked on a hot plate at 100° C. for 60 seconds to form a resist film of 100 nm thick. Using an ArF excimer laser scanner NSR-305B (Nikon Corp., NA 0.68, σ 0.85, ordinary illumination), the wafer was subjected to flood exposure in a dose of 30 mJ/cm². The wafer was baked at 100° C. for 60 seconds for deprotection reaction. The wafer (excluding Comparative Example 1-3) was further baked at the temperature shown in Table 3 for 60 seconds for insolubilizing the resist film in organic solvent. An organic solvent as shown in Table 3 was dispensed on the resist film and kept in contact for 20 seconds. The wafer was spin dried and baked at 100° C. for 60 seconds for evaporating off the organic solvent. A film thickness was measured by a film thickness gauge before and after the solvent contact, from which a loss in film thickness by the solvent contact was determined. The results are shown in Table 3.

In Comparative Example 1-4, a prebaked resist film was irradiated with light from Xe₂ excimer lamp of wavelength 172 nm and irradiance 10 mW in a dose of 100 mJ/cm² and baked at the temperature shown in Table 3 for 60 seconds, before a film thickness loss by the solvent contact was determined.

ArF Lithography Patterning Test

In Examples 2-1 to 2-11 and Comparative Example 2-2, a spin-on carbon film ODL-101 (Shin-Etsu Chemical Co., Ltd.) having a carbon content of 80 wt % was deposited on a substrate (silicon wafer) to a thickness of 200 nm and a silicon-containing spin-on hard mask SHB-A940 having a silicon content of 43 wt % was deposited thereon to a thickness of 35 nm. On this substrate for trilayer process, the first resist composition shown in Table 1 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole 35 deg., azimuthally polarized illumination), exposure was performed through a 6% halftone phase shift mask bearing a Y-direction line-and-space pattern. The wafer was baked (PEB) at the temperature shown in Table 4 for 60 seconds, developed in the organic solvent shown in Table 4 for 30 seconds, and rinsed with diisoamyl ether, forming a first negative pattern with a line width of 50 nm and a pitch of 100 nm. Thereafter, the resist film was baked at 185° C. for 60 seconds.

Next, the second resist composition shown in Table 2 was coated and baked to form a second resist film of 100 nm thick. Using an ArF excimer laser immersion lithography scanner NSR-610C (Nikon Corp., NA 1.30, σ 0.98/0.78, dipole 35 deg., azimuthally polarized illumination), exposure was performed through a 6% halftone phase shift mask bearing a X-direction line-and-space pattern at such a position that the first resist pattern might be overlaid with the second resist pattern. The wafer was baked (PEB) at the temperature shown in Table 4 for 60 seconds, developed in the organic solvent shown in Table 4 for 30 seconds, and rinsed with diisoamyl ether, forming a second negative pattern with a line width of 50 nm and a pitch of 100 nm. Consequently a lattice pattern wherein first Y-direction lines crossed second X-direction lines at right angles was formed.

In Comparative Example 2-1, using an ArF excimer laser immersion lithography scanner NSR-610C (Nikon Corp., NA 1.30, σ 0.98/0.78, dipole 35 deg., azimuthally polarized illumination, 6% halftone phase shift mask), two exposures through a mask bearing a Y-direction line-and-space pattern and a mask bearing an X-direction line-and-space pattern were continuously performed at the overlapping positions. The resist film was baked (PEB), developed in an organic solvent for 30 seconds, and rinsed with diisoamyl ether.

In Comparative Example 2-3, the resist film was exposed through a mask bearing a Y-direction line-and-space pattern, PEB, and developed in an alkaline developer, 2.38 wt % tetramethylammonium hydroxide (TMAH) solution to form a positive pattern. The positive pattern was then insolubilized by irradiating it with light from $Xe_2$ excimer lamp of wavelength 172 nm and irradiance 10 mW in a dose of 100 mJ/cm$^2$ and baking at 185° C. for 60 seconds. A resist composition was coated, exposed to a pattern of X-direction lines, PEB, and developed in an alkaline developer to form a positive pattern. In this way, a lattice pattern was formed.
Using a top-down scanning electron microscope (TDSEM CG-4000, Hitachi High-Technologies Corp.), the pattern was observed to see whether or not a rectangular hole pattern of Y-direction lines crossing X-direction lines at right angles was formed and whether or not the line width of the first Y-direction line pattern was maintained.

The results are shown in Table 4.

TABLE 3

|  |  | Resist | Bake temperature (° C.) | Solvent | Film thickness loss by solvent (nm) |
|---|---|---|---|---|---|
| Example | 1-1 | Resist 1-1 | 180 | PGMEA | 0.5 |
|  | 1-2 | Resist 1-2 | 185 | PGMEA | 1.5 |
|  | 1-3 | Resist 1-3 | 180 | PGMEA | 0.6 |
|  | 1-4 | Resist 1-3 | 180 | EL | 1.2 |
|  | 1-5 | Resist 1-3 | 180 | PGMEA/EL (85/15) | 0.7 |
|  | 1-6 | Resist 1-3 | 180 | PGMEA/GBL (90/10) | 1.3 |
|  | 1-7 | Resist 1-3 | 180 | PGMEA/CyH (85/15) | 0.4 |
|  | 1-8 | Resist 1-3 | 180 | 2-heptanone | 0.8 |
|  | 1-9 | Resist 1-4 | 180 | PGMEA | 1.1 |
|  | 1-10 | Resist 1-5 | 185 | PGMEA | 0.3 |
|  | 1-11 | Resist 1-6 | 190 | PGMEA | 0.6 |
|  | 1-12 | Resist 1-7 | 180 | PGMEA | 0.5 |
|  | 1-13 | Resist 1-8 | 180 | PGMEA | 0.6 |
|  | 1-14 | Resist 1-9 | 180 | PGMEA | 0.8 |
|  | 1-15 | Resist 1-1 | 170 | PGMEA | 1.2 |
|  | 1-16 | Resist 1-1 | 190 | PGMEA | 0.3 |
|  | 1-17 | Resist 1-1 | 200 | PGMEA | 0.1 |
| Comparative Example | 1-1 | Comparative Resist 1-1 | 180 | PGMEA | film dissolved away |
|  | 1-2 | Comparative Resist 1-2 | 180 | PGMEA | 15 |
|  | 1-3 | Resist 1-1 | — | PGMEA | film dissolved away |
|  | 1-4 | Resist 1-4 | 190 | PGMEA | 0.3 |

TABLE 4

Pattern formed by 1st and 2nd resists

|  |  | 1st resist | 1st resist PEB temp. (° C.) | Developer | 2nd resist | 2nd resist PEB temp. (° C.) | Y-space size (nm) | X-space size (nm) | hole shape |
|---|---|---|---|---|---|---|---|---|---|
| Example | 2-1 | Resist 1-1 | 95 | n-butyl acetate | Resist 2-1 | 90 | 50 | 51 | rectangle |
|  | 2-2 | Resist 1-2 | 95 | n-butyl acetate | Resist 2-1 | 90 | 51 | 52 | rectangle |
|  | 2-3 | Resist 1-3 | 95 | n-butyl acetate | Resist 2-1 | 90 | 52 | 48 | rectangle |
|  | 2-4 | Resist 1-4 | 95 | n-butyl acetate | Resist 2-1 | 90 | 52 | 48 | rectangle |
|  | 2-5 | Resist 1-5 | 95 | n-butyl acetate | Resist 2-1 | 90 | 53 | 49 | rectangle |
|  | 2-6 | Resist 1-6 | 95 | n-butyl acetate | Resist 2-1 | 90 | 50 | 49 | rectangle |
|  | 2-7 | Resist 1-7 | 95 | n-butyl acetate | Resist 2-1 | 90 | 51 | 48 | rectangle |
|  | 2-8 | Resist 1-8 | 95 | 2-heptanone | Resist 2-1 | 90 | 52 | 47 | rectangle |
|  | 2-9 | Resist 1-9 | 95 | n-butyl acetate | Resist 2-1 | 90 | 50 | 50 | rectangle |
|  | 2-10 | Resist 1-1 | 95 | methyl benzoate | Resist 2-2 | 90 | 50 | 48 | rectangle |
|  | 2-11 | Resist 1-1 | 95 | n-butyl acetate | Resist 2-3 | 90 | 51 | 50 | rectangle |

TABLE 4-continued

Pattern formed by 1st and 2nd resists

| | | 1st resist | 1st resist PEB temp. (°C.) | Developer | 2nd resist | 2nd resist PEB temp. (°C.) | Y-space size (nm) | X-space size (nm) | hole shape |
|---|---|---|---|---|---|---|---|---|---|
| Comparative Example | 2-1 | Resist 1-1 | 95 | n-butyl acetate | — | — | 48 | 52 | circle |
| | 2-2 | Comparative Resist 1-2 | 95 | n-butyl acetate | Resist 1-1 | 95 | 63 | 50 | rounded corners |
| | 2-3 | Resist 1-4 | 95 | 2.38 wt % TMAH aqueous solution | Resist 1-4 | 90 | 58 | 49 | rounded corners |

As seen from the results in Table 3, the resist composition comprising a polymer having recurring units (a) forms a resist film which turns insoluble in organic solvent by high-temperature bake following deprotection reaction. As seen from the results in Table 4, in Examples 2-1 to 2-11 entailing double patterning of X- and Y-direction lines, X-direction lines of the first pattern which was insolubilized in organic solvent were substantially equal (in size) to Y-direction line spaces, ensuring that rectangular holes were formed. In Comparative Example 2-2 entailing insufficient insolubilization, the space size of the first pattern was enlarged, and holes with rounded corners were formed. In Comparative Example 2-1 wherein two exposures of X- and Y-direction lines were continuously performed whereby a hole pattern was formed via single PEB and development, a pattern of circular holes was formed. In Comparative Example 2-3 wherein a positive pattern resulting from alkaline development was insolubilized by light irradiation and bake and a positive resist was coated thereon and alkaline developed, the spaces of the first pattern were expanded, and a pattern of holes with rounded corners was formed.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-026270 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
coating a first chemically amplified resist composition onto a processable substrate, said first resist composition comprising a resin comprising recurring units having 7-oxanorbornane ring and recurring units having an acid labile group which is eliminatable with acid so that it may turn insoluble in an organic solvent developer as a result of the acid labile group being eliminated, a photoacid generator capable of generating an acid upon exposure to high-energy radiation, and a first organic solvent, prebaking the coating to remove the unnecessary solvent and to form a resist film, exposing patternwise the resist film to high-energy radiation, post-exposure baking, and developing in the organic solvent developer to form a first negative pattern, heating the first negative pattern to render it resistant to a second organic solvent used in a second resist composition to be subsequently coated, wherein the second organic solvent is selected from the group consisting of propylene glycol monomethyl ether acetate, cyclohexanone, cyclopentanone, ethyl lactate, propylene, glycol monomethyl ether, propylene glycol monoethyl ether, propylene glycol monopropyl ether, heptanone, γ-butyrolactone and mixtures thereof, and the first negative pattern after heating experiences a film thickness loss of up to 10 nm when it is kept in contact with the second organic solvent for 30 seconds, coating the second resist composition comprising a resin and the second organic solvent onto the negative pattern-bearing substrate, prebaking, exposing, post-exposure baking, and developing in an organic solvent developer to form a second negative pattern, whereby the first negative pattern crosses the second negative pattern, the first negative pattern and the second negative pattern are formed in different directions, or spaces of the second negative pattern are formed in proximity to the remaining portion of the first negative pattern.

2. The process of claim 1 wherein the recurring units having 7-oxanorbornane ring are recurring units (a) having the general formula (1):

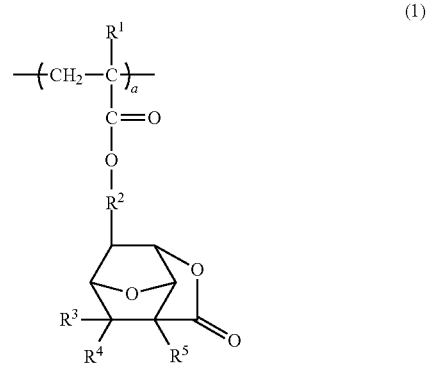

(1)

wherein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: $0<a<1.0$.

3. The process of claim 1 wherein the recurring units having an acid labile group are recurring units (b) having a carboxyl group substituted with an acid labile group and/or recurring units (c) having a hydroxyl group substituted with an acid labile group, represented by the general formula (2):

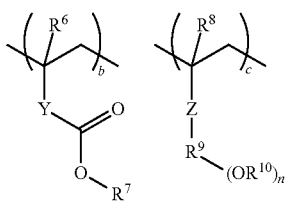

(2)

wherein $R^6$ and $R^8$ each are hydrogen or methyl, $R^7$ and $R^{10}$ each are an acid labile group, Y is a single bond or —C(=O)—O—$R^{11}$—, $R^{11}$ is a straight, branched or cyclic $C_1$-$C_{10}$ alkylene group which may have an ether or ester moiety, or a naphthylene group, Z is a single bond or —C(=O)—O—, $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group, n is 1 or 2, b and c are numbers in the range: $0 \leq b<1.0$, $0 \leq c<1.0$, and $0<b+c<1.0$.

4. The process of claim 1 wherein the resin in the second resist composition comprises recurring units (b) having a carboxyl group substituted with an acid labile group and/or recurring units (c) having a hydroxyl group substituted with an acid labile group, represented by formula (2):

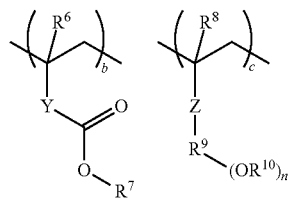

(2)

wherein $R^6$ and $R^8$ each are hydrogen or methyl, $R^7$ and $R^{10}$ each are an acid labile group, Y is a single bond or —C(=O)—O—$R^{11}$—, $R^{11}$ is a straight, branched or cyclic $C_1$-$C_{10}$ alkylene group which may have an ether or ester moiety, or a naphthylene group, Z is a single bond or —C(=O)—O—, $R^9$ is a straight, branched or cyclic $C_1$-$C_{15}$ alkylene group or a trivalent group obtained by eliminating one hydrogen from the alkylene group, which may have an ether or ester moiety, or a naphthylene group or a trivalent group obtained by eliminating one hydrogen from the naphthylene group, n is 1 or 2, b and c are numbers in the range: $0 \leq b<1.0$, $0 \leq c<1.0$, and $0<b+c<1.0$.

5. The process of claim 1 wherein the organic solvent developer used in the developing steps to form the first and second negative patterns is selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

\* \* \* \* \*